United States Patent
US 7,754,504 B2
Ohmae et al.
(45) Date of Patent: Jul. 13, 2010

(54) LIGHT-EMITTING DIODE, METHOD FOR MAKING LIGHT-EMITTING DIODE, INTEGRATED LIGHT-EMITTING DIODE AND METHOD FOR MAKING INTEGRATED LIGHT-EMITTING DIODE, METHOD FOR GROWING A NITRIDE-BASED III-V GROUP COMPOUND SEMICONDUCTOR, LIGHT SOURCE CELL UNIT, LIGHT-EMITTING DIODE

(75) Inventors: Akira Ohmae, Kanagawa (JP); Shigetaka Tomiya, Kanagawa (JP); Yuki Maeda, Miyagi (JP); Michinori Shiomi, Kanagawa (JP); Takaaki Ami, Kanagawa (JP); Takao Miyajima, Kanagawa (JP); Katsunori Yanashima, Kanagawa (JP); Takashi Tange, Kanagawa (JP); Atsushi Yasuda, Kanagawa (JP)

(73) Assignee: Sony Corporation, Tokyo (JP)

(*) Notice: Subject to any disclaimer, the term of this patent is extended or adjusted under 35 U.S.C. 154(b) by 639 days.

(21) Appl. No.: 11/383,526

(22) Filed: May 16, 2006

(65) Prior Publication Data
US 2006/0258027 A1 Nov. 16, 2006

(30) Foreign Application Priority Data
May 16, 2005 (JP) ............................ P2005-142462
Apr. 6, 2006 (JP) ............................ P2006-105647

(51) Int. Cl.
*H01L 21/00* (2006.01)
(52) U.S. Cl. .............................. 438/22; 438/34; 438/36; 438/37; 438/46; 438/478; 257/88; 257/89; 257/99; 257/E21.121; 257/E21.126; 257/E21.127; 257/E21.131; 257/E21.132; 257/E33.025; 327/39; 327/40; 327/41

(58) Field of Classification Search ................. 257/88, 257/89, 99, E21.121, E21.126, E21.127, 257/E21.131, E21.132, E33.025; 438/22, 438/34, 36, 37, 45–47, 478; 327/39–41, 327/43.01, 44.011, 46.016, 49.01
See application file for complete search history.

(56) References Cited
U.S. PATENT DOCUMENTS
4,172,906 A * 10/1979 Pancholy .................... 438/507

(Continued)
FOREIGN PATENT DOCUMENTS
JP 03-133182 6/1991

(Continued)
*Primary Examiner*—Lynne A Gurley
*Assistant Examiner*—Meiya Li
(74) *Attorney, Agent, or Firm*—Sonnenschein Nath & Rosenthal LLP

(57) ABSTRACT

A method for making a light-emitting diode, which including the steps of: providing a substrate having at least one recessed portion on one main surface and growing a first nitride-based III-V group compound semiconductor layer through a state of making a triangle in section having a bottom surface of the recessed portion as a base thereby burying the recessed portion; laterally growing a second nitride-based III-V group compound semiconductor layer from the first nitride-based III-V group compound semiconductor layer over the substrate; and successively growing a third nitride-based III-V group compound semiconductor layer of a first conduction type, an active layer and a fourth nitride-based III-V group compound semiconductor layer of a second conduction type on the second nitride-based III-V group compound semiconductor layer.

13 Claims, 37 Drawing Sheets

U.S. PATENT DOCUMENTS

| | | |
|---|---|---|
| 6,015,979 A | 1/2000 | Sugiura et al. |
| 6,360,352 B2 | 3/2002 | Wallace |
| 6,576,533 B2 | 6/2003 | Tomiya et al. |
| 6,657,236 B1 | 12/2003 | Thibeault et al. |
| 6,864,158 B2 | 3/2005 | Ishida |
| 6,870,191 B2 | 3/2005 | Niki et al. |
| 2002/0117104 A1* | 8/2002 | Hata et al. .................. 117/97 |
| 2003/0045017 A1* | 3/2003 | Hiramatsu et al. ........... 438/46 |
| 2004/0038049 A1 | 2/2004 | Suzuki et al. |
| 2004/0113166 A1* | 6/2004 | Tadatomo et al. ............ 257/98 |
| 2004/0189184 A1 | 9/2004 | Yasuda |
| 2004/0232428 A1 | 11/2004 | Senda et al. |
| 2006/0084245 A1* | 4/2006 | Kohda ....................... 438/478 |

FOREIGN PATENT DOCUMENTS

| | | |
|---|---|---|
| JP | 2000-012976 | 1/2000 |
| JP | 2000-021789 | 1/2000 |
| JP | 2001-053012 | 2/2001 |
| JP | 2001-148348 | 5/2001 |
| JP | 2001-148543 | 5/2001 |
| JP | 2001-203386 | 7/2001 |
| JP | 2002-208757 | 7/2002 |
| JP | 2003-318441 | 7/2003 |
| JP | 2004-002081 | 1/2004 |
| JP | 2004-200523 | 7/2004 |
| JP | 2004-297010 | 10/2004 |

* cited by examiner

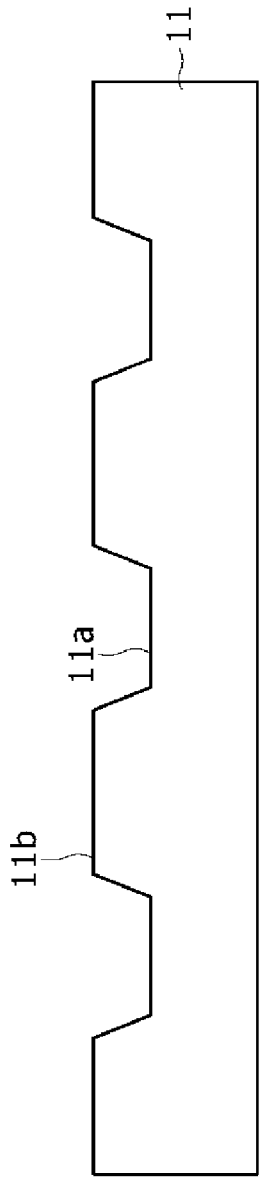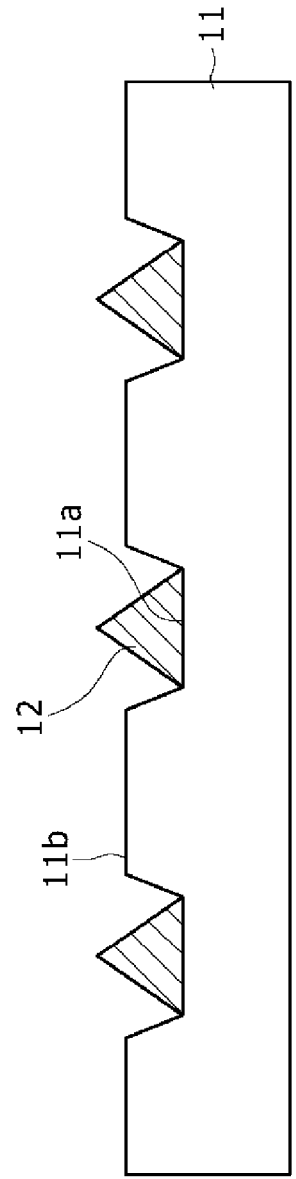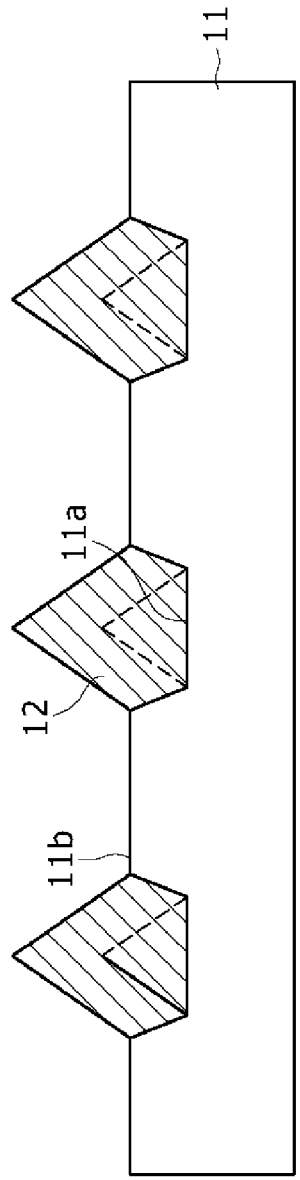

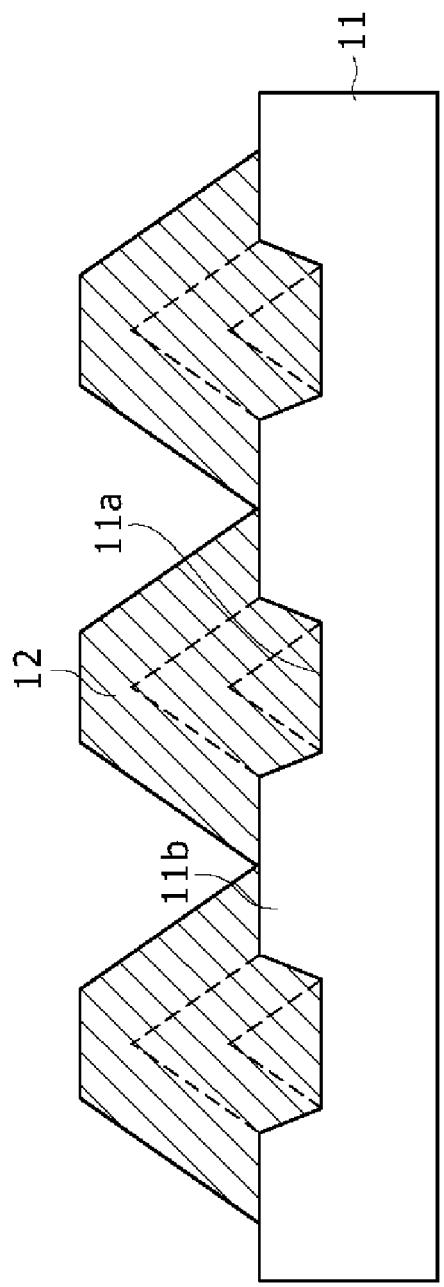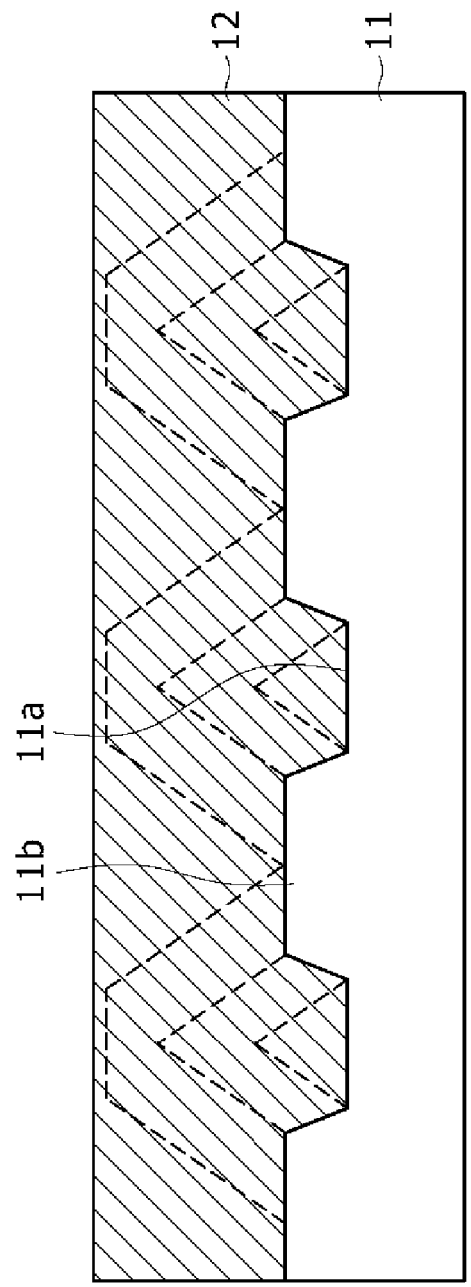

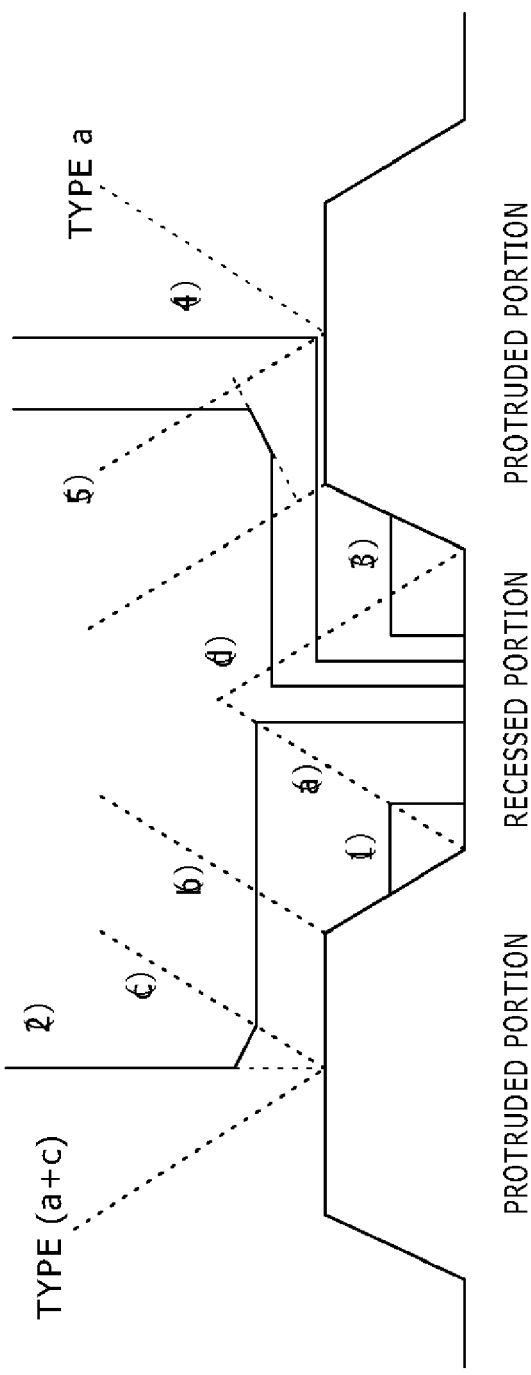
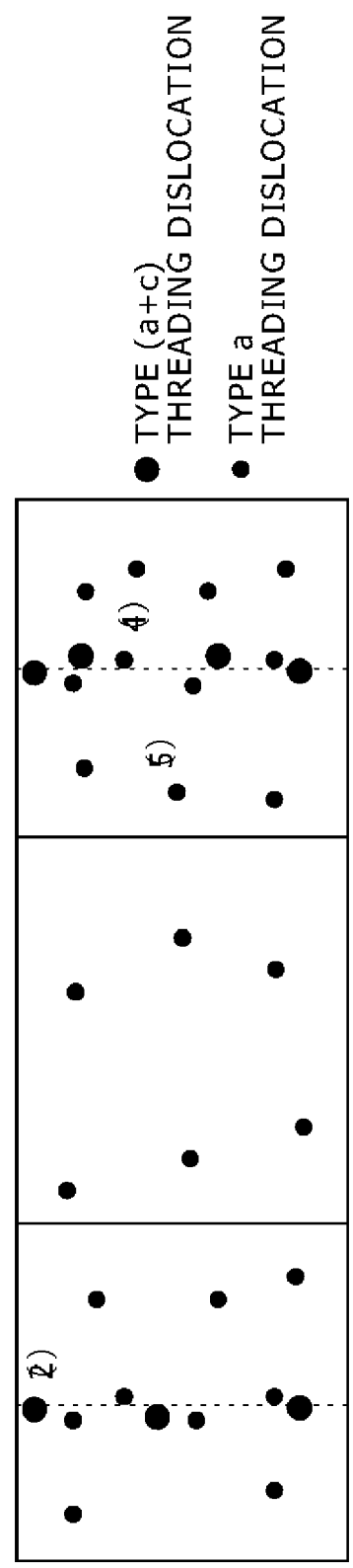
FIG. 8A
FIG. 8B

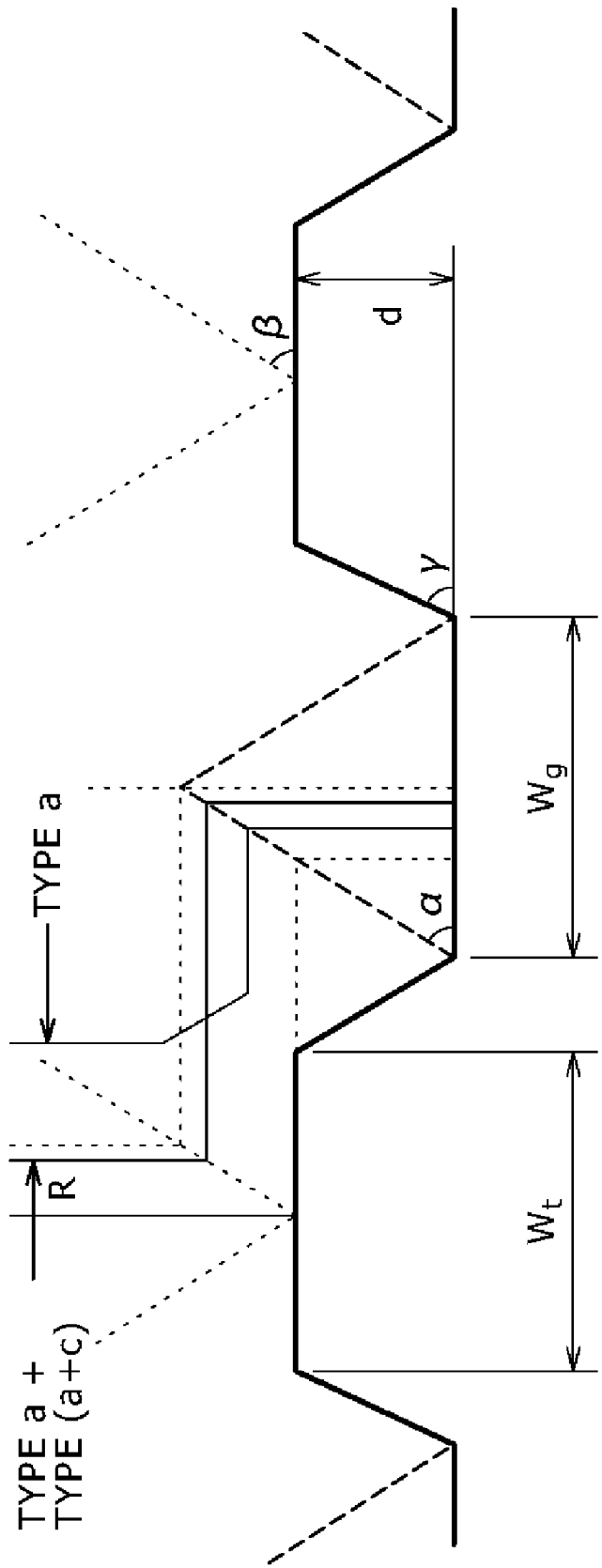

RECESSED PORTION

PROTRUDED PORTION

PROTRUDED PORTION

~37nm

RECESSED PORTION

~18nm  ~56nm

AREA OF AN INCLINED SURFACE ON ASSUMPTION
OF A SIZE RANGE OF 20 μm × 20 μm

AREA RATIO OF AN INCLINED SURFACE

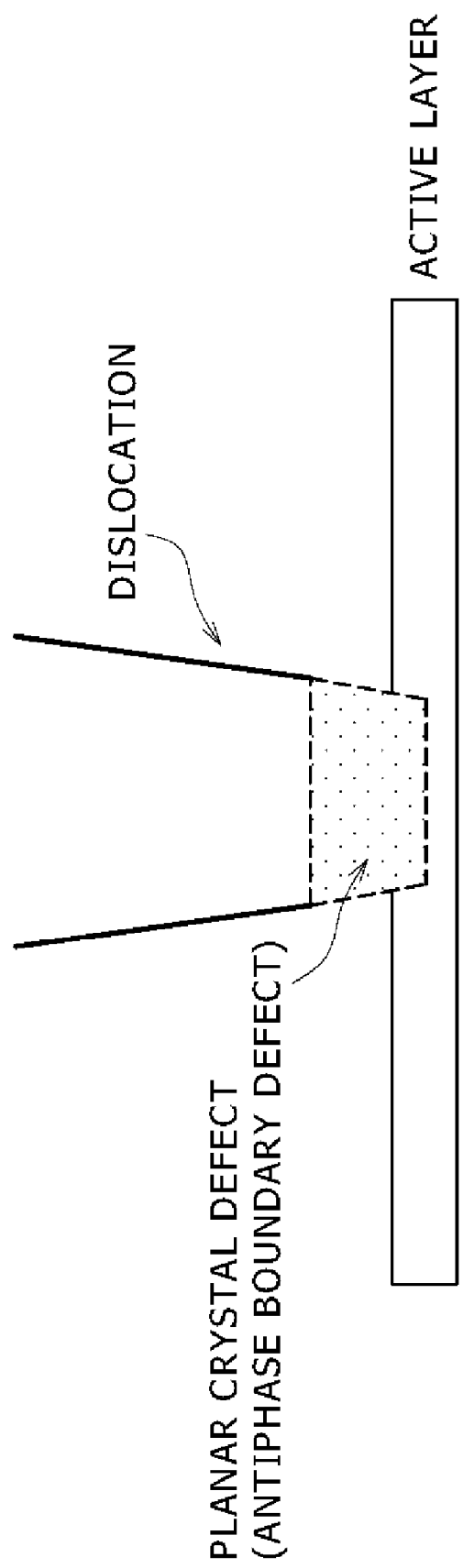

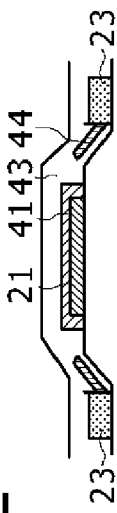
FIG. 27A
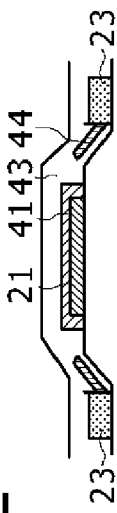
FIG. 27B
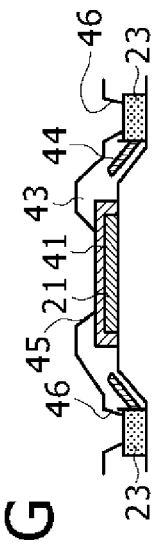
FIG. 27C
FIG. 27D
FIG. 27E
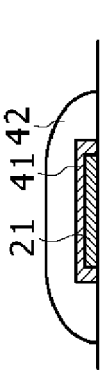
FIG. 27F
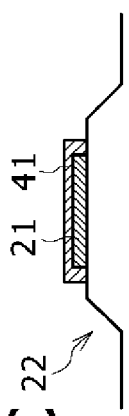
FIG. 27G
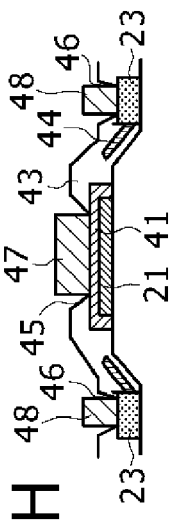
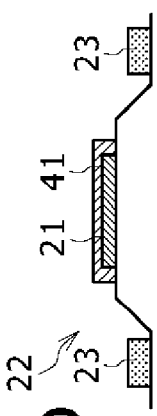
FIG. 27H
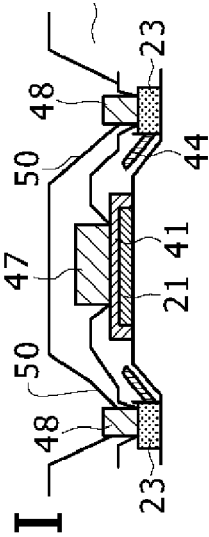
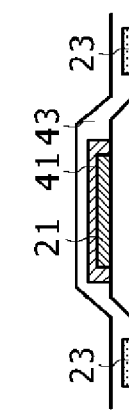
FIG. 27I
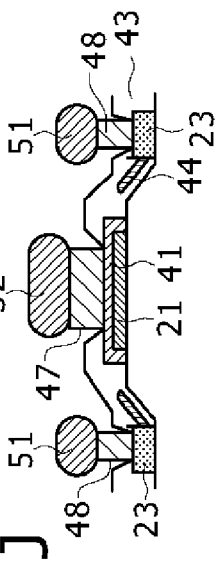
FIG. 27J

LIGHT

LIGHT-EMITTING DIODE, METHOD FOR MAKING LIGHT-EMITTING DIODE, INTEGRATED LIGHT-EMITTING DIODE AND METHOD FOR MAKING INTEGRATED LIGHT-EMITTING DIODE, METHOD FOR GROWING A NITRIDE-BASED III-V GROUP COMPOUND SEMICONDUCTOR, LIGHT SOURCE CELL UNIT, LIGHT-EMITTING DIODE

CROSS REFERENCES TO RELATED APPLICATIONS

The present invention contains subject matter related to Japanese Patent Application JP 2005-142462 filed in the Japanese Patent Office on May 16, 2005, and Japanese Patent Application JP 2006-105647 filed in the Japanese Patent Office on Apr. 6, 2006, the entire contents both of which are incorporated herein by reference.

BACKGROUND OF THE INVENTION

1. Field of the invention

This invention relates to a light-emitting diode and a method for making same, and also to an integrated light-emitting diode and a method for making same. The present invention also relates to a method for growing a nitride-based III-IV group compound semiconductor, and a light source cell unit, a light-emitting diode backlight, a light-emitting diode display and an electronic device using such a light-emitting diode as mentioned above. More particularly, the present invention relates to a light-emitting diode using a nitride-based III-V group compound semiconductor and a variety of devices or units using the light-emitting diode.

2. Description of Related Art

In case where a GaN semiconductor is epitaxially grown on a different type of substrate such as a sapphire substrate, crystal defects, particularly, threading dislocations, occur in high density owing to a great difference between lattice constants or thermal expansion coefficients thereof.

To avoid this, a dislocation density reducing technique using selective lateral growth has been hitherto widely used. According to this technique, a GaN semiconductor is epitaxially grown on a sapphire substrate or the like, after which the substrate is removed from a crystal growing apparatus. A growth mask made of a SiO$_2$ film or the like is formed over the GaN semiconductor layer, followed by returning the substrate to the crystal growing apparatus wherein a GaN semiconductor is again epitaxially grown by use of the growth mask.

Although this technique ensures reduction of a dislocation density in the upper GaN semiconductor layer, two cycles of the epitaxially growing cycles are needed, resulting in an increased cost.

To cope with this, there has been proposed a method wherein a dissimilar substrate is beforehand processed to provide a patterned indented surface, and a GaN semiconductor is epitaxially grown on the thus processed substrate (see, for example, Report of Mitsubishi Cable Industries, LTD., No. 98, October, 2001, entitled "Developments of High-power UV LED Using A LEPS Technique" and Japanese Patent Laid-open Nos. 2004-6931 and 2004-6937). This method is schematically shown in FIGS. 36A to 36C. As shown in FIG. 36A, a c-sapphire substrate 101 is processed to provide a patterned indented surface on one main surface thereof. Reference numeral 101a indicates a recessed portion and reference numeral 101b indicates a protruded portion. These recessed portions 101a and protruded portions 101b extend along the <1-100> direction of the sapphire substrate. Next, a GaN semiconductor 102 is grown on the sapphire substrate 101, for example, through the steps of FIGS. 36B and 36C. In FIG. 36C, dotted lines indicate a growth interface on the way of growth. It is characteristic of this method that as shown in FIG. 36C, for example, a space 103 is formed between the sapphire substrate 101 and the GaN semiconductor layer 102 in each recessed portion 101a. FIG. 37 schematically shows a crystal defect distribution in the GaN semiconductor layer 102 grown according to this method. As shown in FIG. 37, threading dislocations 104 occur at a portion of the GaN semiconductor layer 102 above each protruded portion 101b in a direction vertical to an interface with an upper face of the protruded portion 101b to form a defect density region 105. On the other hand, a portion located above the recessed portion 101a and between adjacent high defect density regions 105 becomes a low defect density region 106.

It will be noted that in FIG. 36C, the buried form of the GaN semiconductor layer 102 beneath the space 103 formed within the recess 101a of the sapphire substrate 101 is rectangular in shape. This buried form may be triangular in some case. In this case, the GaN semiconductor layer 102 buried inside the recessed portion 101a contacts with the GaN semiconductor layer 102 grown laterally from the protruded portion 101b thereby forming a space, like the case of the rectangular form.

For reference, there is shown, in FIGS. 38A to 38D, how a GaN semiconductor layer 102 is grown in case where the direction of extension of the recessed portions 101a and the protruded portions 101b is a <11-20> direction intersecting at right angles with a <1-100> direction of the sapphire substrate 101.

FIGS. 39A to 39F schematically show another growing method in related art, different from the above-mentioned one (see, for example, Japanese Patent Laid-open No. 2003-318441). As shown in FIG. 39A, using a sapphire substrate 101 processed to have a patterned indented surface, a GaN semiconductor layer 102 is grown on the substrate through the steps shown in FIGS. 39B to 39F. It is stated that according to this method, the GaN semiconductor layer 102 is grown without forming a space between the sapphire substrate 101 and the GaN semiconductor layer 102.

SUMMARY OF THE INVENTION

With the growing method in related art shown in FIGS. 36A to 36C, the space 103 between the sapphire substrate 101 and the GaN semiconductor layer 102 is formed as set out above. According to the test results conducted by the inventors, where a light-emitting diode structure is formed by growing a GaN semiconductor layer on the GaN semiconductor layer 102, there arises a problem in that an emission efficiency of the light-emitting diode is low. This is considered as follows: light emitted from the active layer upon operation of the light-emitting diode is repeatedly reflected inside the space 103, thereby absorbing light to worsen a light extraction efficiency.

On the other hand, with another growth method in related art shown in FIGS. 39A to 39F, it is stated that no space is formed between the sapphire substrate 101 and the GaN semiconductor layer 102. However, it is considered difficult to reduce a dislocation density of the GaN semiconductor layer 102 to a level similar to that of the growth method in related art shown in FIGS. 36A to 36C. This leads to the fact that where a light-emitting diode structure is used by growing a GaN semiconductor layer on the GaN semiconductor layer 102 of a high dislocation density, these GaN semiconductor layers also increase in dislocation density, thereby inviting a lowering of light-emitting efficiency.

It is desirable to provide a light-emitting diode that is remarkably improved in light extraction efficiency by solving the problem on the formation of such a space as discussed above, is significantly improved in crystallinity of a nitride-based III-V group compound semiconductor layer of the light-emitting diode thereby resulting in a very high light-emitting efficiency, and can be manufactured at low costs by one epitaxial growth and also to provide a method for making the diode of a type mentioned above.

It is also desirable to provide an integrated light-emitting diode having such advantages as mentioned above and a method for making same.

It is further desirable to provide a method for growing a nitride-based III-V compound semiconductor suitably used to manufacture such a light-emitting diode or integrated light-emitting diode.

It is a still further desirable to provide a variety of high-performance devices, such as a light source cell unit, a light-emitting diode backlight, a light-emitting diode display and other electronic devices, using such a light-emitting diode as mentioned above.

Other features of the present invention will become apparent from the following description with reference to the accompanying drawings.

A number of embodiments of the present invention are summarized below.

According to a first embodiment of the present invention, there is provided a method for making a light-emitting diode, which including the steps of: providing a substrate having at least one recessed portion on one main surface thereof and growing a first nitride-based III-V group compound semiconductor layer through a state of making a triangle in section having a bottom surface of the recessed portion as a base thereof thereby burying the recessed portion; laterally growing a second nitride-based III-V group compound semiconductor layer from the first nitride-based III-V compound semiconductor layer over the substrate; and successively growing a third nitride-based III-V group compound semiconductor layer of a first conduction type, an active layer and a fourth nitride-based III-V group compound semiconductor layer of a second conduction type on the second nitride-based III-V group compound semiconductor layer.

The first nitride-based III-V group semiconductor layer and the second nitride-based III-V group semiconductor layer may be either type of conduction and may be any of p, n and i types, and may be of the same conduction type or of other conduction types from each other. In addition, two or more portions of different types may be mixed in the first nitride-based III-V group compound semiconductor layer or second nitride-based III-V compound semiconductor layer.

Typically, when the first nitride-based III-V group compound semiconductor layer is grown, a dislocation occurs from an interface with the bottom surface of the recessed portion of the substrate in a direction vertical to one main surface of the substrate. When this dislocation arrives at an inclined face or its vicinity of the first nitride-based III-V group compound semiconductor layer in such a state as to form a triangle in section, it bends so as to be kept away from the triangular portion in parallel to the one main surface. Also typically, when the first nitride-based III-V group compound semiconductor layer and the second nitride-based III-V group compound semiconductor layer are, respectively, grown, a first pit having a first width is formed in the substrate at a bottom of the recessed portion thereof and a second pit having a second width larger than the first width is formed in the substrate at the opposite sides of the recessed portion. These first and second pits are formed by reflection of the growth of the first nitride-based III-V group compound semiconductor layer and the second nitride-based III-V group compound semiconductor layer in such a way as set out above. Typically, recessed portions and protruded portions should be alternately arranged on the one surface of the substrate. The recessed portion may be formed as extended in a striped form in one direction, or may be extended in striped forms in first and second directions, at least, intersecting with each other thereby providing a two-dimensional pattern where a protruded portion is in the form of a triangle, a quadrangle, a pentagon, a hexagon or the like with corners being cut off or rounded, or in the form of a circle, an ellipse, dots or the like. In one preferred instance, the protruded portion has a hexagonal plane shape, and such protrude portions are two-dimensionally arranged in the form of a honeycomb and recessed portions are formed as surrounding individual protruded portions. This enables one to extract light emitted from the active layer in an efficient manner in all directions of 360 degrees. Alternatively, the recessed portion may have a hexagonal plane shape, with which the recessed portions are two-dimensionally arranged in a honeycomb form so as to surround individual recessed portions with the protruded portions. Where the recessed portion of the substrate is in a striped form, this recessed portion extends, for example, along the <1-100> direction of the first nitride-based III-V group compound semiconductor layer. The section of the recessed portion may take various forms such as a rectangle, an inverted trapezoid and the like, and side walls may include a flat face, but also a curved face having a gentle slope, and corners may be rounded. From the standpoint of improving a light extraction efficiency, it is preferred that the section of the recessed portion is in the form of an inverted trapezoid. In this case, it is preferred from the standpoint of minimizing the dislocation density in the second nitride-based III-V group compound semiconductor layer that when a depth of the recessed portion is taken as d, a width of the bottom surface of the recessed portion is taken as $W_g$ and an angle established between the inclined face of the first nitride-based III-V group compound semiconductor layer in a state of a triangle in section and the one main surface of the substrate is taken as $\alpha$, d, $W_g$ and $\alpha$ are so determined as to establish the relation of $2d \geq W_g \tan \alpha$. Since $\alpha$ is ordinarily constant, d and $W_g$ are so determined as to establish the inequality. If d is too large, starting gases are not satisfactorily supplied inside the recessed portion, thereby impeding the formation of the first nitride-based III-V group compound semiconductor layer from the bottom of the recessed portion. In contrast, if d is too small, the first nitride-based III-V group compound semiconductor layer is grown not only at the recessed portion of the substrate, but also at portions at opposite sides (usually, protruded portions) thereof. From the standpoint of preventing such formation, it is usual to select it within a range of 0.5 µm<d<5 µm, preferably within a range of 1.0±0.2 µm. $W_g$ is generally within a range of 0.5 to 5 µm, preferably 2±0.5 µm. Although the width $W_t$ at the upper surface of the protruded portion is basically selected arbitrarily, the protruded portion is a region which is used for lateral growth of the second nitride-based III-V group compound semiconductor layer, so that a larger width leads to a larger area of a portion with a reduced dislocation density. $W_t$ is generally within a range of 1 to 1000 µm, preferably 4±2 µm.

From the view of growing the first nitride-based III-V group compound semiconductor layer at the recessed portions of the substrate, an amorphous layer may be formed over the substrate at opposite sides of the recessed portion. The amorphous layer is to be a growth mask. This is because nucleic formation is unlikely to occur on an amorphous layer upon growth. The amorphous layer may be formed, for example, by subjecting a surface layer of a single crystal substrate to ion implantation for amorphousization or by forming over the substrate by any of a variety of film formation methods. The amorphous layer is made of an amorphous Si (a-Si) film including, for example, a $SiO_2$ film, a SiN film (including not only a $Si_3N_4$ film, but also those films having different compositions formed by a plasma CVD method), and a SiON film (including a case where a ratio between O and N is changed and a refractive index and a side face shape are in conformity with a desired design) and is generally an insulating film. Moreover, the substrate may be formed at opposite sides of individual recessed portions successively with a first amorphous layer, a second amorphous layer and a third amorphous layer for use as a growth mask upon growth of the first nitride-based III-V group compound semiconductor layer. In this case, the second amorphous layer should be one which can be selectively etched, for example, relative to the first and third amorphous layers.

After lateral growth of the second nitride-based III-V group compound semiconductor layer, the following procedure may be possible, in which portions other than those above individual recessed portions of the second nitride-based III-V group compound semiconductor layer are removed, followed by further lateral growth of the third nitride-based III-V group compound semiconductor layer on the second nitride-based III-V group compound semiconductor layer left over the recessed portions and successive growth of an active layer and a fourth nitride-based III-V group compound semiconductor layer on the third nitride-based III-V group compound semiconductor layer. Alternatively, after the lateral growth of the second nitride-based III-V group compound semiconductor layer, another procedure may be possible, in which portions other than those located above individual recessed portions of the second nitride-based III-V group compound semiconductor layer may be removed, followed by lateral growth of a fifth nitride-based III-V group compound semiconductor layer on the second nitride-based III-V group compound semiconductor layer left over the recessed portions and successive growth of the third nitride-based III-V group compound semiconductor layer, the active layer and the fourth nitride-based III-V group compound semiconductor layer on the fifth nitride-based III-V group compound semiconductor layer.

The third nitride-based III-V group compound semiconductor layer is formed with an electrode of a first conduction type in electric connection or contact therewith. Likewise, an electrode of a second conduction type is formed at the fourth nitride-based III-V group compound semiconductor layer in a state electrically connected to the fourth layer.

The substrate may be made of a variety of materials. For a substrate made of a material of the type that is different from a nitride-based III-V group compound semiconductor layer, specific mention is made, for example, of substrates made of sapphire (of c, a, r faces and also of an off face thereof), SiC (including 6H, 4H and 3C). Si, ZnC, ZnO, LiMgO, GaAs, $MgAl_2O_4$ and the like. Preferably, there are used hexagonal or cubic substrates made of these materials, more preferably hexagonal substrates. Alternatively, substrates made of nitride-based III-V group compound semiconductors such as GaN, InAlGaN, AlN and the like may also be used. Still alternatively, those substrates obtained by growing a nitride-based III-V group compound semiconductor layer on a substrate made of a material different in type from the nitride-based III-V group compound semiconductor and forming recessed portions in this nitride-based III-V group compound semiconductor layer. In addition, there may be used another type of substrate wherein a substrate made of a material different from a nitride-based III-V group compound semiconductor is formed thereon with a layer made of a material different in type from a nitride-based III-V group compound semiconductor as a stacked polycrystal or amorphous layer of at least one type of material, followed by patterning the layer partly to the depth of the substrate thereby forming a patterned indented surface.

It will be noted that the substrate may be removed, if necessary.

The nitride-based III-V group compound semiconductor layer used as the first to fifth nitride-based III-V group compound semiconductor layers and the active layer is most commonly made of a semiconductor of the formula $Al_xB_yGa_{1-x-y-z}In_zAs_uN_{1-u-v}P_v$ wherein $0 \leq x \leq 1$, $0 \leq y \leq 1$, $0 \leq z \leq 1$, $0 \leq u \leq 1$, and $0 \leq v \leq 1$ provided that $0 \leq x+y+z<1$ and $0 \leq u+v<1$. Preferably, mention is made of $Al_xB_yGa_{1-x-y-z}In_zN$ wherein $0 \leq x \leq 1$, $0 \leq y \leq 1$, $0 \leq z \leq 1$, and $0 \leq x+y+z<1$. More preferably, the semiconductor layer is made of $Al_xGa_{1-x-z}In_zN$ wherein $0 \leq x \leq 1$ and $0 \leq z \leq 1$. Specific examples include GaN, InN, AlN, AlGaN, InGaN, AlGaInN and the like. The first nitride-based III-V group compound semiconductor layer to be buried in the recessed portions of a substrate is preferably made of GaN, $In_xGa_{1-x}N$ wherein $0<x<0.5$, $Al_xGa_{1-x}N$ wherein $0<x<0.5$, $Al_xIn_yGa_{1-x-y}N$ wherein $0<x<0.5$ and $0<y<0.2$. The first conduction type may be either an n-type or a p-type and, correspondingly, the second conduction type may be either a p-type or an n-type.

For the growth of the nitride-based III-V group compound semiconductor layer constituting the first to fifth nitride-based III-V group compound semiconductor layers and the active layer, there may be used, for example, a metallo-organic chemical vapor deposition (MOCVD), a hydride or halide vapor phase epitaxy (HVPE), a molecular beam epitaxy (MBE) and other many epitaxies.

According to a second embodiment of the present invention, there is provided a light-emitting diode, which including: a substrate having at least one recessed portion on one main surface thereof; a sixth nitride-based III-V group compound semiconductor layer grown on the substrate without forming a space in the recessed portion; and a third nitride-based III-V group compound semiconductor layer of a first conduction type, an active layer and a fourth nitride-based III-V group compound semiconductor layer of a second conduction type formed over the sixth nitride-based III-V group compound semiconductor layer. In the light-emitting diode, a dislocation occurring, in the sixth nitride-based III-V group compound semiconductor layer, from an interface with a bottom surface of the recessed portion in a direction vertical to the one main surface may arrive at an inclined face or its vicinity of a triangle having the bottom surface of the recessed portion as a base thereof and bend in a direction parallel to the one main surface.

According to a third embodiment of the present invention, there is provided a light-emitting diode, which including: a substrate having at least one recessed portion on one main surface thereof; a sixth nitride-based III-V group compound semiconductor layer grown on the substrate without forming a space in the recessed portion; and a third nitride-based III-V group compound semiconductor layer of a first conduction type, an active layer and a fourth nitride-based III-V group compound semiconductor layer of a second conduction type formed over the sixth nitride-based III-V group compound semiconductor layer. In the light-emitting diode, the substrate may have a first pit having a first width at a bottom of the recessed portion and a second pit having a second width larger than the first width at opposite sides of the recessed portion.

In the second and third embodiments and also in fifth, sixth and eighth to seventeenth embodiments, appearing hereinafter, of the present invention, the sixth nitride-based III-V group compound semiconductor layer corresponds to the first nitride-based III-V group compound semiconductor layer and the second nitride-based III-V group compound semiconductor layer in the first embodiment, respectively.

It should be noted that all the illustrations related to the first embodiment may be likewise true of the second and third embodiments of the present invention and the fourth to eighteenth embodiments appearing hereinafter unless otherwise stated or unless otherwise needed in individual embodiments.

According to a fourth embodiment of the present invention, there is provided a method for making an integrated light-emitting diode having a plurality of light-emitting diodes integrated therein, which including the steps of: growing a first nitride-based III-V group compound semiconductor layer in at least one recessed portion formed at one main surface of a substrate through a state of making a triangle in section using a bottom surface of the recessed portion as a base thereby burying the recessed portion therewith; laterally growing a second nitride-based III-V group compound semiconductor layer from the first nitride-based III-V group compound semiconductor layer over the substrate; and successively growing, over the second nitride-based III-V group compound semiconductor layer, a third nitride-based III-V group compound semiconductor layer of a first conduction type, an active layer and a fourth nitride-based III-V group compound semiconductor layer.

According to a fifth embodiment of the present invention, there is provided an integrated light-emitting diode having a plurality of light-emitting diodes integrated therein, at least one light emitting diode thereof including: a substrate having at least one recessed portion on one main surface thereof; a sixth nitride-based III-V group compound semiconductor layer grown on the substrate without forming a space in the recessed portion; and a third nitride-based III-V group compound semiconductor layer of a first conduction type, an active layer and a fourth nitride-based III-V group compound semiconductor layer of a second conduction type formed over the sixth nitride-based III-V group compound semiconductor layer. In the light-emitting diode, a dislocation occurring, in the sixth nitride-based III-V group compound semiconductor layer, from an interface with a bottom surface of the recessed portion in a direction vertical to the one main surface may arrive at an inclined face or its vicinity of a triangle having the bottom surface of the recessed portion as a base thereof and bend in a direction parallel to the one main surface.

According to a sixth embodiment of the present invention, there is provided an integrated light-emitting diode having a plurality of light-emitting diodes integrated therein, at least one light-emitting diode including: a substrate having at least one recessed portion on one main surface thereof; a sixth nitride-based III-V group compound semiconductor layer grown on the substrate without forming a space in the recessed portion; and a third nitride-based III-V group compound semiconductor layer of a first conduction type, an active layer and a fourth nitride-based III-V group compound semiconductor layer of a second conduction type formed over the sixth nitride-based III-V group compound semiconductor layer. In the light-emitting diode, the substrate may have a first pit having a first width at a bottom of the recessed portion and a second pit having a second width larger than the first width at opposite sides of the recessed portion.

In the fourth to sixth embodiments of the present invention, the integrated light-emitting diodes can be used in a variety of uses in the field. Typical utility is directed to light-emitting diode backlights such as a liquid crystal display, a light-emitting diode lighting apparatus, a light-emitting diode display and the like. The integrated light-emitting diode may be arbitrary with respect to the manner and form of arrangement of light-emitting diodes. For instance, light-emitting diodes may be arranged in two-dimensional arrays, or may be such that striped light-emitting diodes are arranged in one line or plural lines. The form of the integrated light-emitting diode includes a form wherein a wafer having a stacked structure of semiconductor layers is block-processed according to a so-called semiconductor processing technique to provide circuit patterns and individual light-emitting diodes integrated and arranged microfinely in plurality or a form where individual light-emitting diodes hat have been microchipped beforehand are microfinely, plurally arranged over a circuit pattern or patterns. In addition, these light-emitting diodes may be driven independently or all in together. Alternatively, a group of light-emitting diodes within an optionally set region may be driven independently in block (i.e. area drive).

According to a seventh embodiment of the present invention, there is provided a method for growing a nitride-based III-V group compound semiconductor layer, which including the steps of: providing a substrate having at least one recessed portion on one main surface thereof and growing a first nitride-based III-V group compound semiconductor layer through a state of making a triangle in section having a bottom surface of the recessed portion as a base thereof thereby burying the recessed portion; and laterally growing a second nitride-based III-V group compound semiconductor layer from the first nitride-based compound semiconductor layer over the substrate.

This growth method of the nitride-based III-V group compound semiconductor may be applied to not only to the manufacture of a light-emitting diode and an integrated light-emitting diode, and also to the manufacture of various types of semiconductor devices.

According to an eighth embodiment of the present invention, there is provided a substrate for growth of a nitride-based III-V group compound semiconductor, which including: a substrate having at least one recessed portion on one main surface thereof; and a sixth nitride-based III-V group compound semiconductor layer grown on the substrate without forming a space in the recessed portion. In the substrate, a dislocation occurring from an interface with a bottom surface of the recessed portion in a direction vertical to the one main surface in the sixth nitride-based III-V group compound semiconductor layer may arrive at an inclined face or its vicinity of a triangle having the bottom surface of the recessed portion as a base thereof and bend in a direction parallel to the one main surface.

According to a ninth embodiment of the present invention, there is provided a substrate for growth of a nitride-based III-V group compound semiconductor, which including: a substrate having at least one recessed portion on one main surface thereof; and a sixth nitride-based III-V group compound semiconductor layer grown on the substrate without forming a space in the recessed portion. The substrate may have a first pit having a first width at a bottom of the recessed portion and a second pit having a second width larger than the first width at opposite sides of the recessed portion.

According to a tenth embodiment of the present invention, there is provided a light source cell unit which includes a printed circuit board and a plurality of cells formed on the printed circuit board, each cell containing at least one red light-emitting diode, at least one green light-emitting diode and at least one blue light-emitting diode. In the light source cell unit, at least one of the red light-emitting diode, the green light-emitting diode and the blue light-emitting diode may include: a substrate having at least one recessed portion on one main surface thereof; a sixth nitride-based III-V group compound semiconductor layer grown on the substrate without forming a space in the recessed portion; and a third nitride-based III-V group compound semiconductor layer of a first conduction type, an active layer and a fourth nitride-based III-V group compound semiconductor layer of a second conduction type formed over the sixth nitride-based III-V group compound semiconductor layer. And a dislocation occurring from an interface with a bottom surface of the recessed portion in a direction vertical to the one main surface in the sixth nitride-based III-V group compound semiconductor layer may arrive at an inclined face or its vicinity of a triangle having the bottom surface of the recessed portion as a base thereof and bend in a direction parallel to the one main surface.

According to an eleventh embodiment of the present invention, there is provided a light-emitting diode backlight which includes plural red light-emitting diode, plural green light-emitting diode and plural blue light-emitting diode arranged in pattern. In the light-emitting diode, at least one of the red light-emitting diode, the green light-emitting diode and the blue light-emitting diode may include: a substrate having at least one recessed portion on one main surface thereof; a sixth nitride-based III-V group compound semiconductor layer grown on the substrate without forming a space in the recessed portion; and a third nitride-based III-V group compound semiconductor layer of a first conduction type, an active layer and a fourth nitride-based III-V group compound semiconductor layer of a second conduction type formed over the sixth nitride-based III-V group compound semiconductor layer. And a dislocation occurring, in the sixth nitride-based III-V group compound semiconductor layer, from an interface with a bottom surface of the recessed portion in a direction vertical to the one main surface may arrive at an inclined face or its vicinity of a triangle having the bottom surface of the recessed portion as a base thereof and bend in a direction parallel to the one main surface.

According to a twelfth embodiment of the present invention, there is provided a light-emitting diode backlight which includes a red light-emitting diode, a green light-emitting diode and a blue light-emitting diode arranged in pattern, each being plural in number, wherein at least one of the red light-emitting diode, the green light-emitting diode and the blue light-emitting diode includes: a substrate having at least one recessed portion on one main surface thereof; a sixth nitride-based III-V group compound semiconductor layer grown on the substrate without forming a space in the recessed portion; and a third nitride-based III-V group compound semiconductor layer of a first conduction type, an active layer and a fourth nitride-based III-V group compound semiconductor layer of a second conduction type formed over the sixth nitride-based III-V group compound semiconductor layer, wherein the substrate has a first pit having a first width at a bottom of the recessed portion and a second pit having a second width larger than the first width at opposite sides of the recessed portion.

According to a thirteenth embodiment of the present invention, there is provided a light-emitting diode lighting apparatus which includes a red light-emitting diode, a green light-emitting diode and a blue light-emitting diode arranged in pattern, each being plural in number, wherein at least one of the red light-emitting diode, the green light-emitting diode and the blue light-emitting diode includes: a substrate having at least one recessed portion on one main surface thereof; a sixth nitride-based III-V group compound semiconductor layer grown on the substrate without forming a space in the recessed portion; and a third nitride-based III-V group compound semiconductor layer of a first conduction type, an active layer and a fourth nitride-based III-V group compound semiconductor layer of a second conduction type formed over the sixth nitride-based III-V group compound semiconductor layer, wherein a dislocation occurring, in the sixth nitride-based III-V group compound semiconductor layer, from an interface with a bottom surface of the recessed portion in a direction vertical to the one main surface arrives at an inclined face or its vicinity of a triangle having the bottom surface of the recessed portion as a base thereof and bends in a direction parallel to the one main surface.

According to a fourteenth embodiment of the present invention, there is provided a light-emitting diode lighting apparatus which includes a red light-emitting diode, a green light-emitting diode and a blue light-emitting diode arranged in pattern, each being plural in number, wherein at least one of the red light-emitting diode, the green light-emitting diode and the blue light-emitting diode includes: a substrate having at least one recessed portion on one main surface thereof; a sixth nitride-based III-V group compound semiconductor layer grown on the substrate without forming a space in the recessed portion; and a third nitride-based III-V group compound semiconductor layer of a first conduction type, an active layer and a fourth nitride-based III-V group compound semiconductor layer of a second conduction type formed over the sixth nitride-based III-V group compound semiconductor layer, wherein the substrate has a first pit having a first width at a bottom of the recessed portion and a second pit having a second width larger than the first width at opposite sides of the recessed portion.

According to a fifteenth embodiment of the present invention, there is provided a light-emitting diode display which includes a red light-emitting diode, a green light-emitting diode and a blue light-emitting diode arranged in pattern, each being plural in number, wherein at least one of the red light-emitting diode, the green light-emitting diode and the blue light-emitting diode includes: a substrate having at least one recessed portion on one main surface thereof; a sixth nitride-based III-V group compound semiconductor layer grown on the substrate without forming a space in the recessed portion; and a third nitride-based III-V group compound semiconductor layer of a first conduction type, an active layer and a fourth nitride-based III-V group compound semiconductor layer of a second conduction type formed over the sixth nitride-based III-V group compound semiconductor layer, wherein a dislocation occurring, in the sixth nitride-based III-V group compound semiconductor layer, from an interface with a bottom surface of the recessed portion in a direction vertical to the one main surface arrives at an inclined face or its vicinity of a triangle having the bottom surface of the recessed portion as a base thereof and bends in a direction parallel to the one main surface.

According to a sixteenth embodiment of the present invention, there is provided a light-emitting diode display which includes a red light-emitting diode, a green light-emitting diode and a blue light-emitting diode arranged in pattern, each being plural in number, wherein at least one of the red light-emitting diode, the green light-emitting diode and the blue light-emitting diode includes: a substrate having at least one recessed portion on one main surface thereof; a sixth nitride-based III-V group compound semiconductor layer grown on the substrate without forming a space in the recessed portion; and a third nitride-based III-V group compound semiconductor layer of a first conduction type, an active layer and a fourth nitride-based III-V group compound semiconductor layer of a second conduction type formed over the sixth nitride-based III-V group compound semiconductor layer, wherein the substrate has a first pit having a first width at a bottom of the recessed portion and a second pit having a second width larger than the first width at opposite sides of the recessed portion.

In the tenth to sixteenth embodiments of the present invention, the red light-emitting diode may be one that makes use, for example, of an AlGaInP semiconductor.

According to a seventeenth embodiment of the present invention, there is provided an electronic device including at least one light-emitting diode, the at least one light-emitting diode including: a substrate having at least one recessed portion on one main surface thereof; a sixth nitride-based III-V group compound semiconductor layer grown on the substrate without forming a space in the recessed portion; and a third nitride-based III-V group compound semiconductor layer of a first conduction type, an active layer and a fourth nitride-based III-V group compound semiconductor layer of a second conduction type formed over the sixth nitride-based III-V group compound semiconductor layer, wherein a dislocation occurring, in the sixth nitride-based III-V group compound semiconductor layer, from an interface with a bottom surface of the recessed portion in a direction vertical to the one main surface arrives at an inclined face or its vicinity of a triangle having the bottom surface of the recessed portion as a base thereof and bends in a direction parallel to the one main surface.

According to an eighteenth embodiment of the present invention, there is provided an electronic device which includes at least one light-emitting diode, the at least one light-emitting diode including: a substrate having at least one recessed portion on one main surface thereof; a sixth nitride-based III-V group compound semiconductor layer grown on the substrate without forming a space in the recessed portion; and a third nitride-based III-V group compound semiconductor layer of a first conduction type, an active layer and a fourth nitride-based III-V group compound semiconductor layer of a second conduction type formed over the sixth nitride-based III-V group compound semiconductor layer, wherein the substrate has a first pit having a first width at a bottom of the recessed portion and a second pit having a second width larger than the first width at opposite sides of the recessed portion.

In the seventeenth and eighteenth embodiments of the present invention, the electronic device include, aside from a light-emitting diode backlight (e.g. a backlight for a liquid crystal display or the like), a light-emitting diode lighting apparatus, a light-emitting diode display and the like, a projector using a light-emitting diode as a light source, a rear projection television, a grating light valve (GLV) and the like. In general, the electronic device may fundamentally be of any type provided that it has at least one light-emitting diode for the purpose of display, lighting, optical communication, optical transmission and the like, and may include both portable and desktop ones. Specific examples other than those indicated above include a cell phone, a mobile device, a robot, a personal computer, a on-vehicle device, a variety of domestic electric products, a light-emitting diode optical communication device, a light-emitting diode optical transmission device and the like. Electronic devices further include combinations of two or more types of light-emitting diodes capable of emitting light of different wavelengths in wavelength ranges including a far-infrared wavelength range, an infrared wavelength range, a red wavelength range, a yellow wavelength range, a green wavelength range, a blue wavelength range, a purple wavelength range, a ultraviolet wavelength range and the like. Especially, with a light-emitting lighting device, two or more light-emitting diodes, which are capable of emitting visible light of different wavelength ranges selected among a red wavelength range, a yellow wavelength range, a green wavelength range, a blue wavelength range and a purple wavelength range. Tow or more types of light emitted from these light-emitting diodes are mingled to obtain natural light or white light. Moreover, using, as a light source, a light-emitting diode capable of emitting light within at least one wavelength range of the blue light wavelength range, purple wavelength range and ultraviolet wavelength range, light emitted form this light-emitting diode is irradiated against a fluorescent body and the light obtained by excitation of the body is mingled therewith to obtain natural light or white light.

According to a nineteenth embodiment of the present invention, there is provided a method for making an electronic device, which including the steps of: providing a substrate having at least one recessed portion on one main surface and growing a first layer at the recessed portion through a state of making a triangle in section having a bottom surface of the recessed portion as a base and burying the recessed portion; and laterally growing a second layer from the first nitride-based compound semiconductor layer over the substrate.

According to a twentieth embodiment of the present invention, there is provided an electronic device, which including: a substrate having at least one recessed portion on one main surface; and a third layer formed on the substrate and grown without forming a space in the recessed portion, wherein a dislocation occurring, in the third layer, from an interface with a bottom surface of the recessed portion in a direction vertical to the one main surface arrives at an inclined face or its vicinity of a triangle having the bottom surface of the recessed portion as a base and bends in a direction parallel to the one main surface.

In the nineteenth and twentieth embodiments of the present invention, the first to third layers may be made, aside from a nitride-based III-V group compound semiconductor, of other types of semiconductors having a wurtzit structure or more generally, a hexagonal crystal structure, e.g. ZnO, α-ZnS, α-CdS, α-CdSe and the like, and a variety of semiconductors having other crystal structures. Semiconductor devices using these semiconductors include light-emitting devices such as ordinary light-emitting diodes, inter-subband transition (quantum cascade) light-emitting diodes, ordinary semiconductor lasers, inter-subband transition (quantum cascade) semiconductor lasers and the like, also light-receiving devices such as photodiodes, sensors, solar cells, and electron transit devices typical of which are transistors including an field effect transistor (FET) such as a high electron mobility transistor and a bipolar transistor such as a heterojunction bipolar transistor (HBT). These devices may be mounted on the same substrate or chip singly or plurally. These devices may be so arranged to be driven independently, if necessary. The optical electronic IC (OEIC) can be constructed by intergrating light-emitting devices and electron transit devices on the same substrate. An optical wiring can be formed according to need. In addition, when at least one light-emitting device (light-emitting diode or semiconductor laser) is used to permit light to flush, lighting communication or optical communication can be performed. In this case, lighting communication or optical communication may be carried out using a plurality of light beams of different wavelength ranges.

The electronic devices include, aside from such semiconductor devices, (e.g. light-emitting devices, light-receiving devices, electron transit devices and the like), piezoelectric devices, pyroelectric devices, optical devices (such as a second-order harmonic generator using a nonlinear optical crystal, a dielectric device including a ferrodielectric device), and a superconduction device and the like. In this connection, the materials for the first to third layers may include a variety of semiconductors as indicated above and particularly with the piezoelectric device, pyroelectric device, optical device, dielectric device, and superconducting device, many materials such as oxides having a hexagonal crystal structure can be used.

When using those electronic devices including a light-emitting diode or a semiconductor laser, there can be provided a light-emitting diode backlight, a light-emitting diode lighting device, a light-emitting diode display, a projector or a rear projection television using a light-emitting diode or a semiconductor laser as a light source, and electronics such as a grating light valve.

With respect to the nineteenth and twentieth embodiments of the present invention, such applications as in the first to eighteenth embodiments are likewise possible.

According to the embodiments of the present invention as stated hereinabove, a first nitride-based III-V group compound semiconductor layer starts to grow from a bottom of a recessed portion of a substrate. During the course of the growth, the first nitride-based III-V group compound semiconductor layer is being formed through a state of making a triangle in section having the bottom as a base thereof thereby burying the recessed portion with the layer without a space in the recessed portion. Thereafter, a second nitride-based III-V group compound semiconductor layer is laterally grown from the thus grown first nitride-based III-V group compound semiconductor layer. At this stage, a dislocation occurs, in the first nitride-based III-V group compound semiconductor layer, from an interface with the bottom of the recessed portion of the substrate in a direction vertical to one main surface of the substrate. This dislocation arrives at an inclined face or its vicinity of the first nitride-based III-V group compound semiconductor layer, under which as the second nitride-based III-V group compound semiconductor layer grows, the dislocation bends therefrom in a direction parallel to the one main surface of the substrate. At the time when the second nitride-based III-V group compound semiconductor layer is grown to a satisfactory thickness, a portion above the dislocation parallel to the one main surface of the substrate becomes a region where a dislocation density is very small. According to this method, the first to fourth nitride-based III-V group compound semiconductor layers can be grown by one epitaxy.

More generally speaking, similar results may be likewise achieved when taking the first nitride-based III-V group compound semiconductor layer merely as a first layer and the second nitride-based III-V group compound semiconductor layer merely as a second layer.

According to the embodiments of the present invention, no space or gap is formed between the first nitride-based III-V group compound semiconductor layer and second nitride-based III-V group compound semiconductor layer and the substrate, a light extraction efficiency can be remarkably improved. Since crystallinity of the second nitride-based III-V group compound semiconductor layer becomes good, the crystallinities of the third nitride-based III-V group compound semiconductor layer, active layer and fourth nitride-based III-V group compound semiconductor layer grown on the second layer can be remarkably improved. Eventually, a light-emitting diode having a very high light emission efficiency. In addition, since the light-emitting diode can be made by one epitaxy, the manufacturing costs are low. Thus, there can be realized the manufacture of a high-performance light source cell unit, light-emitting diode backlight, light-emitting diode lighting device and light-emitting diode display, and various types of electronics using the light-emitting diode of this high light emission efficiency.

More generally, similar results may be obtained when the first nitride-based III-V group compound semiconductor layer is taken as a first layer and the second nitride-based III-V group compound semiconductor layer taken as a second layer.

The above and other features and advantages of the present invention will become apparent from the following description when taken in conjunction with the accompanying drawings which illustrate preferred embodiments of the present invention by way of example.

BRIEF DESCRIPTION OF THE DRAWINGS

FIGS. 1A to 1F are, respectively, a sectional view illustrating a method for making a GaN light-emitting diode according to a first embodiment of the present invention;

FIGS. 8A and 8B are, respectively, a schematic view illustrating the behavior of dislocations obtained through TEM observation of the GaN layer grown on the sapphire substrate in the method for making a GaN light-emitting diode according to the first embodiment of the present invention;

FIG. 9 is a schematic view illustrating the results of estimation of a dislocation density in the GaN layer grown on the sapphire substrate in the method for making a GaN light-emitting diode according to the first embodiment of the present invention;

FIG. 20 is a schematic view illustrating surface flatness of an active layer of the GaN light-emitting diode made according to the first embodiment of the present invention;

FIGS. 27A to 27J are, respectively, a sectional view illustrating a method for making a GaN light-emitting diode according to an eighth embodiment of the present invention;

DETAILED DESCRIPTION OF THE PREFERRED EMBODIMENTS

Figure 1F:
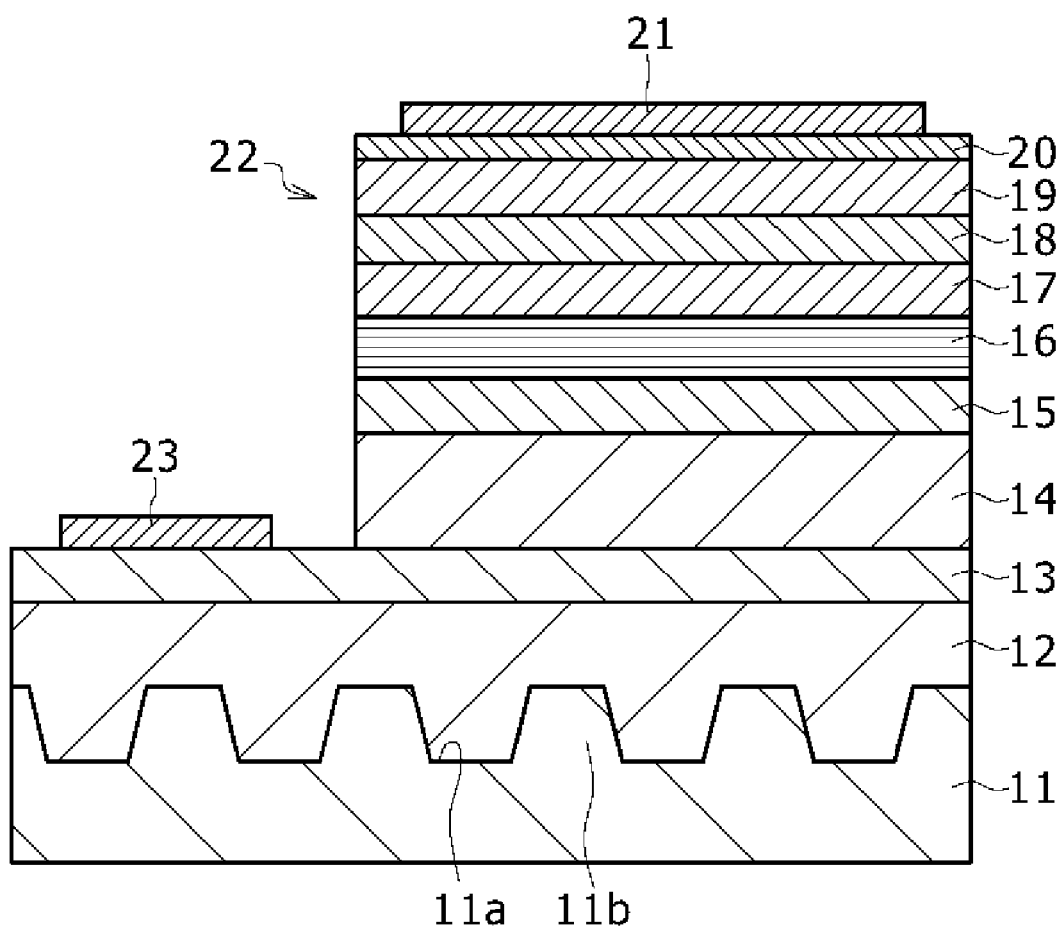

Embodiments of the present invention are illustrated with reference to the accompanying drawings. It will be noted that like reference numerals indicate like parts or members throughout the drawings.

FIGS. 1A to 1F are views showing, in the order of steps, a method for making a GaN light-emitting diode according to a first embodiment of the present invention.

In this first embodiment, as shown in FIG. 1A, a sapphire substrate 11 having a patterned indentation on one main surface thereof is provided. Reference numeral 11a indicates a recessed portion or recess and reference numeral 11b indicates a protruded portion or protrusion. In this case, the recessed portion 11a has an inverted trapezoid in section. For instance, the main surface of sapphire substrate 11 is a c-face and the recessed portion 11a is in a striped form extending in a <1-100> direction of the sapphire substrate 11. Although the planar shapes of the recessed portion 11a and the protruded portion 11b may be those ones set out hereinbefore, respectively, preferred instances are shown in FIG. 2. In this instance, as shown in FIG. 2, each of the protruded portions 11b is hexagonal in plane and they are two-dimensionally arranged to be shaped as a honeycomb. The recessed portions 11a are formed to surround individual protrusions 11b. The hexagonal protruded portion 11b has a distance between facing sides of the hexagon, for example, at 3.8 to 4.2 µm, preferably at 4 µm. The distance between adjacent hexagonal protrusions 11b is set, for example, at 1.3 to 1.7 µm, preferably 1.5 µm although not limitative. Typically, the direction of the dotted line (i.e. a direction of a line connecting the centers of the most adjacent protruded portions 11b) is made parallel to an m axis of a GaN layer described hereinafter. The surface indentation of the sapphire substrate 11 may be carried out according to many methods including a reactive ion etching (RIE) method, a powder blasting technique, a sand blasting technique and the like. The sizes of these recessed portion 11a and protruded portion 11b are described hereinlater in detail.

Next, the sapphire substrate 11 is cleaned on the surfaces thereof such as by thermal cleaning, followed by growing on the sapphire substrate 11, for example, a GaN buffer layer (not shown) at a growth temperature, for example, of about 550° C. according to a known procedure. Subsequently, using, for example, a MOCVD method, GaN is epitaxially grown. At this stage, as shown in FIG. 1B, the growth starts initially from the bottom surface of the recessed portion 11a, and a GaN layer 12 is grown in such a way as to form an isosceles triangle in section that has the bottom as a base and a facet inclined relative to the main surface of the sapphire substrate 11 as an inclined side. For instance, the GaN layer 12 extends in a <1-100> direction with the facet of the inclined side or surface thereof being a (1-101) face. This GaN layer 12 may be either undoped or doped with an n-type or p-type impurity. The growing conditions of the GaN layer 12 are described hereinafter.

Subsequently, the growth of the GaN layer 12 is so carried out while keeping the direction of the facet face of the inclined surface, the recessed portion 11a is fully filled therein as shown in FIG. 1C. In FIG. 1C, dotted lines indicate a growth interface on the way of growth (hereinafter the same).

Next, when the growth is continued while setting the conditions where lateral growth is predominant, the GaN layer 12 spreads over the protruded portion 11b while increasing the thickness thereof as shown in FIG. 1D. Finally, the GaN layers 12 growing from adjacent recessed portions 11a mutually contact with each other over the protruded portion 11b.

Thereafter, as shown in FIG. 1E, the GaN layer 12 is laterally grown so that the surface of the GaN layer 12 creates a flat surface in parallel to the main surface of the sapphire substrate 11. The thus grown GaN layer 12 has a very low dislocation density above the recessed portion 11a.

Figure 2:
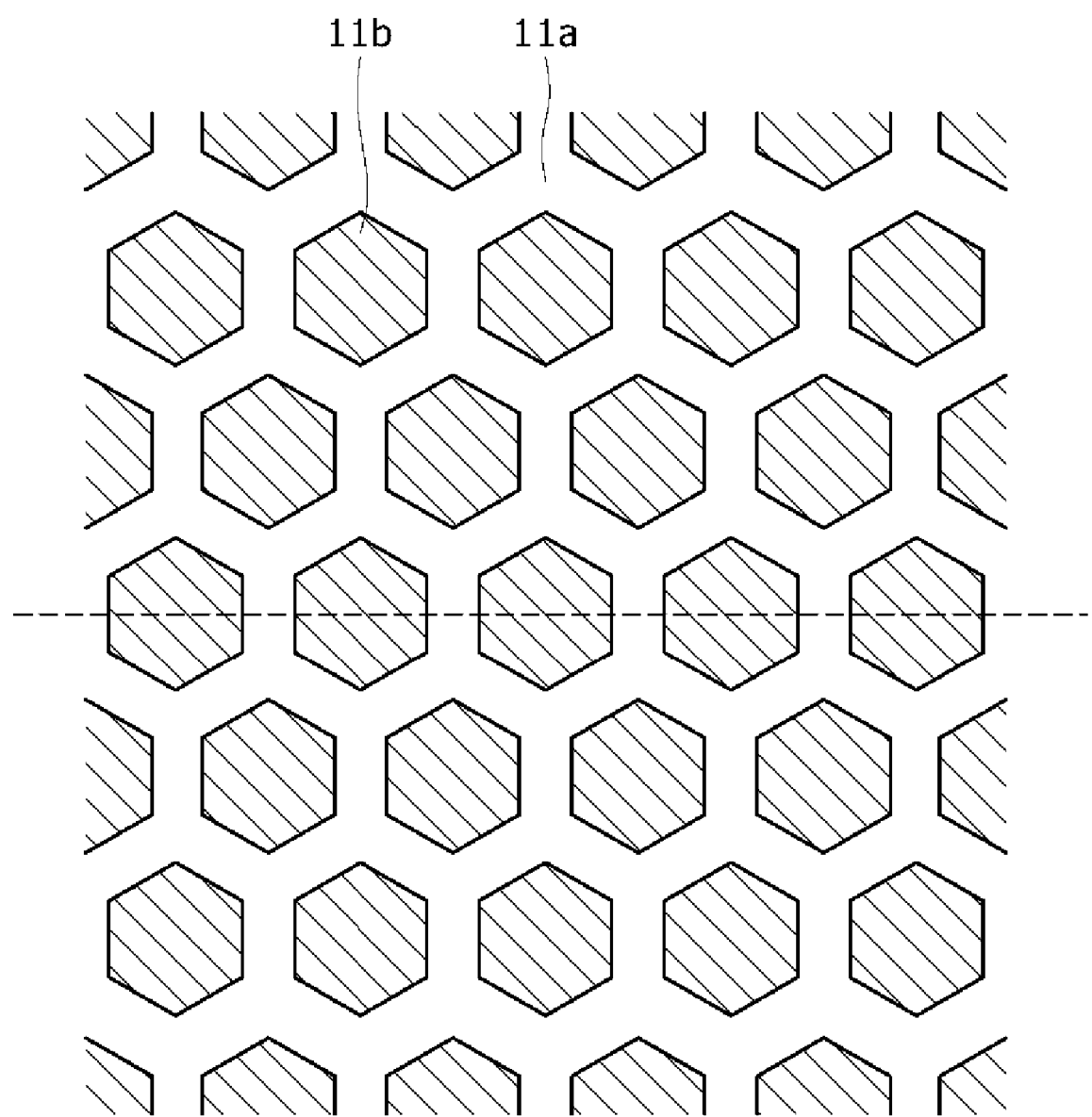
FIG. 2 is a plan view showing an instance of a planar shape of recessed portions and protruded portions formed on a sapphire substrate in the method for making a GaN light-emitting diode according to the first embodiment of the present invention.

Next, as shown in FIG. 1F, for example, an n-type GaInN layer 13, an n-type GaN layer 14, an n-type GaInN layer 15, an active layer 16, a p-type GaInN layer 17, a p-type AlInN layer 18, a p-type GaN layer 19 and a p-type GaInN layer 20 are successively epitaxially formed on the GaN layer 12. The active layer 16 has, for example, a GaInN-based multilayered quantum well (MQW) structure (e.g. an alternating stack of GaInN quantum well layers and GaN barrier layers). The In composition of the active layer 16 is selected depending the emission wavelength of a light-emitting diode and is, for example, at up to 11% for an emission wavelength of 405 nm, at up to 18% for 450 nm, and at up to 24% for 520 nm.

Thereafter, in order to activate the p-type impurities in the p-type GaInN layer 17, p-type AlInN layer 18, p-type GaN layer 19 and p-type GaInN layer 20, thermal treatment carried out in an atmosphere of a mixed gas, for example, of $N_2$ and $O_2$ (with a composition, for example, of 99% of $N_2$ and 1% of $O_2$) at a temperature of 550 to 750° C. (e.g. 650° C.) or 580 to 620° C. (e.g. 600° C). The activation is more likely to occur when $O_2$ is mixed with $N_2$. The time for the thermal treatment ranges, for example, from five minutes to two hours, or 40 minutes to two hours. In general, the time ranges from 10 to 60 minutes. The reason why the thermal treatment temperature is suppressed to a level that is relatively low is that the active layer 16 is prevented from degradation at the time of thermal treatment.

The starting material for the growth of the GaN semiconductor layer includes, for example, as a Ga material, triethyl gallium (($C_2H_5$)$_3$Ga, TEG) or trimethyl gallium (($CH_3$)$_3$Ga, TMG), as an Al material, trimethyl aluminium (($CH_3$)$_3$Al, TMA), and as an In material, trimethyl indium (($CH_3$)$_3$In, TMI), and as a N material, ammonium ($NH_3$). Dopants include, for example, silane ($SiH_4$) as an n-type dopant, and bis(methylcyclopentadiene)magnesium (($CH_3C_5H_4$)$_2$Mg), bis(ethylcyclopentadienyl)magnesium (($C_2H_5C_5H_4$)$_2$Mg) or bis(cyclopentadienyl)magnesium (($C_5H_5$)$_2$Mg) as a p-type dopant.

For the carrier gas atmosphere used to grow the GaN semiconductor layer, $H_2$ gas is used, for example.

Next, the sapphire substrate 11 on which the GaN semiconductor substrate has been formed in a manner as set out above is removed from the MOCVD apparatus.

Thereafter, a p-side electrode 21 is formed on the p-type GaInN layer 20. The material for the p-side electrode 21 is made of an ohmic metal having a high reflectivity and is preferably Ag or Pd/Ag. It will be noted that the p-side electrode 21 may be formed after the epitaxial growth of the n-type GaInN layer 13, n-type GaN layer 14, n-type GaInN layer 15, active layer 16, p-type GaInN layer 17, p-type AlInN layer 18, p-type GaN layer 19 and p-type GaInN layer 20 but prior to the thermal treatment for activating the p-type impurities in the p-type GaInN layer 17, p-type AlInN layer 18, p-type GaN layer 19 and p-type GaInN layer 20.

Next, the n-type GaN layer 14, n-type GaInN layer 15, active layer 16, p-type GaInN layer 17, p-type AlInN layer 18, p-type GaN layer 19 and p-type GaInN layer 20 are patterned in a desired form, for example, according to a RIE method, a powder blasting method, a sand blasting method or the like to form a mesa portion 22.

Subsequently, an n-side electrode 23 is formed on the n-type GaInN layer 13 at a portion adjacent to the mesa portion 22. The n-side electrode 23 is one that has, for example, a Ti/Pt/Au structure.

Next, if necessary, the sapphire substrate 11 on which such a light-emitting diode structure as set forth hereinabove has been formed is cut off or lapped from the back side thereof to reduce its thickness, followed by scribing the sapphire substrate 11 and forming a bar. Thereafter, the bar is scribed for chipping.

Figure 3:
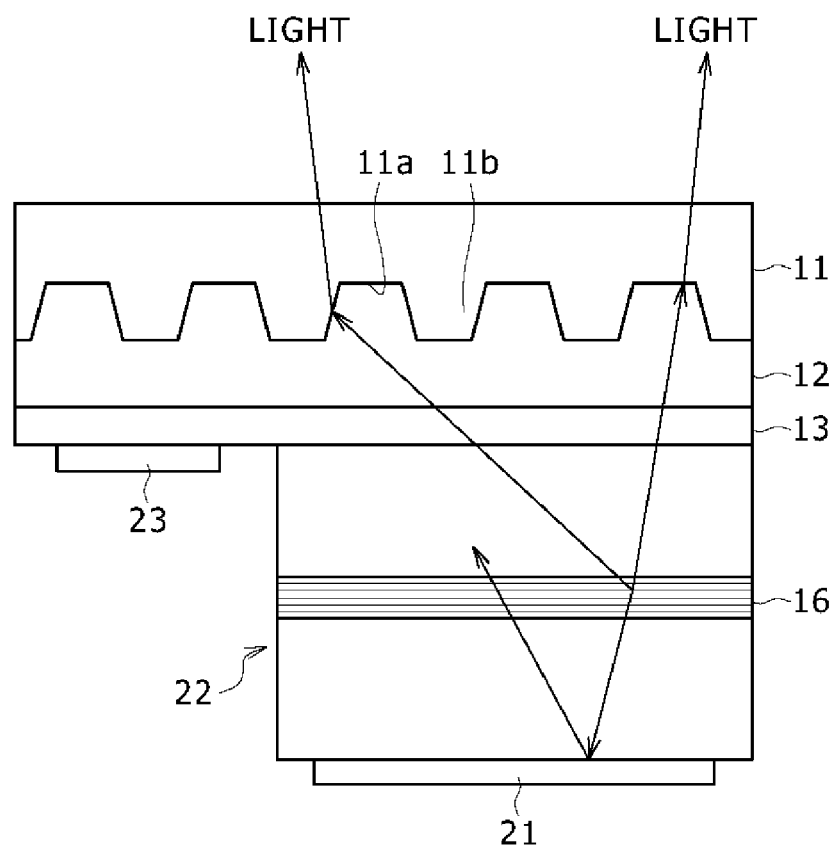
FIG. 3 is a schematic view showing how to extract light from a GaN light-emitting diode obtained by the first embodiment of the present invention.

In the resulting GaN light-emitting diode, as shown in FIG. 3, light emission is performed by application a forward voltage between the p-side electrode 21 and the n-side electrode 23 to pass an electric current therebetween, and light is taken through the sapphire substrate 11 to outside. In FIG. 3, light is depicted as being taken out toward above, so that the sapphire substrate 11 is laid uppermost. Proper selection of an In composition of the active layer 16 ensures emission of red to ultraviolet light, particularly, blue light, green light or red light. In this connection, a component of light generated from the active layer 16, which is directed toward the sapphire substrate 11, is refracted at an interface between the sapphire substrate 11 and the GaN layer 12 in the recessed portion 11a, after which it is discharged to outside through the sapphire substrate 11. On the other hand a component of the light generated from the active layer 16, which is directed toward the p-side electrode 21, is reflected at the p-side electrode 21 and is directed toward the sapphire substrate 11 and discharged to outside through the sapphire substrate 11. It will be noted that the light shown in FIG. 3 is one in the case where the refractive index of the GaN semiconductor layer constituting the light-emitting diode is taken as 2.438 that is a refractive index of GaN, the refractive index of the sapphire substrate 11 is taken as 1.785, and the refractive index of air is taken as 1.

Figure 4:
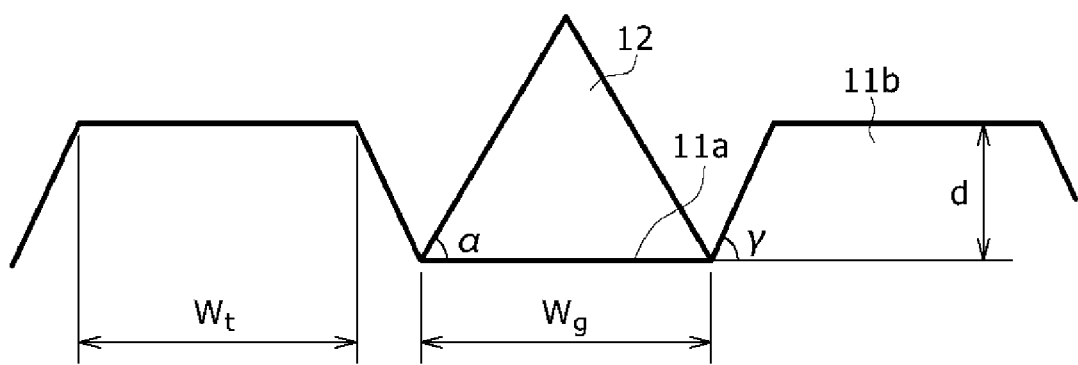
FIG. 4 is a schematic view showing a sapphire substrate used in the method for making a GaN light-emitting diode according to the first embodiment of the present invention.

In this first embodiment, in order to minimize a threading dislocation density of the GaN layer 12, a width $W_g$ of the recessed portion 11a, a depth d and an angle α made between the inclined face of the GaN layer 12 in the state shown in FIG. 1B and the main surface of the sapphire substrate 11 are so determined to satisfy the following inequality (see FIG. 4)

$$2d \geq W_g \tan \alpha$$

For example, when $W_g=2.1$ μm and $\alpha=59$ degrees, $d \geq 1.75$ μm. Likewise, $d \geq 1.66$ μm for the case where $W_g=2$ μm and $\alpha=59$ degrees, $d \geq 1.245$ μm for the case where $W_g=1.5$ μm and $\alpha=59$ degrees, and $d \geq 0.966$ μm for the case where $W_g=1.2$ μm and $\alpha=59$ degrees. In either case, it is preferred that $d<5$ μm.

At the stage of growing the GaN layer 12 in the steps shown in FIGS. 1B and 1C, a ratio between the starting materials V/III for the growth is set at a relatively high level, e.g. within a range of 13000±2000 and the growing temperature is set at a relatively low level, e.g. within a range of 1050±50° C. This ensures the growth of the GaN layer 12 so as to fully bury the recessed portion 11a therewith while permitting a facet inclined relative to the main surface of the substrate 11 to appear at the inclined surface as shown in FIGS. 1B and 1C. In this condition, little GaN layer 12 is grown over the protruded portions 11b. The growth of the GaN layer 12 is carried out at an atmospheric pressure, for example, of 1.0 to 2.0, preferably at about 1.6 atmospheric pressures. This permits lateral growth to be suppressed and easy selective growth of the GaN layer 12 to occur at the recessed portion 11a. The growing rate generally ranges from 1.0 to 5.0 μm/hour and is preferably at about 3.0 μm/hour. The flow rates of the starting gases are, for example, at 20 SCCM for TMG and 20 SLM for $NH_3$. On the other hand, the growth (lateral growth) of the GaN layer 12 in the steps shown in FIGS. 1D and 1E is carried out in such a way that a ratio between the starting materials V/III is set at a relatively low level, e.g. within a range of 5000±2000 and a growing temperature is set at a relatively high level, e.g. within a range of 1150±50° C. If the growing temperature is higher than the above range, the resulting GaN layer 12 is liable to be roughened on the surface thereof. On the other hand, if the temperature is lower, pits are apt to occur at a mutually associated portion of the GaN layers 12. The flow rates of the starting gases are, for example, at 40 SCCM for TMG and 20 SLM for $NH_3$. In this way, the GaN layer 12 is laterally grown as shown in FIGS. 1D and 1E to obtain a flat surface. No space or void occurs between the GaN layer 12 and the sapphire substrate 11.

Figure 5:
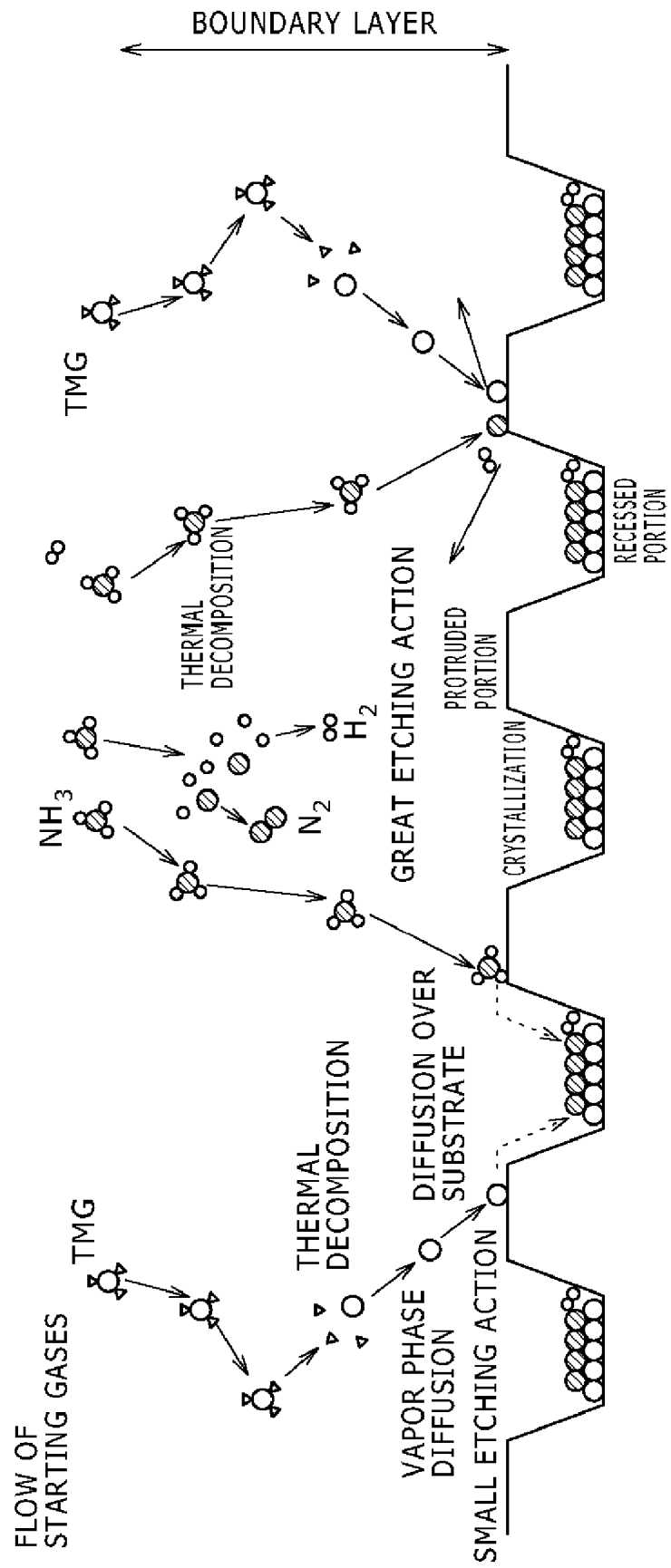
FIG. 5 is a schematic view illustrating how a GaN layer is grown on the sapphire substrate in the method for making a GaN light-emitting diode according to the first embodiment of the present invention.

FIG. 5 schematically shows how starting gases run at the time of growth of the GaN layer 12 and diffuse over the sapphire substrate 11. The most importance in this growth is that no GaN layer 12 grows, at an initial stage of growth, at the protruded portion 11b (terrace portion) of the sapphire substrate 11, but the GaN layer 12 starts to grow at the recessed portion 11a. The reason for this is considered as follows. In general, when TMG is used as a starting material for Ga and $NH_3$ is used as a starting material for N, the growth of GaN occurs by direct reaction between $NH_3$ and Ga as expressed according to the following reaction formulas

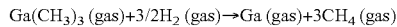

$Ga(CH_3)_3 \text{ (gas)} + 3/2 H_2 \text{ (gas)} \rightarrow Ga \text{ (gas)} + 3 CH_4 \text{ (gas)}$

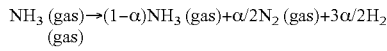

$NH_3 \text{ (gas)} \rightarrow (1-\alpha) NH_3 \text{ (gas)} + \alpha/2 N_2 \text{ (gas)} + 3\alpha/2 H_2 \text{ (gas)}$

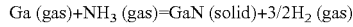

$Ga \text{ (gas)} + NH_3 \text{ (gas)} = GaN \text{ (solid)} + 3/2 H_2 \text{ (gas)}$ During the reactions, $H_2$ gas generates. This $H_2$ gas has a reverse action to the crystal growth, i.e. an etching action. In the steps shown in FIGS. 1B and 1C, using conditions which are not performed for the growth of GaN on an employed flat substrate in related art, i.e. the conditions (of increasing a V/III value) where an etching action is enhanced and the growth is unlikely to occur, growth at the protruded portion 11b is suppressed. In this connection, this etching action is lessened inside the recessed portion 11a and thus, crystal growth takes place. In order to improve the surface flatness of growing crystals, it used to grow the crystals under conditions of increasing the degree of later growth (or at higher temperatures) in related art. In accordance with the first embodiment, for the purposed of reducing threading dislocations in number by bending them in a direction parallel to the main surface of the sapphire substrate 11 and also burying the recessed portion 11a with the GaN layer 12 at an earlier stage, growth at temperatures lower than ones in related art as stated hereinabove (e.g. 1050±50° C.) is effected.

Figure 6:
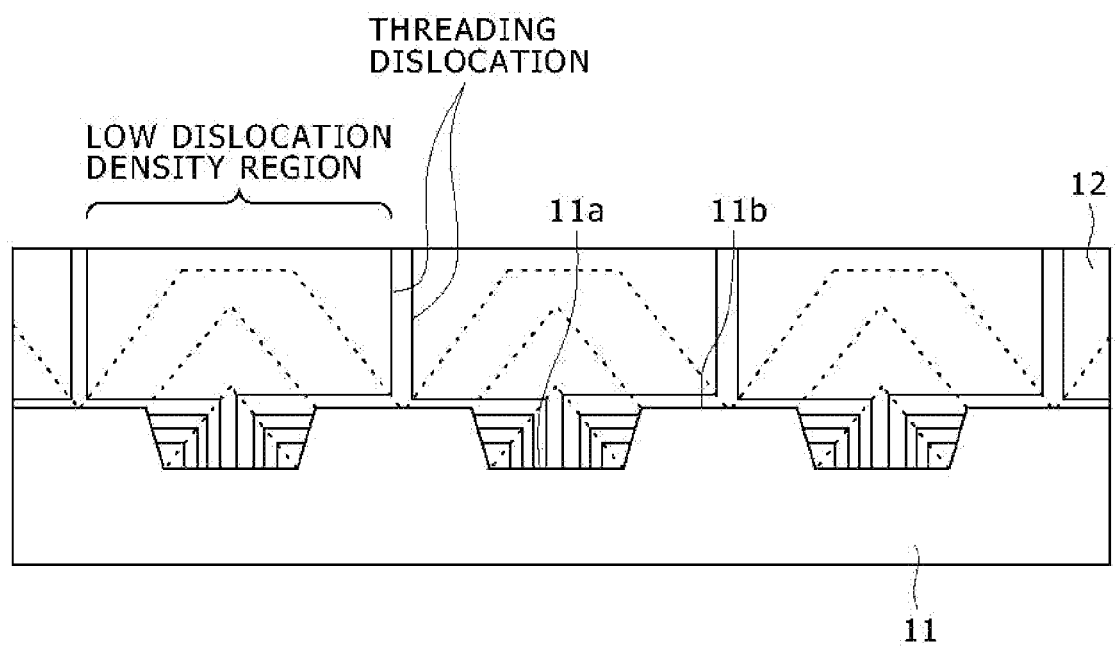
FIG. 6 is a schematic view showing a distribution of crystal defects in the GaN grown on the sapphire substrate in the method for making a GaN light-emitting diode according to the first embodiment of the present invention.
Figure 7:
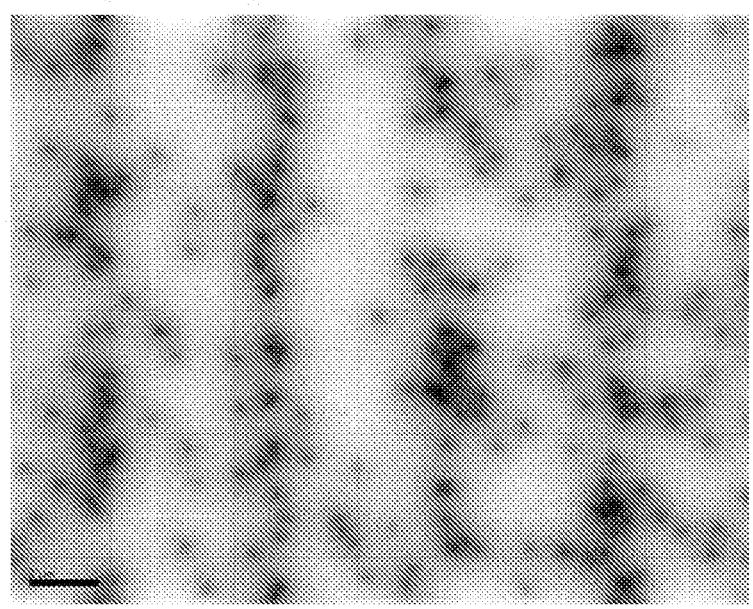
FIG. 7 is a photograph showing a planar cathode luminescence image of the GaN layer grown on the sapphire substrate in the method for making a GaN light-emitting diode according to the first embodiment of the present invention.

FIG. 6 schematically shows the results of a crystal defect distribution of a GaN layer 12 determined by a transmission electron microscope (TEM). FIG. 7 shows a planar cathode luminescence (CL) image of the surface of the GaN layer 12. As will be seen from FIG. 6, although a dislocation density becomes high at a mutually associated portion of the GaN layers 12 growing from adjacent recessed portions 11a, the dislocation density becomes low at the other portions including a portion above the recessed portion 11a. For instance, with the case where the recessed portion has a depth $d=1$ μm and a width $W_g=2$ μm at the bottom surface and the protruded portion 11b has a width $W_t=2$ μm at the upper surface thereof, the dislocation density is $1 \times 10^7/cm^2$ at this portion of low dislocation density. Thus the dislocation density is reduced by one or two magnitudes of order over a case using a sapphire substrate 11 not subjected to surface indentation. It will be also seen that no dislocation occurs in a direction vertical to the side walls of the recessed portion 11a. The planar cathode luminescence image shown in FIG. 7 well coincides with the results of FIG. 6.

In FIG. 6, the average thickness of a region where the dislocation density of the GaN layer 12 in contact with the sapphire substrate 11 at the recessed portion 11a is high with poor crystallinity is about 1.5 times an average thickness of a region, with poor crystallinity, of a high dislocation density of the GaN layer 12 in contact with the sapphire substrate 11 at the protruded portion 11b. This result reflects the lateral growth of the GaN layer 12 on the protruded portion 11b.

FIGS. 8A and 8B schematically show the behavior of dislocations in the course of growth of the GaN layer 12, which as been found in view of the results of TEM analyses. FIG. 8A is a sectional view and FIG. 8B is a plan view corresponding to the section shown in FIG. 8A. Broadly, dislocations can be classified into two types.

The first type of dislocation (type-(a+c) dislocation) is illustrated below. In FIGS. 8A and 8B, dislocation (1) occurs from an interface with the bottom of the recessed portion 11a and bends in a horizontal direction (i.e. in a direction parallel to the main surface of the sapphire substrate 11) at a facet (a) of the inclined side of an isosceles triangle using the bottom as a base. Dislocation (1) continually extends to the side wall of the recessed portion 11a where it disappears. Dislocation (2) occurs from an interface with the bottom of the recessed portion 11a, bends in a horizontal direction at the facet (a) and extends to the vicinity of a center of the protruded portion 11b. Then dislocation (2) bends toward above (in a direction vertical to the main surface of the sapphire substrate 11) at a facet (c) on association at the center of the protruded portion 11b, and rises in a vertical direction at the associated portion, thereby resulting in a threading dislocation at the center of the protruded portion 11b. This type-(a+c) threading dislocation is one that has a Burger's vector of ⅓ <11-23> and is concentrated at the center of the protruded portion 11a.

The second type of dislocation (type-a dislocation) is as follows. In FIGS. 8A and 8B, dislocation (3) occurs from an interface with the bottom of the recessed portion 11a, bends in a horizontal direction in the vicinity of a facet (d), continually extends to the side wall of the recessed portion 11a and finally disappears. It should be noted that bending in the horizontal direction does not necessarily occur at the facet (d). Like the mechanism of the dislocation (3), dislocation (4) bends in a horizontal direction, extends to the vicinity of the center of the protruded portion 11b and rises in a vertical direction at the associated portion of the center of the protruded portion 11b, resulting in a threading dislocation at the center of the protruded portion 11b. The difference from the dislocation (2) resides in the extension in the horizontal direction. Like the mechanism of the dislocation (3), location (5) bends in a horizontal direction and extends to the vicinity of the center of the protruded portion 11b, whereupon it incidentally extends vertically. This dislocation (5) causes a threading dislocation at the center of the protruded portion 11b. The threading dislocation of this type-a is one that has a Berger's vector of ⅓ <11-20>.

Aside form the type-(a+c) dislocation and type-a dislocation, dislocations freshly threading at the surface of the GaN layer 12 (both type-(a+c) dislocation and type-a dislocation) were observed at the associated portion of the center of the protruded portion 11b.

Next, the results of estimation of a dislocation density in the GaN layer 12 are illustrated. As shown in FIG. 9, an angle made between the side wall of the recessed portion 11a and the main surface of the sapphire substrate 11 is taken as γ and an angle made between an interface of growth on the protruded portion 11b and the main surface of the sapphire substrate 11 is taken as β, a rate of high density defect regions in the GaN layer 12 is expressed as follows:

$$R = \cot\beta((W_g/2)\tan\alpha - d)/((½)(W_t + W_g + d\cot\gamma))$$

In this case, the dislocation density is estimated as $W_{initial} \times (R+U(1-R))$ wherein U represents a frequency of type-a dislocation (c-dislocation) being elevated to the surface of the GaN layer 12 and is empirically at about ⅒ to ¹⁄₁₀₀. For instance, when α and β are up to 59 degrees, γ is up to 67 degrees, $W_g$ is up to 2.1 μm, $W_t$ is up to 2 μm, and d is up to 1 μm, R is up to 0.195 whereupon $W_{initial}$ is up to $3\times10^8/cm^2$. When U is up to ⅟₅₀, a dislocation density is up to $6.3\times10^7/cm^2$.

Figure 10A:
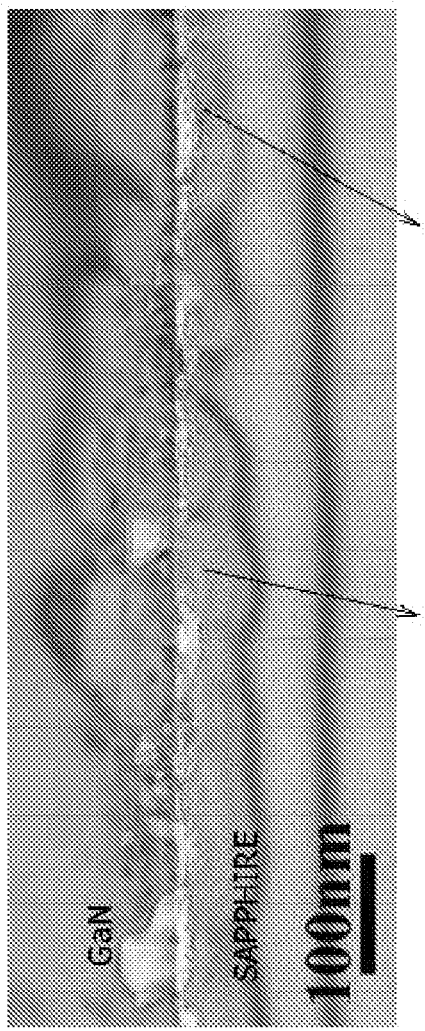
FIGS. 10A and 10B are, respectively, a micrograph showing the results of sectional TEM observation of an interface with the GaN layer grown on the sapphire substrate in the method for making a GaN light-emitting diode according to the first embodiment of the present invention.
Figure 10B:
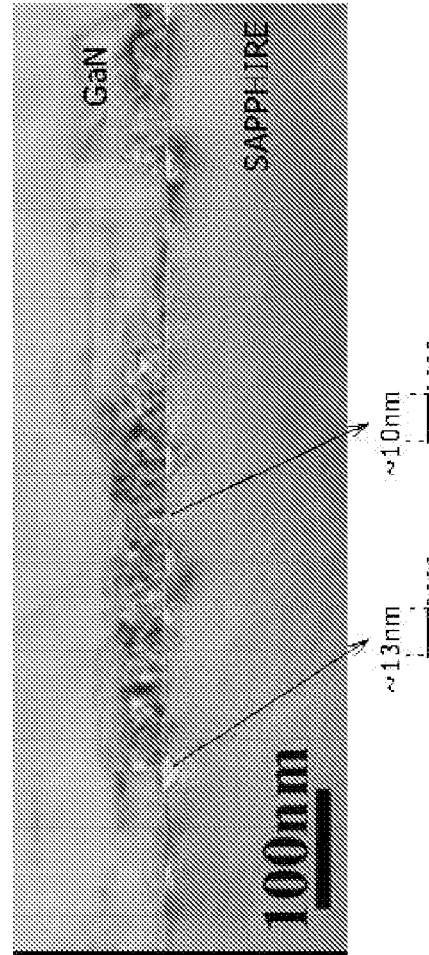
Figure 11:
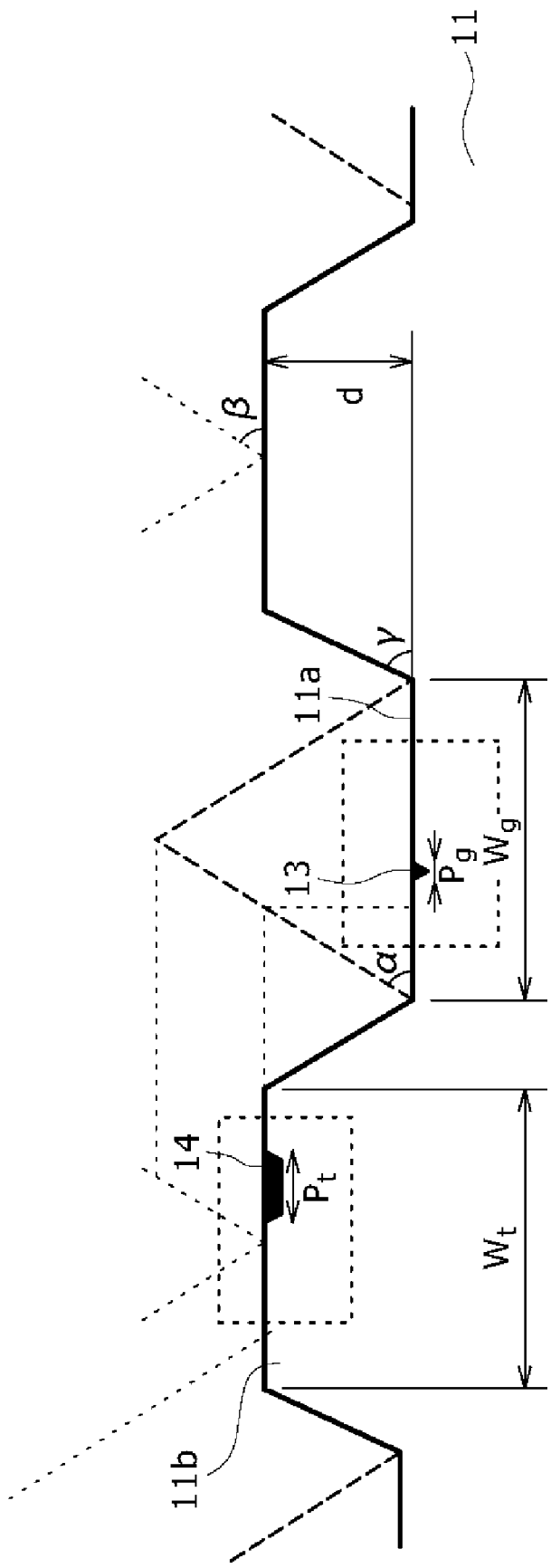
FIG. 11 is a schematic view illustrating formation of a pit upon growth of the GaN layer on the sapphire substrate in the method for making a GaN light-emitting diode according to the first embodiment of the present invention.

In FIGS. 10A and 10B, there is shown a sectional TEM photograph of the vicinity of an interface between the sapphire substrate 11 and the GaN layer 12. FIG. 11 shows a sectional view of the vicinity. FIG. 10A corresponds to a region surrounded by the dotted line at the protruded portion 11b indicated in FIG. 11, and FIG. 10B corresponds to a region surrounded by the dotted line at the recessed portion 11a indicated in FIG. 11. As shown in FIGS. 10A and 10B, the shapes of pits observed at the side of the sapphire substrate 11 at the interface between the sapphire substrate 11 and the GaN layer 12 differ between the recessed portion 11a and the protruded portion 11b. As is particularly shown in FIG. 11, when a width of a pit 13 formed at the recessed portion 11a is taken as $P_g$ and a width of a pit 14 formed at the protruded portion 11b is taken as $P_t$, $P_t > P_g$, typically $P_t > 1.2P_g$, The reason why the width $P_t$ of the pit 14 formed at the protruded portion 11b becomes greater than the width $P_g$ of the pit 13 formed at the recessed portion 11a is that the GaN layer 12 does not grow at the initial stage of growth at the protruded portion 11b, so that the protruded portion 11b is exposed to $NH_3$ gas having the etching action over a long time. In the methods in related art, this would not occur.

Figure 12C:
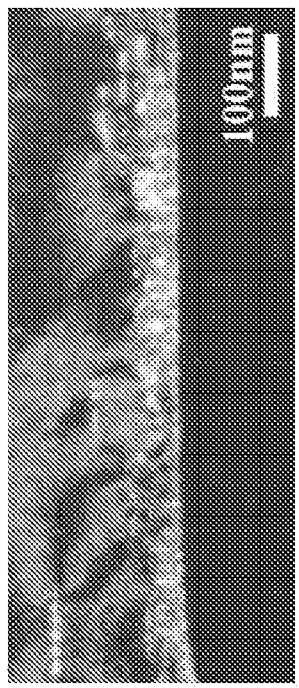
FIGS. 12A to 12C are, respectively, a micrograph showing the results of sectional TEM observation of an interface with the GaN layer grown on the sapphire substrate in the method for making a GaN light-emitting diode according to the first embodiment of the present invention.
Figure 12B:
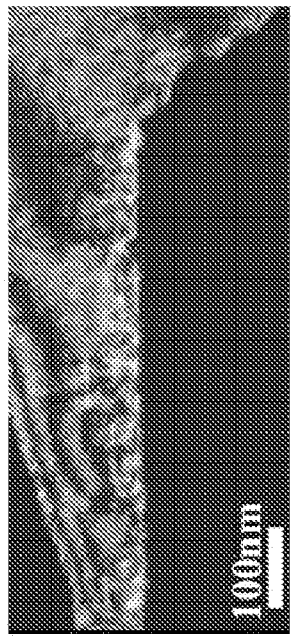
Figure 12A:
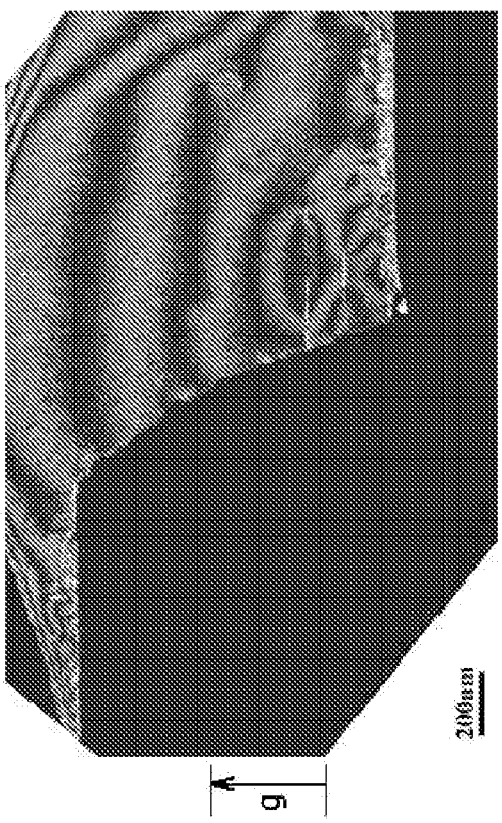
Figure 13A:
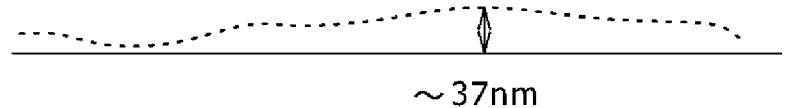
FIGS. 13A and 13B are a schematic view illustrating a distribution in thickness of the GaN layer shown in FIGS. 12B and 12C, respectively.
Figure 13B:
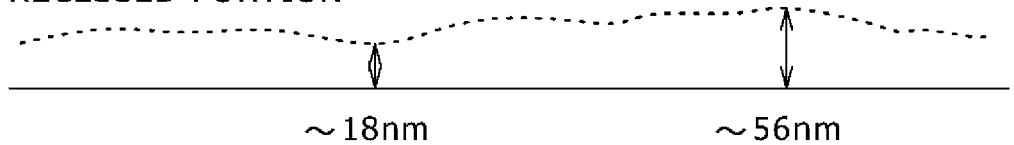

FIG. 12A shows a sectional TEM photograph (dark field image) of the vicinity of the recessed portion 11a and the protruded portion 11b of the sapphire substrate 11, FIG. 12B is a sectional TEM photograph enlarging the vicinity of the upper surface of the protruded portion 11b shown in FIG. 12A, and FIG. 12C is a view enlarging the vicinity of the bottom surface of the recessed portion 11a shown in FIG. 12B, in which a black portion in each figure indicates the sapphire substrate 11. FIG. 13A schematically shows a section of the vicinity of the upper surface of the protruded portion 11b shown in FIG. 12B, and the thickness of a region of the GaN layer 12 wherein crystallinity over the protruded portion 11b is poor is up to 37 nm. FIG. 13B is schematically shows a section of the vicinity of the bottom surface of the recessed portion 11a shown in FIG. 12C, and the thickness of a region of the GaN layer 12 wherein crystallinity over the recessed portion 11a is poor ranges from up to 18 nm to up to 56 nm. As will be seen from the above, the thicknesses of the crystallinity-poor regions of the GaN layer 12 over the recessed portion 11a and the protruded portion 11b differ from each other. This is because the GaN layer 12 is laterally grown over the protruded portion 11b. In the methods in related art, no significant difference appears.

Figure 14:
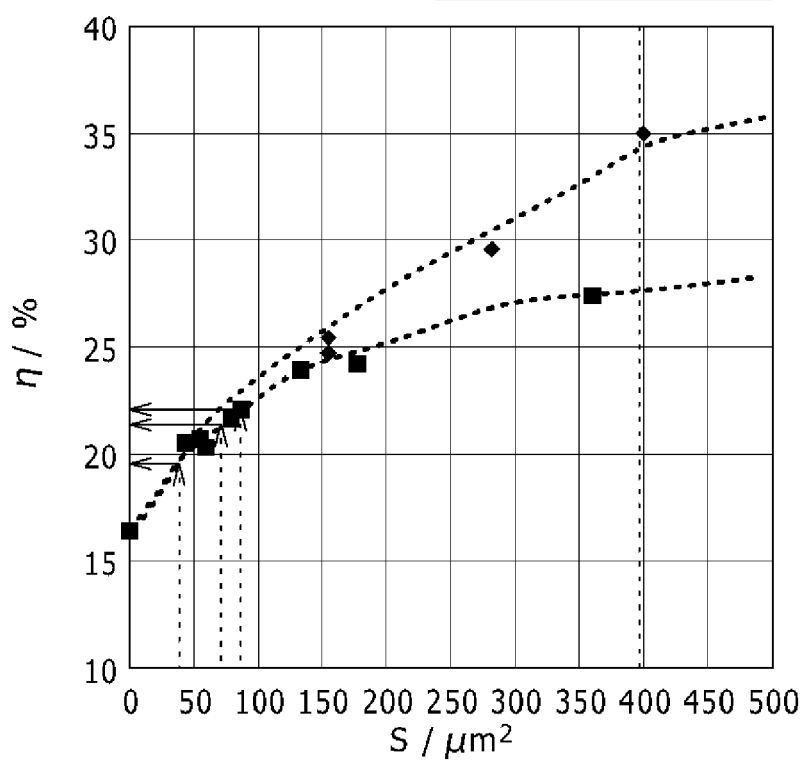
FIG. 14 is a schematic view showing the results of lay tracing simulation of the GaN light-emitting diode made according to the first embodiment of the present invention.

In FIG. 14, one instance of the results (data indicated by ■) obtained by carrying out simulation (lay tracing simulation) of light extraction from this GaN light-emitting diode (green emission light-emitting diode) to outside is shown. In FIG. 14, the abscissa indicates an area S of an inclined surface at the side wall of the recessed portion 11a in case where a size range of 20 μm×20 μm is assumed on the sapphire substrate 11 and also a ratio of the area S relative to 400 μm² (area ratio of an inclined surface), and the ordinate indicates a light extraction efficiency η. As will be seen from FIG. 14, in order to improve the light extraction efficiency η, the area S of the inclined surface is increased to an extent as large as possible. In FIG. 14, there are shown the results of similar simulation in case where the recessed portions 11a are formed on the sapphire substrate 11 in three directions (e.g. three <1-100> directions that are crystallographically equivalent to one another) at intervals of 60 degrees. In this case, the planar shape of the protruded portion 11a is in a triangular form. The results reveal that the light extraction efficiency η is higher in the case where the recessed portions 11a are formed in the three directions at intervals of 60 degrees than in the case where the recessed portions 11a are formed as extending in one direction in a striped form.

Figure 15:
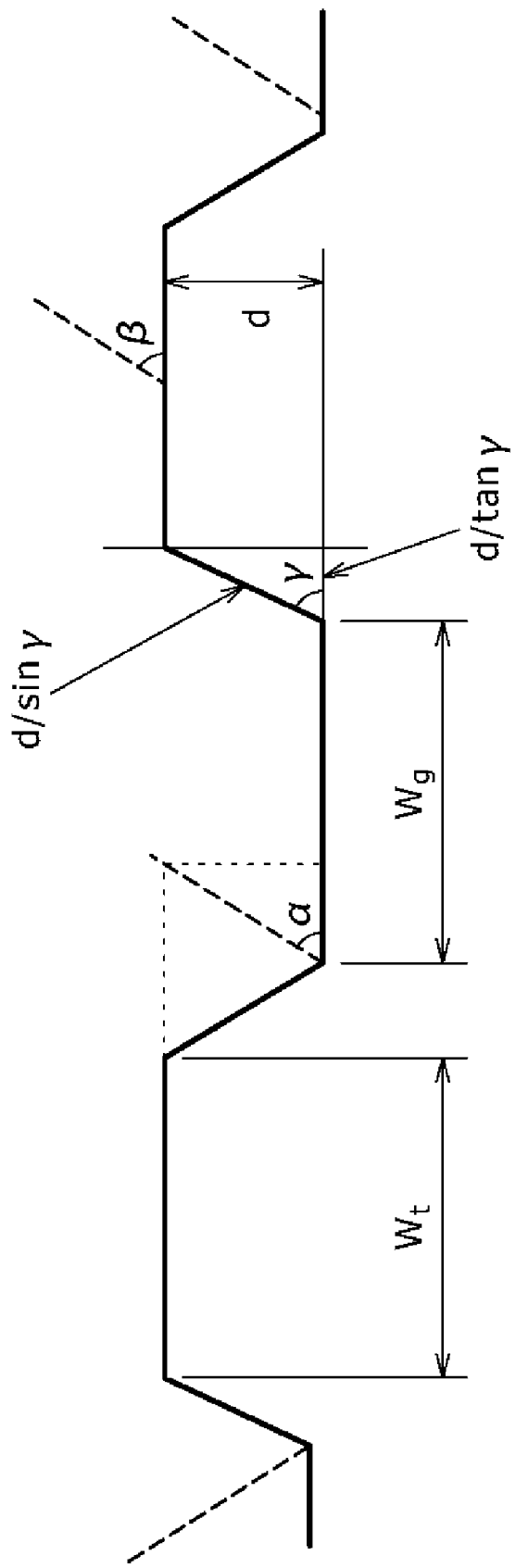
FIG. 15 is a schematic view illustrating optimization conditions for improving a light extraction efficiency of the GaN light-emitting diode made according to the first embodiment of the present invention.

With reference to FIG. 15, consideration is again given to maximization of the area S of the inclined surface so as to increase the light extraction efficiency η. Assuming a portion of unit length along a direction of the extension of the recessed portion 11a in FIG. 15, an occupied area of the recessed portion 11a and the protruded portion 11b of one cycle on the sapphire substrate 11 is expressed by $(W_t+W_g)+d/\tan\gamma$, and an area of the inclined surface of the side wall expressed by $d/\sin\gamma$. Accordingly, in order to increase the light extraction efficiency η, it is effective to maximize the ratio of the inclined surface area, $(d/\sin\gamma)/((W_t+W_g)+d/\tan\gamma)$.

Figure 16:
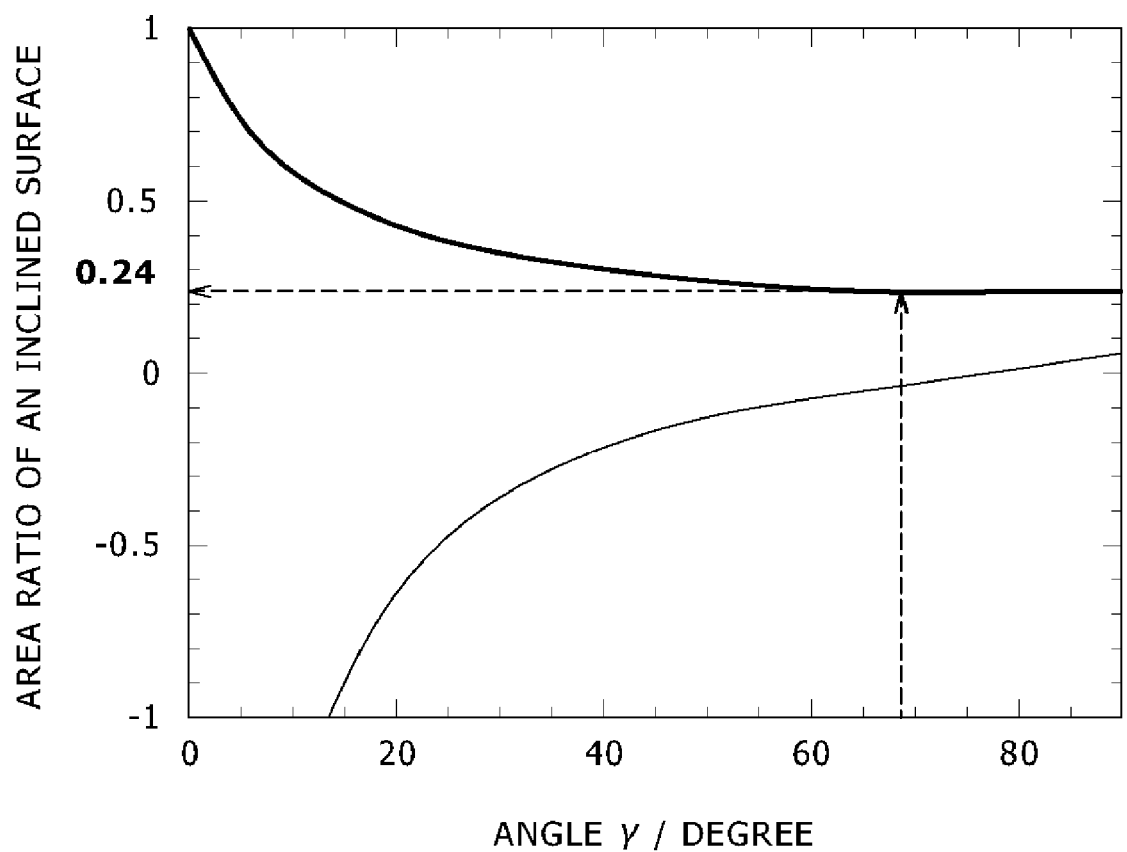
FIG. 16 is a graph showing the results of simulation of an area ratio of inclined surface of the sapphire substrate employed in the GaN light-emitting diode according to the first embodiment of the present invention.

FIG. 16 shows a variation in the ratio of the inclined surface area (data indicated by thick solid line) when an angle γ made between the side wall of the recessed portion 11a and the main surface of the sapphire substrate 11 is changed provided that d=1 μm and $W_t+W_g=4$ μm. In FIG. 16, the data indicated by a thin solid line indicates a differential value of the ratio of the inclined surface area. From FIG. 16, the ratio of the inclined surface area is at 0.24 when γ=69 degrees.

Figure 17:
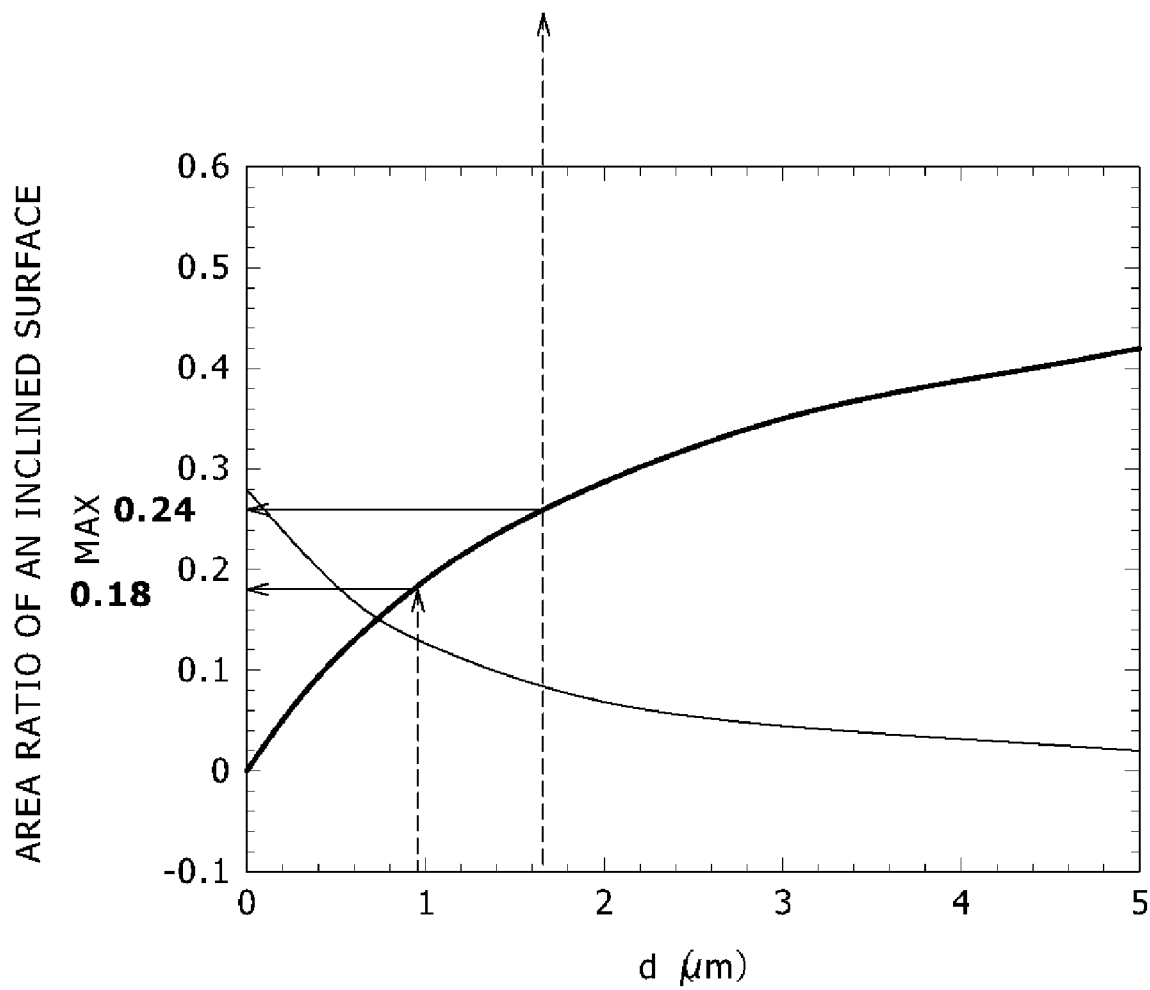
FIG. 17 is a graph showing the results of simulation of an area ratio of inclined surface of the sapphire substrate employed in the method for making a GaN light-emitting diode according to the first embodiment of the present invention.

FIG. 17 shows a variation in the ratio of the inclined surface area (data indicated by thick solid line) when the depth d of the recessed portion 11a provided that γ=67 degrees and $W_t+W_g=4$ μm. In FIG. 17, the data indicated by thin solid line indicates a differential value of the ratio of the inclined surface area. From FIG. 17, the ratio of the inclined surface area is at 0.24 under favorable conditions where the dislocation density in the GaN layer 12 becomes low (e.g. d=1.66 μm, α=59 degrees and $W_g=2$ μm). In contrast, with d=1 μm, for example, the ratio of the inclined surface area is at 0.18.

Figure 18:
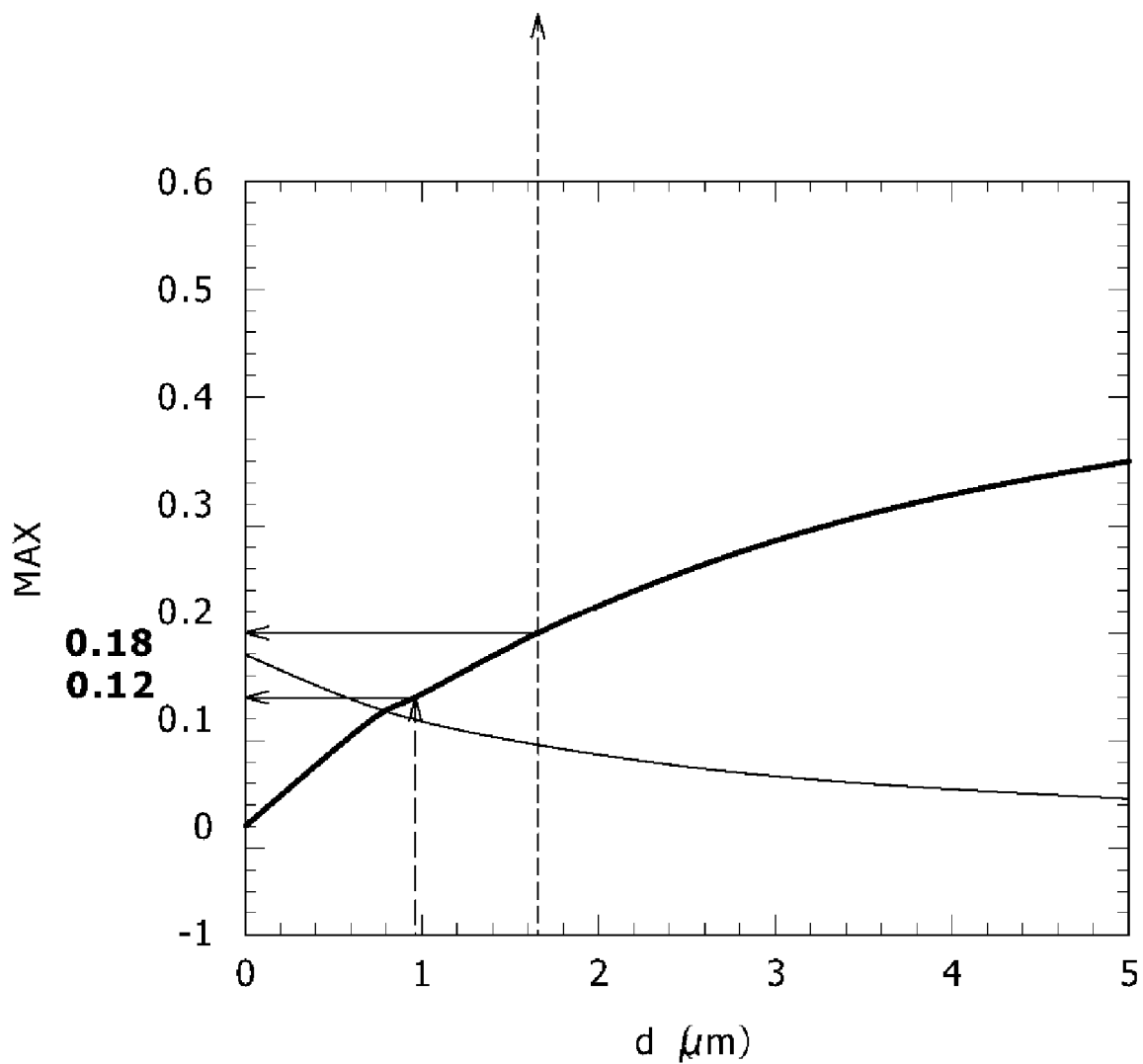
FIG. 18 is a graph showing the results of simulation of an area ratio of an inclined surface of the sapphire substrate employed in the method for making a GaN light-emitting diode according to the first embodiment of the present invention.

FIG. 18 shows a variation in the ratio of the inclined surface area (data indicated by thick solid line) when the depth d of the recessed portion 11a provided that γ=67 degrees and $W_t+W_g=7$ μm. In FIG. 18, the data indicated by thin solid line indicates a differential value of the ratio of the inclined surface area. From FIG. 18, the ratio of inclined surface area is at 0.18 under favorable conditions where the dislocation density in the GaN layer 12 becomes low (e.g. d=1.66 μm, α=59 degrees and $W_g=2$ μm). In contrast, with d=1 μm, for example, the ratio of inclined surface area is at 0.12.

Figure 19:
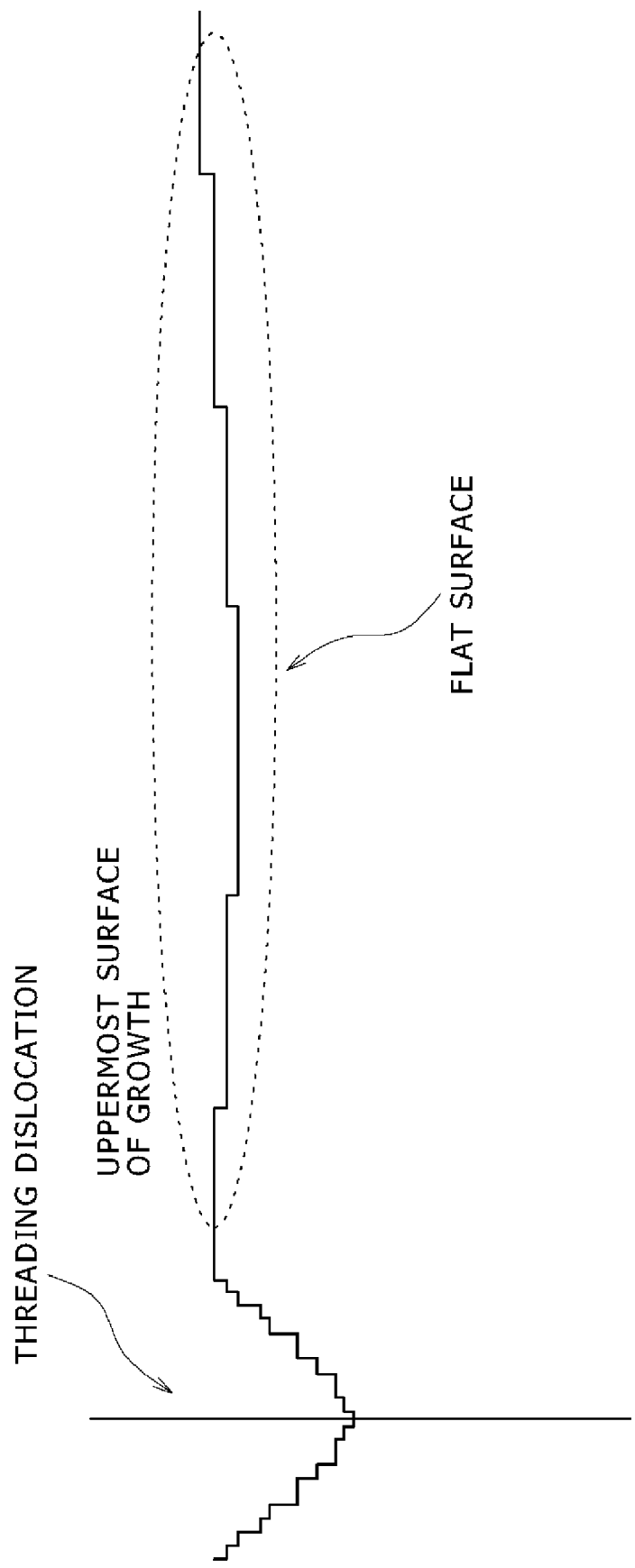
FIG. 19 is a schematic view illustrating surface flatness of an active layer of the GaN light-emitting diode made according to the first embodiment of the present invention.

Next, consideration is given to the state of growth surface in the vicinity of the active layer 16. In general, when a threading defect exists in a grown layer, a growth pit occurs, thereby causing the flatness of the grown surface to deteriorate as shown in FIG. 19. A higher threading dislocation density results in an increased degree of deterioration. If a threading dislocation exists in the active layer 16, fluctuations of thickness and composition within the plane takes place, thereby causing inplane inhomogeneity of an emission wavelength and planar crystal defects such as antiphase boundary defects to occur and thus resulting in a lowering of emission efficiency (i.e. a lowering of inner quantum efficiency). On the other hand, according to the first embodiment of the present invention, the threading dislocation density in the GaN layer 12 is so significantly reduced as stated hereinbefore, and thus, the threading dislocation density in the active layer 16 grown thereon is likewise low. Hence, the lowering of emission efficiency ascribed to the threading dislocation is very small, thereby obtaining an emission efficiency higher than in related art.

The threading dislocations in the GaN layer 12 are concentrated in the vicinity of the center of the protruded portion 11b of the sapphire substrate 11 and are regularly arrayed according to the array of the protruded portions 11b. Accordingly, the threading dislocations in the active layer 16 are regularly arrayed reflectedly. In this way, an area of portions of the active layer 16 where a flat surface is formed remarkably increases, compared to the case where the threading dislocation is arranged randomly, thereby leading to an improved emission efficiency.

Furthermore, where an In component is high in the active layer 16, for example, and where a grown surface is roughened, a crystal defect where a planar crystal defect such as an antiphase boundary defect and a dislocation are combined is liable to freshly occur, thereby inviting a lowering of emission efficiency. In contrast, according to the first embodiment, the surface flatness of the active layer is remarkably improved as set out hereinabove, and such crystal defects are suppressed from occurrence and no lowering of emission efficiency takes place.

In order to improve the flatness of the grown surface of the active layer 16 and reduce planar crystal defects in number, it is effective that a barrier layer of the active layer 16 is formed of AlGaN.

As stated hereinabove, according to the first embodiment, since no space is formed between the sapphire substrate 11 and the GaN layer 12, a lowering of a light extraction efficiency due to the space can be prevented. The threading dislocation in the GaN layer 12 is concentrated in the vicinity of the center of the protruded portion 11b of the sapphire substrate 11 and a dislocation density in the other portions is as small as about $10^7/cm^2$ and is thus significantly reduced over a case in related art using a substrate subjected to patterned indentation. As a consequence, the crystallinity of the GaN semiconductor layer such as the GaN layer 12 and the active layer 16 grown thereon is significantly improved, thereby significantly reducing the non-emission centers in number. In this way, a GaN light-emitting diode having a very high emission efficiency can be obtained. Additionally, one cycle of epitaxial growth is sufficient to manufacture the GaN light-emitting diode and no growth mask is necessary, so that the manufacturing procedure is simple and the GaN light emitting diode can be made at low costs.

Next, a second embodiment of the present invention is described.

Figure 21A:
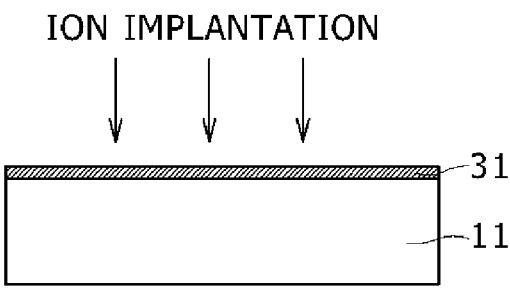
FIGS. 21A to 21E are, respectively, a sectional view illustrating a method for making a GaN light-emitting diode according to a second embodiment of the present invention.

In the second embodiment, as shown in FIG. 21A, ion implantation is subjected to a flat sapphire substrate 11 over the entire surface thereof to amorphousize a surface layer of the sapphire substrate 11, thereby forming an amorphous layer 31. The atom, energy and dosage used for the ion implantation are so selected as to be sufficient for amorphousization of the sapphire substrate 11. The atom used for the ion implantation includes, for example, an inactive atom such as He, Ne, Ar, Kr, Xe or the like, and Si, H, N, Ga or the like. For instance, if Si is used as an atom for ion implantation, an energy for ion implantation ranges 10 to 30 keV and a dosage thereof is $1\times10^{18}/cm^2$ or over.

Figure 21B:
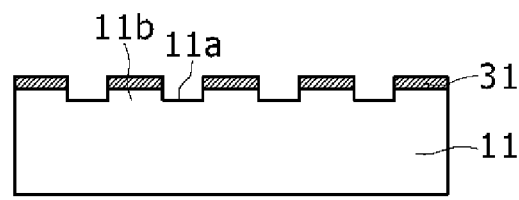

Next, as shown in FIG. 21B, the sapphire substrate 11 formed with the amorphous layer 31 is subjected to patterned indentation to form recessed portions 11a and protruded portions 11b like the first embodiment.

Figure 21C:
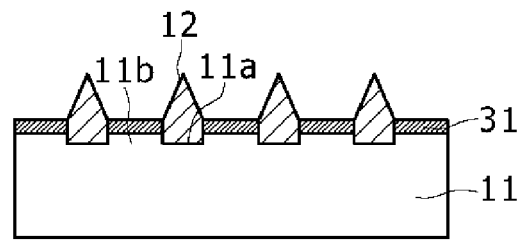
Figure 21D:
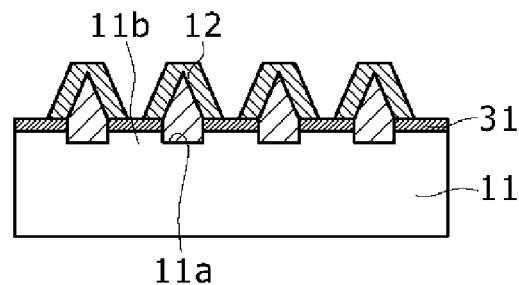
Figure 21E:
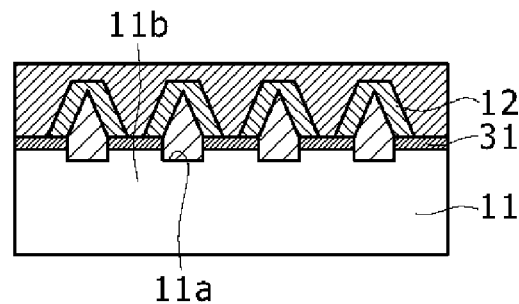

Thereafter, as shown in FIGS. 21C to 21E, a GaN layer 12 is grown on the sapphire substrate 11, like the first embodiment, in which the amorphous layer 31 has been formed on the protruded portion 11b.

Subsequently, the step of growing an n-type GaInN layer 13 and subsequent steps are advanced to provide a GaN light-emitting diode like the first embodiment.

According to the second embodiment, advantages similar to the first embodiment can be obtained.

A third embodiment of the present invention is now described.

Figure 22A:
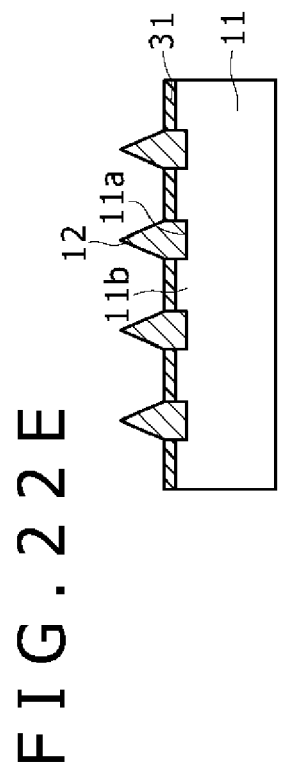
FIGS. 22A to 22G are, respectively, a sectional view illustrating a method for making a GaN light-emitting diode according to a third embodiment of the present invention.
Figure 22B:
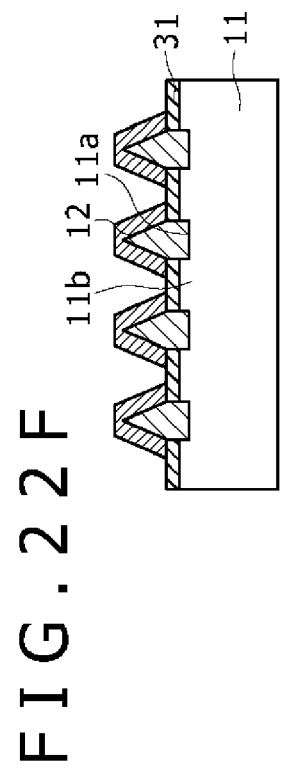

In the third embodiment, as shown in FIGS. 22A and 22B, a GaN layer 32 is epitaxially grown on a sapphire substrate 11 that has been subjected to patterned indentation like the first embodiment.

Figure 22C:
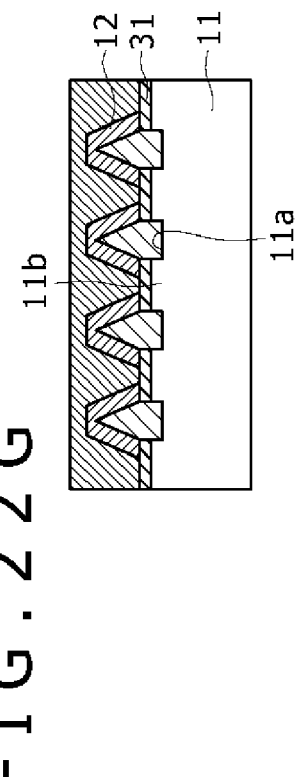

Next, as shown in FIG. 22C, the GaN layer 32 is etched back by the RIE method to thinly leave the GaN layer 32 just at the bottom of the recessed portion 11a of the sapphire substrate 11.

Figure 22D:
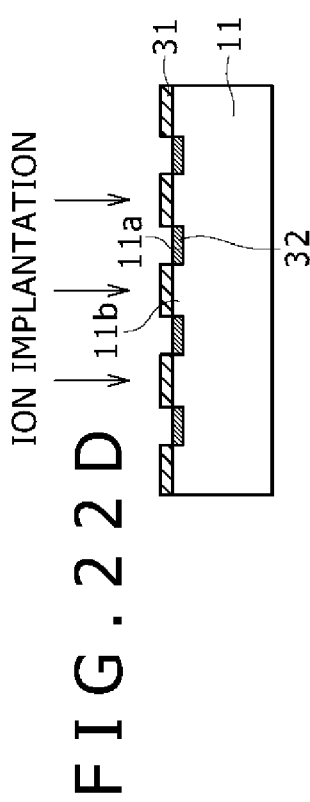

Thereafter, as shown in FIG. 22D, the sapphire substrate 11 is subjected to ion implantation wholly on the surface thereof to amorphousize a surface layer of the protruded portion 11b of the sapphire substrate 11 to form an amorphous layer 31. At the same time, the GaN layer 32 is also amorphousized. The atom, energy and dosage used for the ion implantation are so selected as to be sufficient for amorphousization of the GaN layer 32. The atom used for the ion implantation includes, for example, an inactive atom such as He, Ne, Ar, Kr, Xe or the like, and Si, H, N, Ga or the like. For instance, if Si is used as an atom for ion implantation, an energy for ion implantation ranges 10 to 30 keV and a dosage thereof is $1\times10^{18}/cm^2$ or over.

Figure 22E:
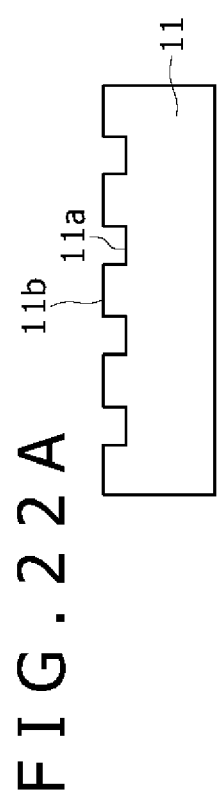
Figure 22F:
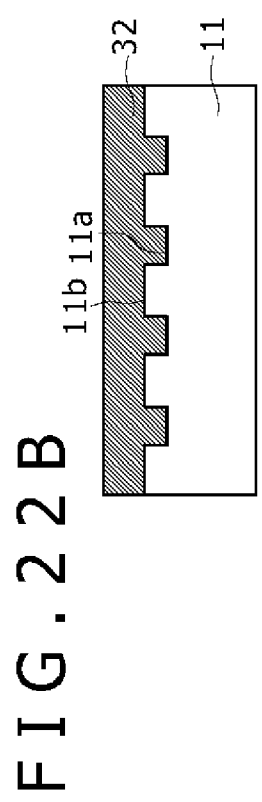
Figure 22G:
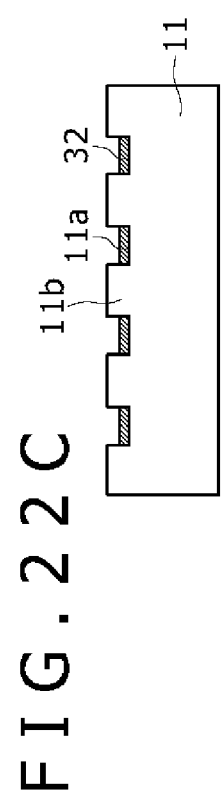

Next, as shown in FIGS. 22E to 22G, a GaN layer 12 is grown, like the first embodiment, over the sapphire substrate 11 in which the amorphous layer 31 has been formed on the protruded portion 11b and the amorphous GaN layer 32 has been formed at the bottom of the recessed portion 11a as illustrated above. It will be noted that the amorphousized GaN layer 32 is crystallized during the course of heating to a temperature of growth of the GaN layer 12.

Thereafter, the step of growing an n-type GaInN layer and subsequent steps are advanced, like the first embodiment, to provide a GaN light-emitting diode.

According to this third embodiment, advantages similar to the first embodiment are obtained.

A fourth embodiment of the present invention is described.

Figure 23A:
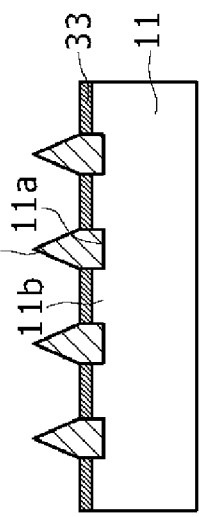
FIGS. 23A to 23F are, respectively, a sectional view illustrating a method for making a GaN light-emitting diode according to a fourth embodiment of the present invention.

In the fourth embodiment, a SiN film 33 is formed, as an amorphous layer, on a flat sapphire substrate 11 over the entire surface thereof, for example, by a vacuum deposition method, a sputtering method, a CVD method or the like in a manner as shown in FIG. 23A. This SiN film 33 has a thickness, for example, of 1 nm or over.

Figure 23B:
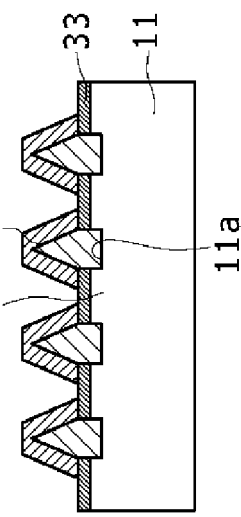

Next, as shown in FIG. 23B, the sapphire substrate 11 on which the SiN film 33 has been formed is subjected to patterned indentation, for example, by a RIE method, a powder blasting method, a sand blasting method or the like to form recessed portions 11a and protruded portions 11b as in the first embodiment.

Figure 23C:
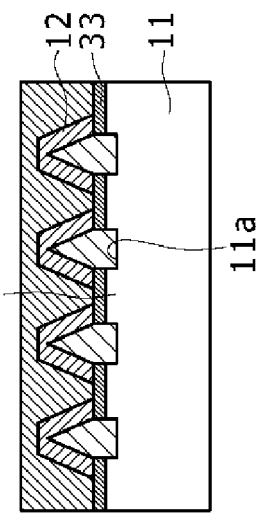

Subsequently, as shown in FIG. 23C, a GaN layer 34 is grown at a low temperature, for example, of about 550° C. The thickness of the GaN layer 34 is, for example, at 200 nm or below. The GaN layer 34 grows separately on the bottom of each recessed portion 11a of sapphire substrate 11 and also on the SiN film 33 formed on each protruded portion 11b.

Figure 23D:
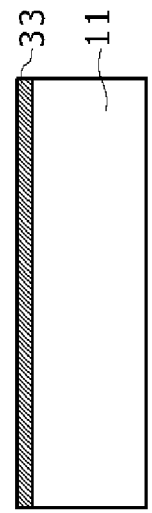
Figure 23E:
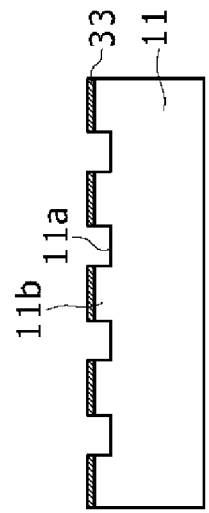
Figure 23F:
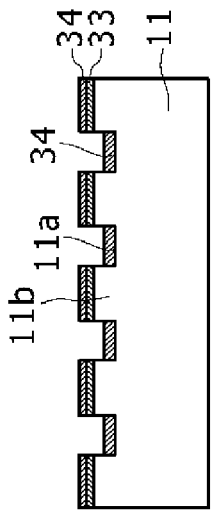

Next, as shown n FIGS. 23D to 23F, a GaN layer 12 is grown, like the first embodiment, over the sapphire substrate 11 wherein the SiN film 33 has been formed on the protruded portion 11b and the GaN layer 34 has been formed at the bottom of the recessed portion 11a. The GaN layer 34 is crystallized during the course of heating to a growth temperature of the GaN layer 12. The GaN layer 12 grows on the thus crystallized GaN layer 34. On the other hand, the GaN layer 34 on the SiN film 33 is evaporated in the course of heating to the growth temperature.

Thereafter, the step of growing an n-type GaInN layer 13 and subsequent steps are advanced, like the first embodiment, to provide a GaN light-emitting diode.

According to the fourth embodiment, advantages as in the first embodiment can be obtained.

A fifth embodiment of the present invention is described.

Figure 24A:
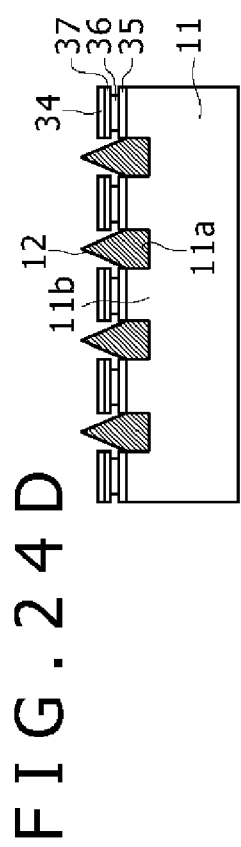
FIGS. 24A to 24G are, respectively, a sectional view illustrating a method for making a GaN light-emitting diode according to a fifth embodiment of the present invention.

In the fifth embodiment, as shown in FIG. 24A, a SiN film 35, a SiO$_2$ film 36 and a SiN film 37 are successively formed on a flat sapphire substrate 11 on the entire surface thereof, for example, by a vacuum deposition method, a sputtering method, a CVD method or the like. The thickness of the SiN films 35, 37 is, for example, at 1 nm or over, and the thickness of the SiO$_2$ film 36 is, for example, 10 nm or over.

Figure 24B:
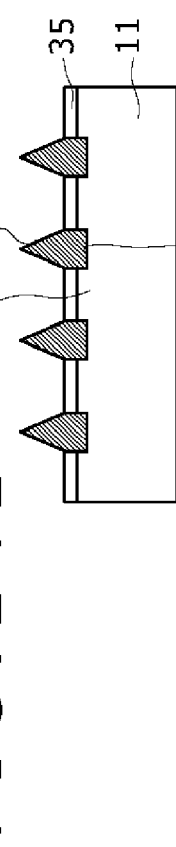

Next, as shown in FIG. 24B, the sapphire substrate 11 on which the SiN film 35, SiO$_2$ film 36 and SiN film 37 have been formed is subjected to patterned indentation, for example, by a RIE method, a powder blasting method, and a sand blasting method or the like to form recessed portions 11a and protruded portions 11b like the first embodiment.

Figure 24C:
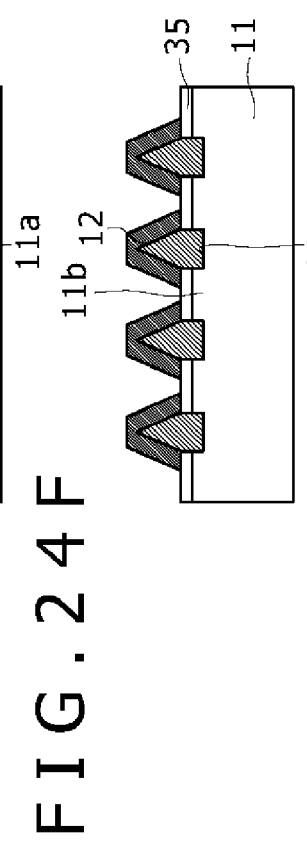

As shown in FIG. 24C, the SiO$_2$ film 36 alone is etched by wet etching, for example, with a hydrofluoric acid-based etchant, with its side face being slightly retarded along a horizontal direction.

Figure 24D:
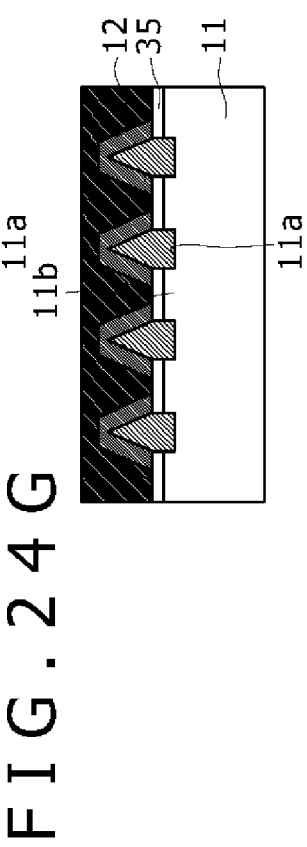

Next, as shown in FIG. 24D, a GaN layer 12 is grown like the first embodiment. Since the side walls of the SiO$_2$ film 36 are so horizontally retarded as mentioned above, the GaN layer 12 is prevented from deposition on the side walls of the SiO$_2$ film 36.

Figure 24E:
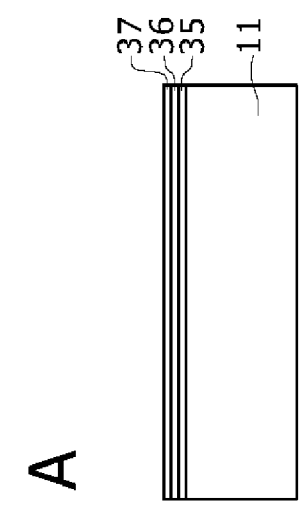

Thereafter, as shown in FIG. 24E, the SiO$_2$ film 36 is completely removed by wet etching, for example, with a hydrofluoric acid-based etchant, with the result that the SiN film 37 and the GaN layer 34 formed thereon are also removed (lift off).

Figure 24F:
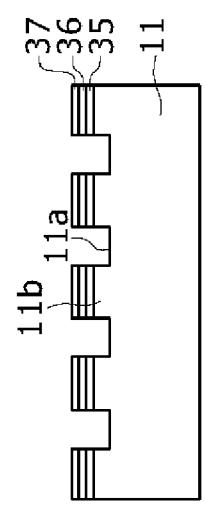
Figure 24G:
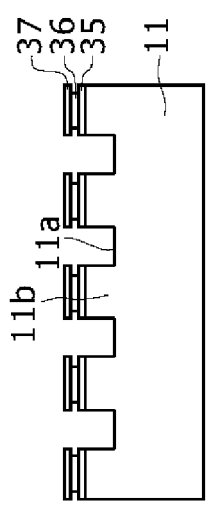

Subsequently, as shown in FIGS. 24F and 24G, a GaN layer 12 is laterally grown like the first embodiment.

Like the first embodiment, the step of growing an n-type GaInN layer 13 and subsequent steps are advanced to provide a GaN light-emitting diode.

According to the fifth embodiment, advantages as in the first embodiment can be obtained.

Next, a sixth embodiment is described.

In the sixth embodiment, as shown in FIGS. 25A to 25D, a GaN layer 12 is grown on a sapphire substrate 11 subjected to patterned indentation, like the first embodiment.

Figure 25A:
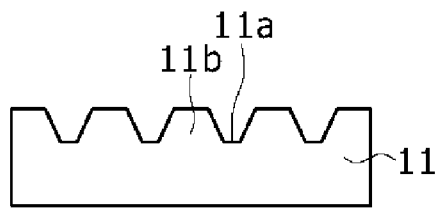
FIGS. 25A to 25G are, respectively, a sectional view illustrating a method for making a GaN light-emitting diode according to a sixth embodiment of the present invention.
Figure 25B:
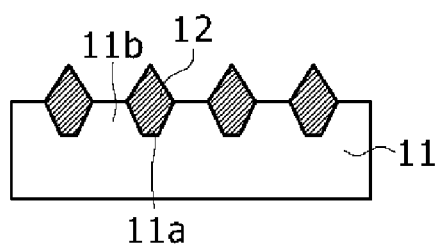
Figure 25C:
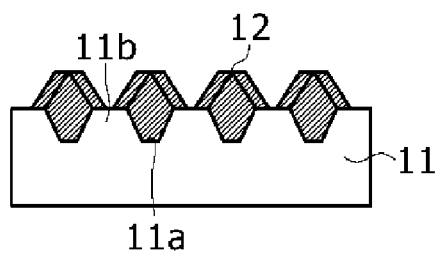
Figure 25D:
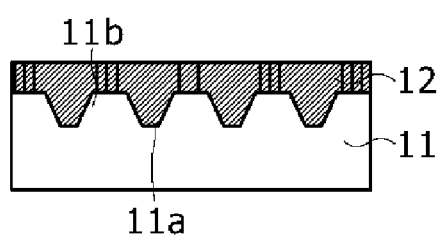
Figure 25E:
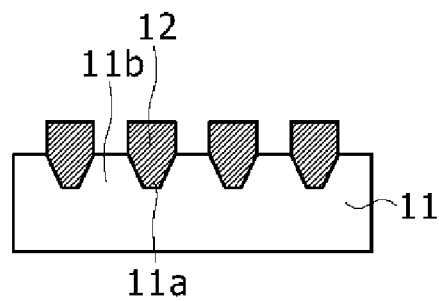

A shown in FIG. 25E, the GaN layer 12 is patterned by use of a RIE method or the like to selectively remove a portion thereof over the protruded portion 11b wherein threading dislocations are concentrates, thereby permitting the surface of the protruded portion 11b to be exposed thereat.

Figure 25F:
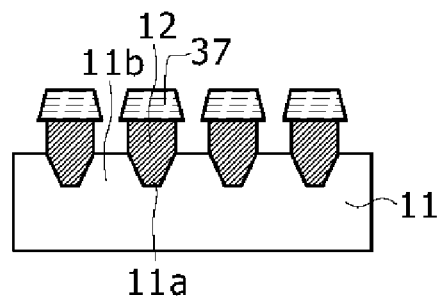
Figure 25G:
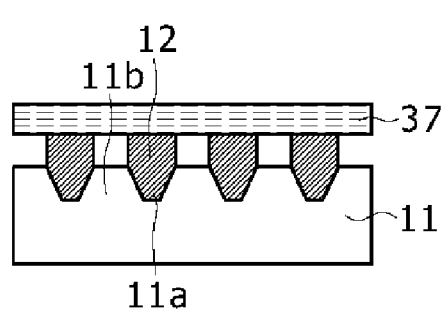

As shown in FIGS. 25F and 25G, a GaN layer 37 is laterally grown from the GaN layer 12 left on the recessed portion 11a.

Thereafter, the step of growing an n-type GaInN layer 13 and subsequent steps are advanced like the first embodiment to provide a GaN light-emitting diode.

According to this sixth embodiment, advantages as in the first embodiment can be obtained.

A seventh embodiment of the present invention is next described.

Figure 26A:
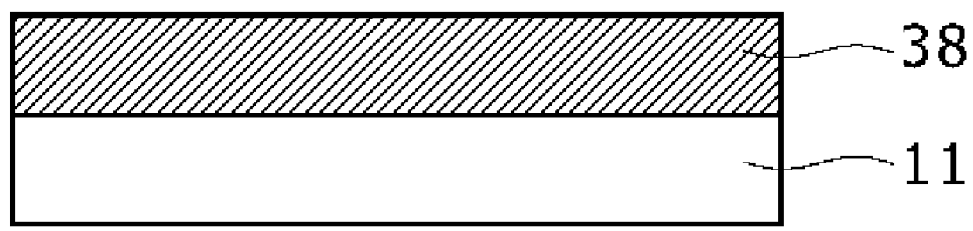
FIGS. 26A and 26B are, respectively, a sectional view illustrating a method for making a GaN light-emitting diode according to a seventh embodiment of the present invention.

In the seventh embodiment, as shown in FIG. 26A, a GaN layer 38 is grown on a flat sapphire substrate 11.

Figure 26B:
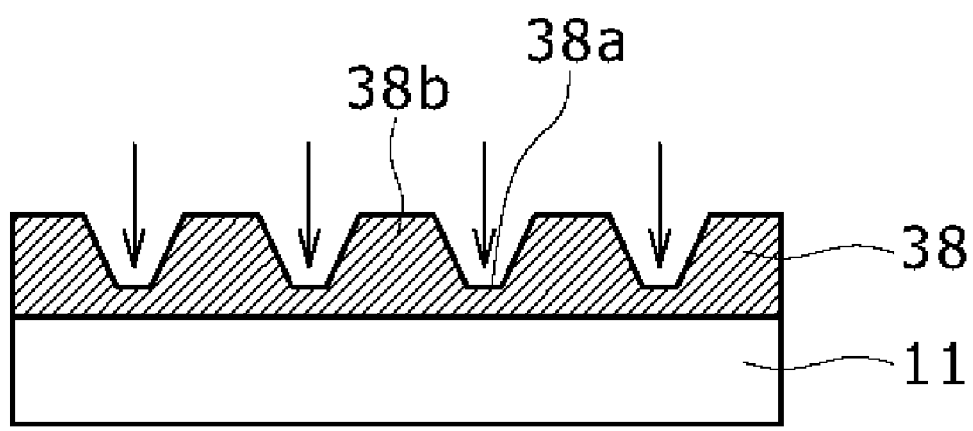

As shown in FIG. 26B, the GaN layer 38 is subjected patterned indentation to form recessed portions 38a and protruded portions 38b like the recessed portions 11a and protruded portions 11b of the sapphire substrate 11 of the first embodiment.

Next, a GaN layer 12 is grown over the GaN layer 38 subjected to patterned indentation like the first embodiment.

Thereafter, the step of growing an n-type GaInN layer 13 and subsequent steps are advanced in the same manner as in the first embodiment to provide a GaN light-emitting diode.

According to the seventh embodiment, advantages as in the first embodiment can be obtained.

Next, an eighth embodiment of the present invention is described.

In the eighth embodiment, the first embodiment is repeated until the p-side electrode 21 is formed, with subsequent steps being different therefrom. For the formation of the p-side electrode 21, there is preferably used a technique wherein in order to prevent diffusion of an electrode material (e.g. Ag or the like), a layer containing Pd is interposed. Alternatively, in order to prevent occurrence of a failure such as by diffusion, in the p-side electrode 21, of Au or Sn from an Au or Sn-containing layer (solder layer, bump or the like) formed on the above-mentioned layer owing to stress or by application of heat, a barrier metal layer that is grain boundary-free and amorphous in nature may be used by forming, on the electrode, a layer of a high melting metal such as, for example, Ti, W or an alloy thereof, or a nitride of each of these metals (e.g. TiN, WN, TiWN or the like). The technique of interposing a Pd-containing layer is well known, for example, as an interposing layer of Pd in the field of metal plating, and the barrier metal materials are well known in Al wiring techniques of Si-based electronic devices.

More particularly, as shown in FIG. 27A, after formation of a p-side electrode 21, a Ni film 41 is, for example, formed to cover the p-side electrode 21 such as by a lift method. Next, although not shown in the figures, a Pd film is, for example, formed so as to cover the Ni film 41, followed by forming a film of a metal nitride such as, for example, TiN, WN, TiWN or the like, to cover the Pd film and further forming a film of Ti, W, Mo or an alloy thereof, if necessary, to cover the nitride film. Instead of the formation of the Ni film 41, a Pd film may be formed to cover the p-side electrode 21, followed by forming a film of TiN, WN, TiWN or the like to cover the Pd film and further forming a film of Ti, W, Mo or an alloy thereof, if necessary, to cover the film therewith.

Next, as shown in FIG. 27B, a resist pattern 42 of a given pattern is formed to cover the Ni film 41 and the upper layers including the Pd film by lithography.

Thereafter, as shown in FIG. 27C, etching is carried out, for example, by a RIE method using the resist pattern 42 as a mask to form a mesa portion 22 in the form of a trapezoid in section. The angle made between the inclined surface of the mesa portion 22 and the main surface of the sapphire substrate 11 is set, for example, at about 35 degrees. A λ/4 dielectric film wherein λ is an emission wavelength is formed on the inclined surface of the mesa portion 22, if necessary.

Next, as shown in FIG. 27D, an n-side electrode 23 is formed on the n-type GaInN layer 13.

Subsequently, as shown in FIG. 27E, a SiO$_2$ film 43 is formed over the entire surface of the substrate as a passivation film. Where adhesion to an underlying layer, durability and a corrosion resistance in process are taken into account, a SiN film or SiON film may be used in place of the SiO$_2$ film 43.

As shown in FIG. 27F, the SiO$_2$ film 43 is etched back for reduction in thickness, after which an Al film 44 is formed, as a reflective film, on the SiO$_2$ film 43 at the inclined portion of the mesa portion 22. This Al film 44 serves to reflect light generated from the active layer 16 toward the side of the sapphire substrate 11 thereby improving a light extraction efficiency. The Al film 44 is so formed as to contact with the n-side electrode 23 at one end thereof. This is because no space is made between the Al film 44 and the n-side electrode 23 so as to increase a reflection of light. Thereafter, a SiO$_2$ film 43 is again formed to a thickness sufficient for a passivation film.

As shown in FIG. 27G, the portions of the SiO$_2$ film 43 above the Ni film 41 and the n-side electrode 23 are removed by etching to form openings 45, 46, thereby causing the Ni film 41 and the n-side electrode 23 to be exposed at these portions.

Next, as shown in FIG. 27H a pad electrode 47 is formed on the Ni film 41 at the opening 45, and a pad electrode 48 is formed on the n-side electrode 23 at the opening 46.

As shown in FIG. 27I, a bump mask material 49 is formed over the entire surface of the substrate, after which the bump mask material 49 is removed by etching a portion thereof above the pad electrode 48 to form an opening 50, at which the pad electrode 48 is exposed.

Next, as shown in FIG. 27J, an Au bump 51 is formed on the pad electrode 48 by use of the bump mask material 49, after which the bump mask material 49 is removed. Subsequently, a bump mask material (not shown) is again formed over the entire surface of the substrate, a portion of the bump mask material above the pad electrode 47 is removed by etching to form an opening, at which the pad electrode 47 is exposed. An Au bump 52 is formed on the pad electrode 47.

If necessary, the sapphire substrate 11 on which a light-emitting diode structure has been formed in a manner as set out above is cut or lapped from the back side thereof to reduce the thickness of the substrate, followed by scribing the sapphire substrate 11 and forming a bar. Thereafter, the bar is scribed for chipping.

It will be noted that the electrode stacked structure illustrated in FIGS. 27A to 27J is merely an instance. Especially, where the respective electrode layers are plurally stacked, it is necessary how to attain high reflectivity by improving adhesion between the p-side electrode 21 made of Ag electrodes or the like and other metallic layers, stress durability and anti-cracking property and to make a low contact resistance and keep the quality of the Ag electrode and the like while taking into account suppression of occurrence of a stress ascribed to a difference in coefficient of thermal expansion among the respective metal layers accompanied by a rise in device temperature and also suppression of diffusion between adjacent metal layers. Thus, it is possible to make use of Al wiring techniques of Si-based electronic devices as stated above, if necessary.

A ninth embodiment of the present invention is described.

In the ninth embodiment, the manufacture of light-emitting diode backlight is illustrated wherein there is used, in addition to the GaN blue light-emitting diode obtained by the method of the first embodiment and the GaN green light-emitting diode, an AlGaInP red light-emitting diode separately provided for this purpose.

A GaN blue light emitting diode structure is formed on a sapphire substrate 11 according to the method of the first embodiment and bumps (not shown) are, respectively, formed on the p-side electrode 21 and the n-side electrode 23, followed by chipping to obtain a GaN blue light-emitting diode in the form of a flip chip. Likewise, a GaN green light-emitting diode is obtained in the form of a flip chip. On the other hand, for an AlGaInP red light-emitting diode, an ordinary one is used in the form of a chip, which is obtained by forming an AlGaInP semiconductor layer on an n-type GaAs substrate to provide a diode structure, on which a p-side electrode is formed and an n-side electrode is formed on a back side of the n-type GaAs substrate.

Figure 28A:
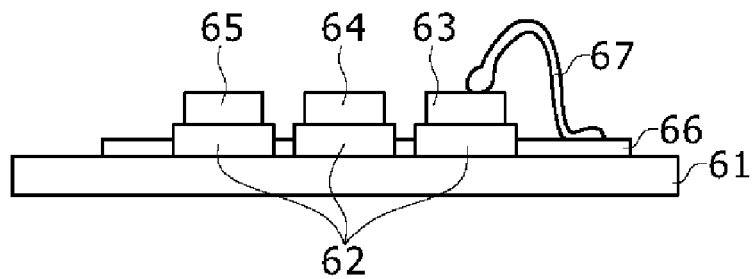
FIGS. 28A to 28C are, respectively, a sectional view illustrating a method for making a GaN light-emitting diode backlight according to a ninth embodiment of the present invention.

These AlGaInP red light-emitting diode chip, GaN green light-emitting diode chip and GaN blue light-emitting diode chip are, respectively, mounted on a submount made of AlN or the like, followed by mounting in position on a substrate such as an Al substrate in such a way that the submount is turned downward. This state is shown in FIG. 28A. In FIG. 28A, reference numeral 61 indicates a substrate. Likewise, indicated by 62 is a submount, by 63 is an AlGaInP red light-emitting diode chip, by 64 is a GaN green light-emitting diode chip and by 65 is a GaN blue light-emitting diode chip. These AlGaInP red light-emitting diode chip 63, GaN green light-emitting diode chip 64 and GaN blue light-emitting diode chip 65, respectively, have a chip size, for example, of 350 μm square. The AlGaInP red light-emitting diode chip 63 is so mounted that an n-side electrode thereof is on the submount 62, and the GaN green light-emitting diode chip 64 and the GaN blue light-emitting diode chip 65 are, respectively, mounted in such a way that the p-side electrode and n-side electrode are laid on the submount 62 via bumps. The submount 62, on which the AlGaInP red light-emitting diode chip 63 is mounted, has an extraction electrode (not shown) for the n-side electrode thereon in a given pattern. The n-side electrode of the AlGaInP red light-emitting diode chip 63 is mounted on a given portion of the extraction electrode. The p-side electrode of the AlGaInP red light-emitting diode chip 63 and a given pad electrode 66 provided on the substrate 21 are, respectively, bonded with a wire 67 for connection thereof. Likewise, a wire (not shown) is, respectively, bonded to the extraction electrode at one end thereof and another pad electrode provided on the substrate 61, ensuring electric connection thereof. The submount 62 mounting the GaN green light-emitting diode chip 64 thereon has an extraction electrode for p-side electrode and an extraction electrode for n-side electrode (both not shown) formed in desired patterns, respectively. The p-side electrode and the n-side electrode of the GaN green light-emitting diode chip 64 are, respectively, mounted on given portions of the extraction electrode for p-side electrode and the extraction electrode for n-side electrode via bumps formed thereon. One end of the extraction electrode for p-side electrode of the GaN light-emitting diode chip 64 and a pad electrode provided on the substrate 61 are, respectively, connected with a wire (not shown) bonded thereto, and one end of the extraction electrode for n-side electrode and a pad electrode provided on the substrate 61 are, respectively, connected with a wire (not shown) bonded thereto. This is same in the GaN blue light emitting diode chip 65.

It will be noted that the submount 62 may not be used, under which the AlGaInP red light-emitting diode chip 63, GaN green light-emitting diode chip 64 and GaN blue light-emitting diode chip 65 are, respectively, mounted directly on an arbitrary printed circuit board having a good radiation performance, thereby leading to low costs of the light-emitting diode backlight as a whole.

Figure 28B:
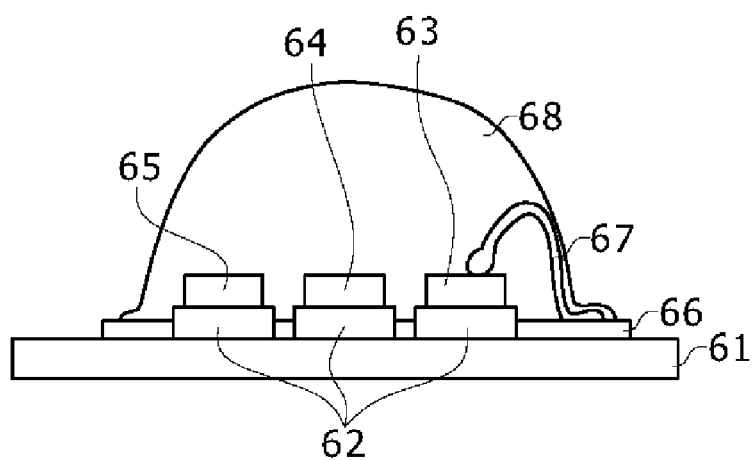
Figure 28C:
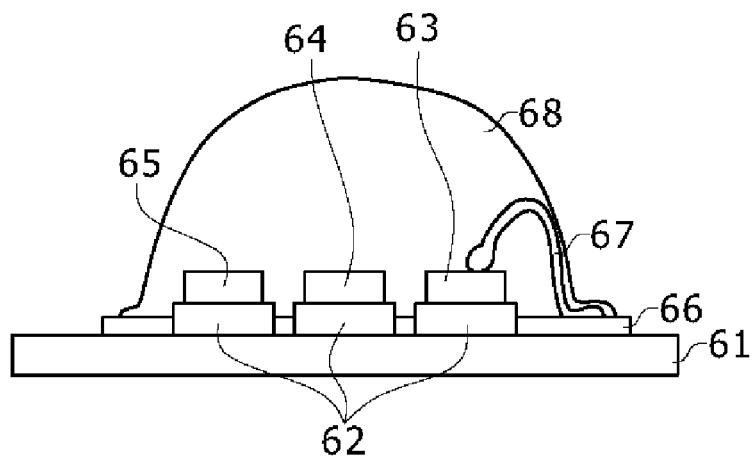
Figure 29A:
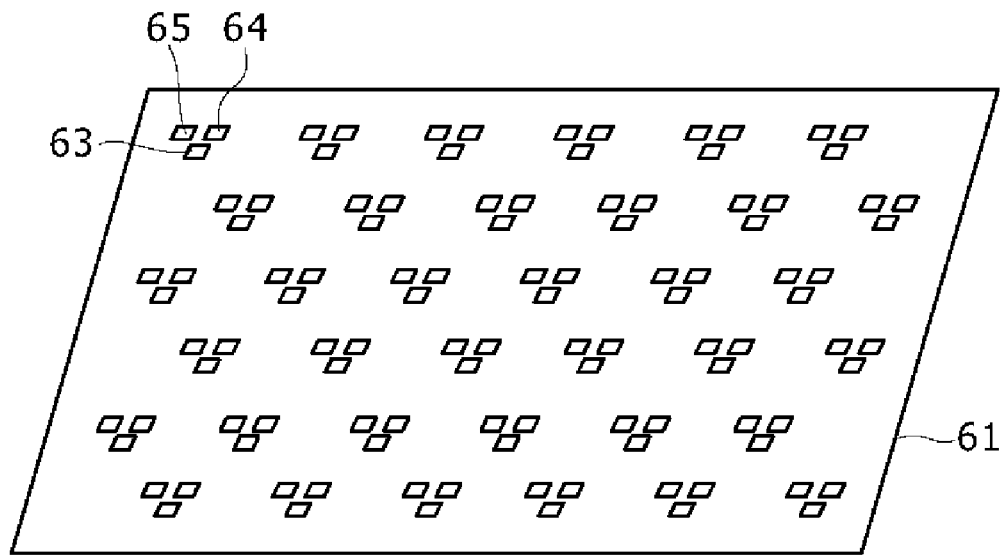
FIGS. 29A and 29B are, respectively, a perspective view illustrating the method according to the ninth embodiment of the present invention.
Figure 29B:
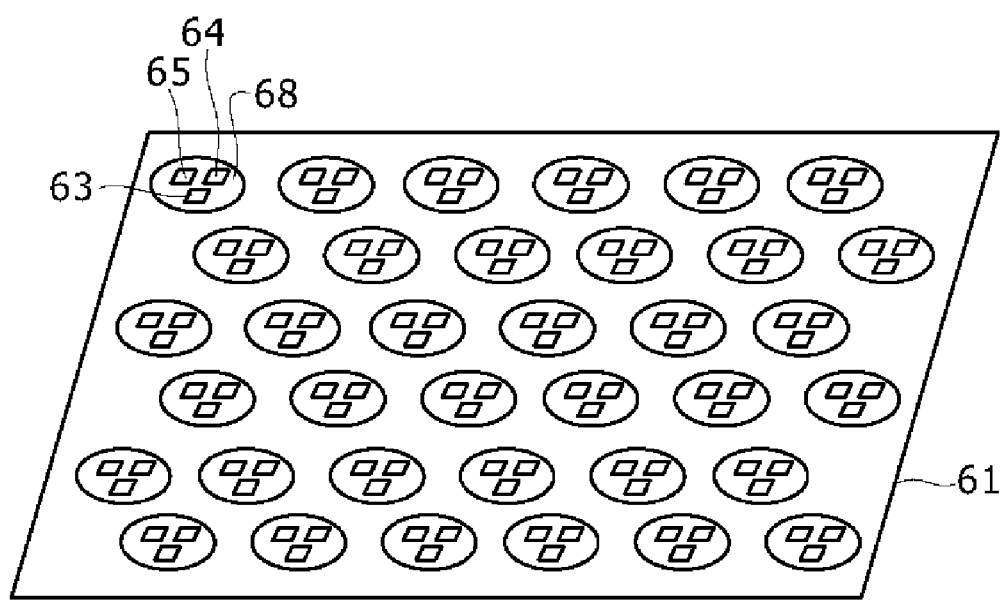

In practice, such AlGaInP red light-emitting diode chip 63, GaN green light-emitting diode chip 64 and GaN blue light-emitting diode chip 65 are provided as a unit cell, and a necessary number of the cells are arranged on the substrate 61 in a given pattern. One instance of this is shown in FIG. 29A. Next, as shown in FIG. 28B, the unit cell is potted with a transparent resin 68 to cover the cell therewith. The transparent resin 68 is subsequently cured. By the curing, the transparent resin 68 is solidified, with which the resin is slightly shrunk (FIG. 28C). In this way, there is obtained a light-emitting diode backlight wherein the AlGaInP red light-emitting diode chip 63, GaN green light-emitting diode chip 64 and GaN blue light-emitting diode chip 65 are provided as a unit cell as is particularly shown in FIG. 29B and such cells are arranged in an array on the substrate 61. In this case, the transparent resin 68 is in contact with the back side of the sapphire substrate 11 of the GaN green light-emitting diode chip 64 and GaN blue light-emitting diode chip 65, so that a difference in refractive index becomes smaller than that of the case where the back side of the sapphire substrate 11 is in direct contact with air. This eventually leads to the fact that light discharged to outside by transmission through the sapphire substrate 11 is more unlikely to be reflected at the back side of the sapphire substrate 11, thereby improving a light extraction efficiency.

This type of light-emitting diode backlight is suitable for use, for example, as a backlight for liquid crystal panel.

Next, a tenth embodiment of the present invention is described.

Figure 30:
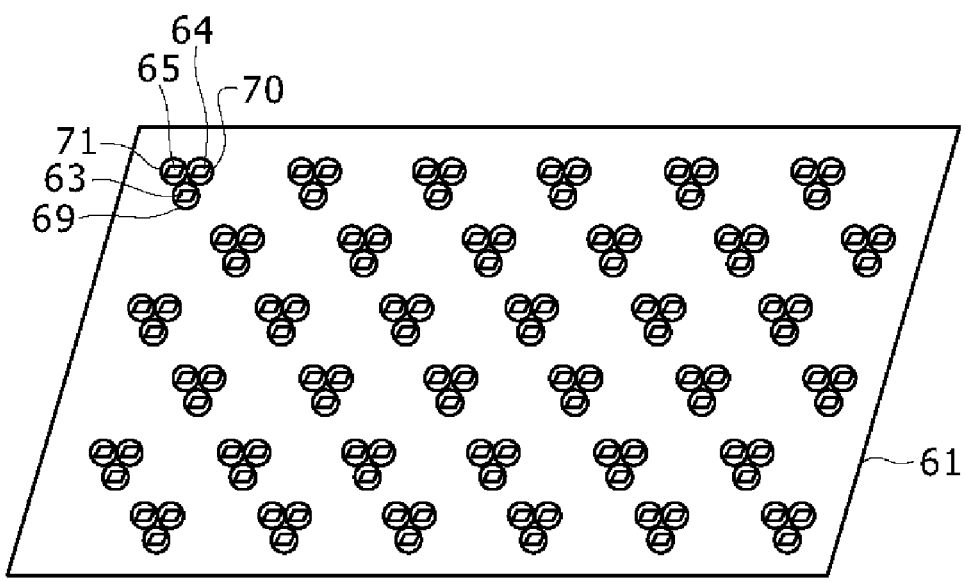
FIG. 30 is a perspective view illustrating a method for making a light-emitting diode backlight according to a tenth embodiment of the present invention.

In the tenth embodiment, a necessary number of unit cells included of the AlGaInP red light-emitting diode chip 63, GaN green light-emitting diode chip 64 and GaN blue light-emitting diode chip 65 are arranged on the substrate 61 in a given pattern like the ninth embodiment of the present invention. Thereafter, as shown in FIG. 30, a transparent resin 69 suited for the AlGaInP red light-emitting diode chip 63 (i.e. higher in transparency relative to light of an emission wavelength of the diode chip) is potted on the AlGaInP light-emitting diode chip 63 to cover the AlGaInP red light-emitting diode chip 63 therewith. Likewise, a transparent resin 70 suited for the GaN green light-emitting diode chip 64 is potted on the GaN light-emitting diode chip 64 to cover the GaN green light-emitting diode chip 64 therewith, and a transparent resin 71 suited for the GaN blue light-emitting diode chip 65 is potted on the GaN blue light-emitting diode chip 65 to cover the GaN blue light-emitting diode chip 65 therewith. Thereafter, the transparent resins 69 to 71 are cured, respectively. By the curing, the transparent resins 69 to 71 are solidified and slightly shrunk as a result of the solidification. In this way, three can be obtained a light emitting diode backlight wherein a number of cells, each made of the AlGaInP red light-emitting diode chip 63, GaN green light-emitting diode chip 64 and GaN blue light-emitting diode chip 65, are arranged in an array on the substrate 61. In this case, the transparent resins 70, 71 are in contact with the back side of the sapphire substrate 11 of the GaN green light-emitting diode chip 64 and GaN blue light-emitting diode chip 65, so that a difference in refractive index becomes smaller than that of the case where the back side of the sapphire substrate 11 is in direct contact with air. This eventually leads to the fact that light discharged to outside by transmission through the sapphire substrate 11 is more unlikely to be reflected at the back side of the sapphire substrate 11, thereby improving a light extraction efficiency.

This type of light-emitting diode backlight is suitable for use, for example, as a backlight for liquid crystal panel.

Next, an eleventh embodiment of the present invention is described.

Figure 31:
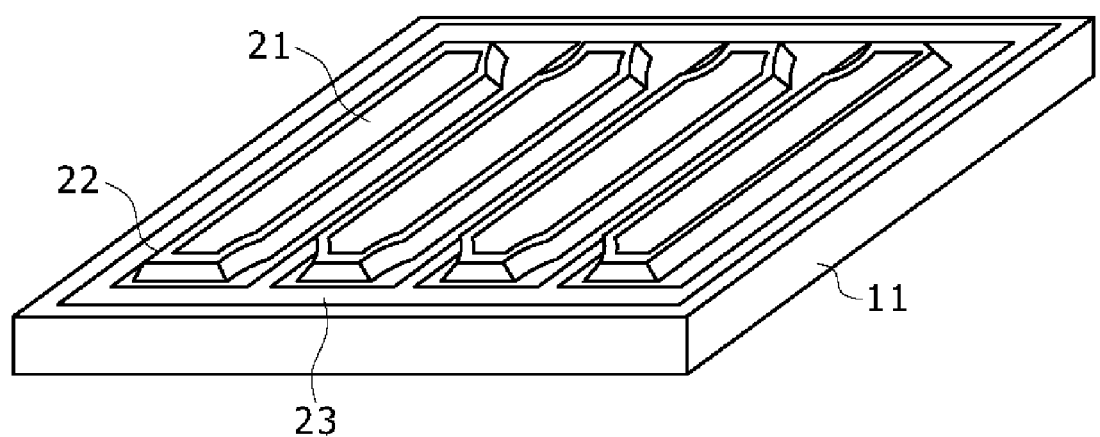
FIG. 31 is a perspective view illustrating an integrated light-emitting diode made according to an eleventh embodiment of the present invention.
Figure 32:
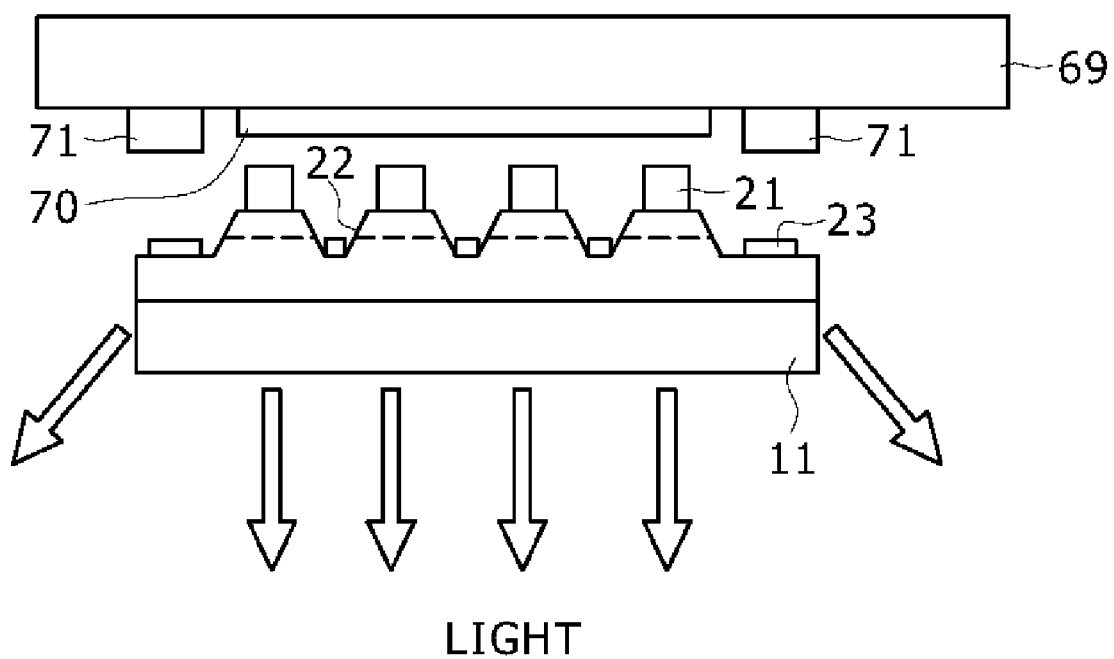
FIG. 32 is a sectional view showing the integrated light-emitting diode, made according to the eleventh embodiment of the present invention, mounted on a submount.

In the eleventh embodiment, a GaN light-emitting diode structure is formed on the sapphire substrate 11 according to the procedure of the first embodiment, and bumps (not shown) are formed on the p-side electrode 21 and the n-side electrode 23, respectively. Thereafter, the sapphire substrate 11 is scribed into a square piece of a given size. In this way, as shown in FIG. 31, an integrated GaN light-emitting diode having striped emission portions can be obtained. In this case, the n-side electrode 23 is formed to surround a striped mesa portion 22 therewith. As shown in FIG. 32, the integrated GaN light-emitting diode is mounted on a submount 69 made of AlN or the like. The submount 69 has an extraction electrode for p-side electrode and an extraction electrode for n-side electrode (both not shown) formed in give patterns, respectively, on which solder bumps 70, 71 are formed. The integrated GaN light-emitting diode is so mounted that the p-side electrode 21 is placed on the solder 70 and the n-side electrode 23 is on the solder 71, followed by melting the solders 70, 71 for bonding.

Next, a twelfth embodiment of the present invention is described.

In the twelfth embodiment, the manufacture of a light source cell unit is illustrated, in which there is used, aside from the GaN blue light-emitting diode and the GaN green light-emitting diode obtained in the procedure of the first embodiment, a AlGaInP red light-emitting diode made separately.

Figure 33A:
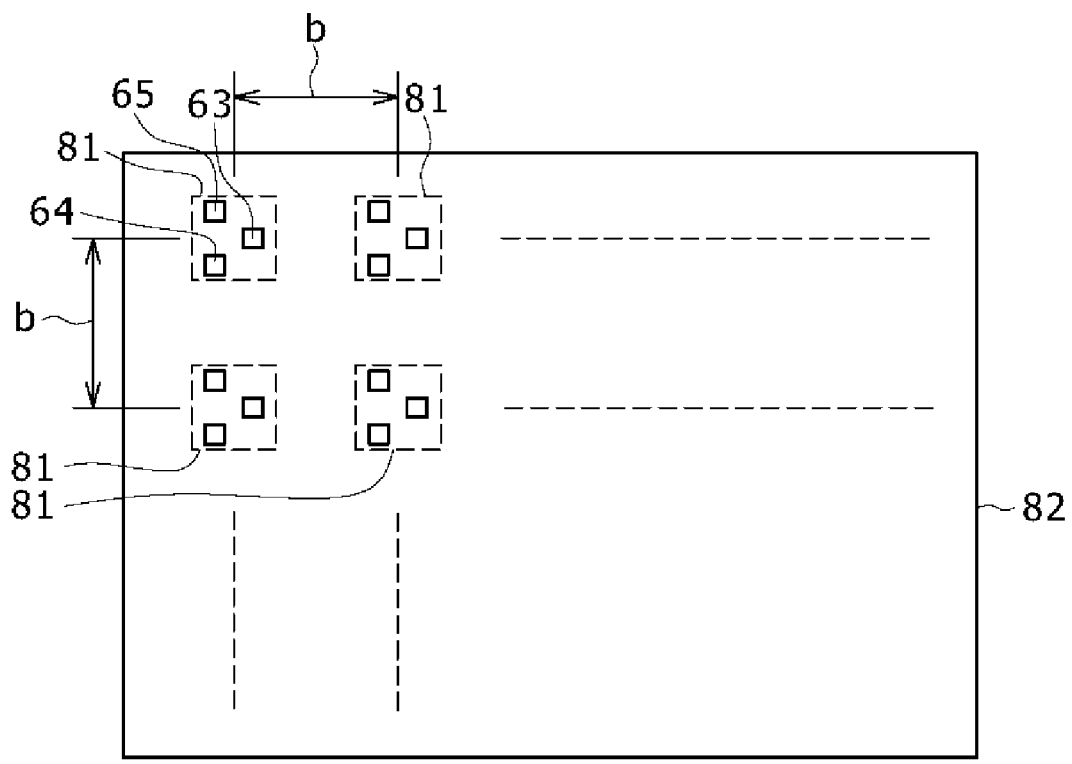
FIGS. 33A and 33B are, respectively, a plan view showing a light source cell unit according to a twelfth embodiment of the present invention and an enlarged view of a cell of the light source cell unit.
Figure 33B:
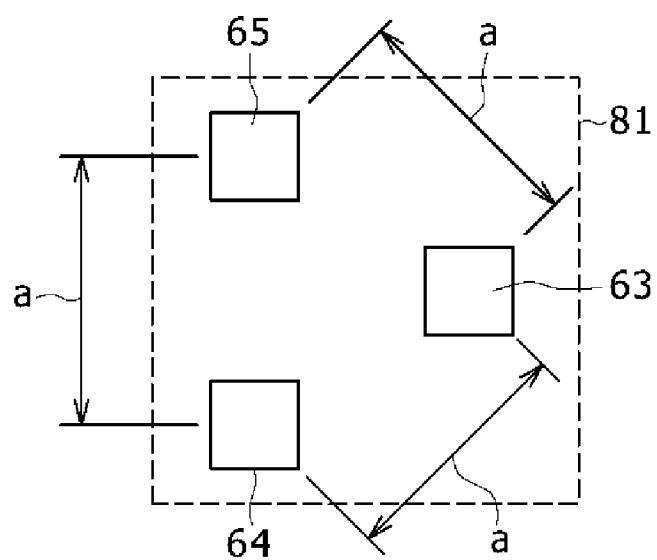

As shown in FIG. 33A, a necessary number of cells 81, each of which includes the AlGaInP red light-emitting diode chip 63, GaN green light-emitting diode chip 64 and GaN blue light-emitting diode chip 65, each diode being at least one in number, and these diodes are arranged in a given pattern, are arranged on a printed circuit board 82 in a given pattern. In this instance, individual cells 81 contain one AlGaInP red light-emitting diode chip 63, one GaN green light-emitting diode chip 64 and one GaN blue light-emitting diode chip 65, which are located at apexes of a triangle. FIG. 33B shows an enlarged cell 81. The distance a between the AlGaInP red light-emitting diode chip 63, GaN green light-emitting diode chip 64 and GaN blue light-emitting diode chip 65 in the respective cells 81 is, for example, at 4 mm although not limited thereto. The distance b if cells 81 is, for example, at 30 mm although not limited. For the printed circuit board 82, a FR4 (flame retardant type 4) substrate, a metal core substrate or the like can be used although not limited thereto, and other types of substrates may also be used provided that they are printed board substrates having a radiation performance. Like the ninth embodiment, a transparent resin 68 is potted to cover the individual cells 81 therewith. Alternatively, like the tenth embodiment, a transparent resin 69 is potted to cover the AlGaInP red light-emitting diode chip 63, a transparent resin 70 is potted to cover the GaN green light-emitting diode chip 64, and a transparent resin 71 is potted to cover the GaN blue light-emitting diode chip 65. In this manner, there can be obtained light source cell unit wherein the cells 81 each made of the AlGaInP red light-emitting diode chip 63, the GaN green light-emitting diode chip 64 and the GaN blue light-emitting diode chip 65 are arranged over the printed circuit board 82.

Figure 34A:
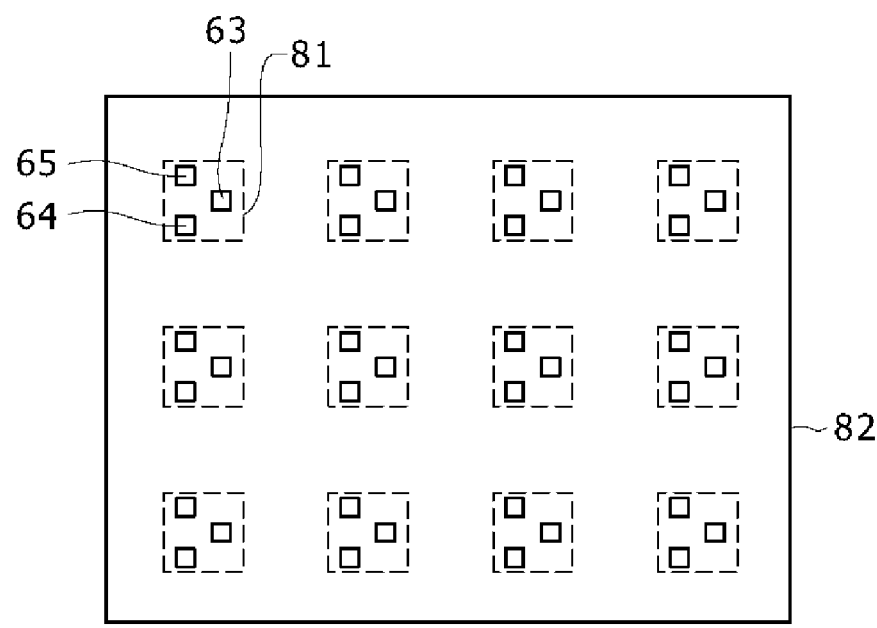
FIGS. 34A and 34B are, respectively, a plan view showing a specific example of the light source cell unit according to the twelfth embodiment of the present invention.
Figure 34B:
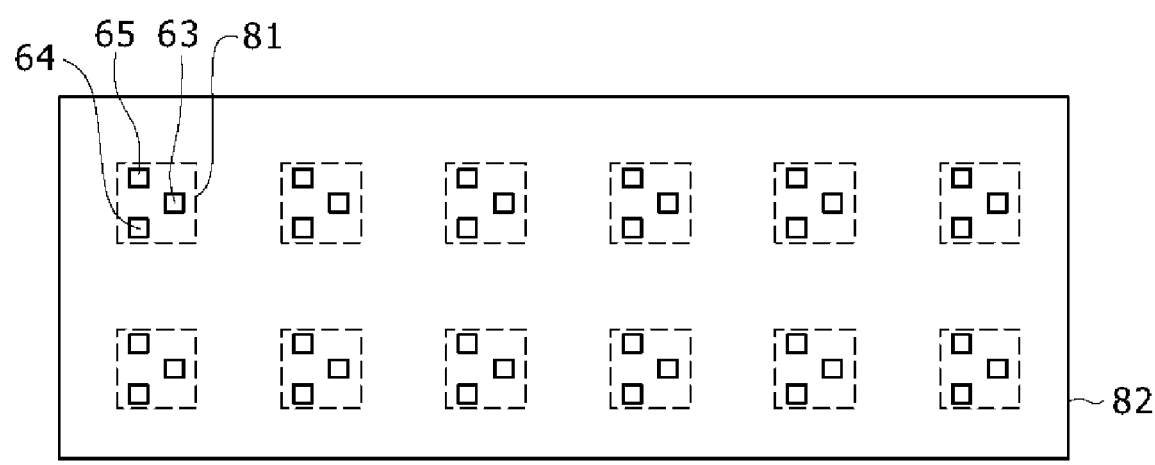

Specific examples of the arrangement of the cells 81 on the printed circuit board 82 are shown in FIGS. 34A and 34B. The instance shown in FIG. 34A is a 4×3 two-dimensional array of the cells 81 and the instance shown in FIG. 34B is a 6×2 two-dimensional array of the cells 81.

Figure 35:
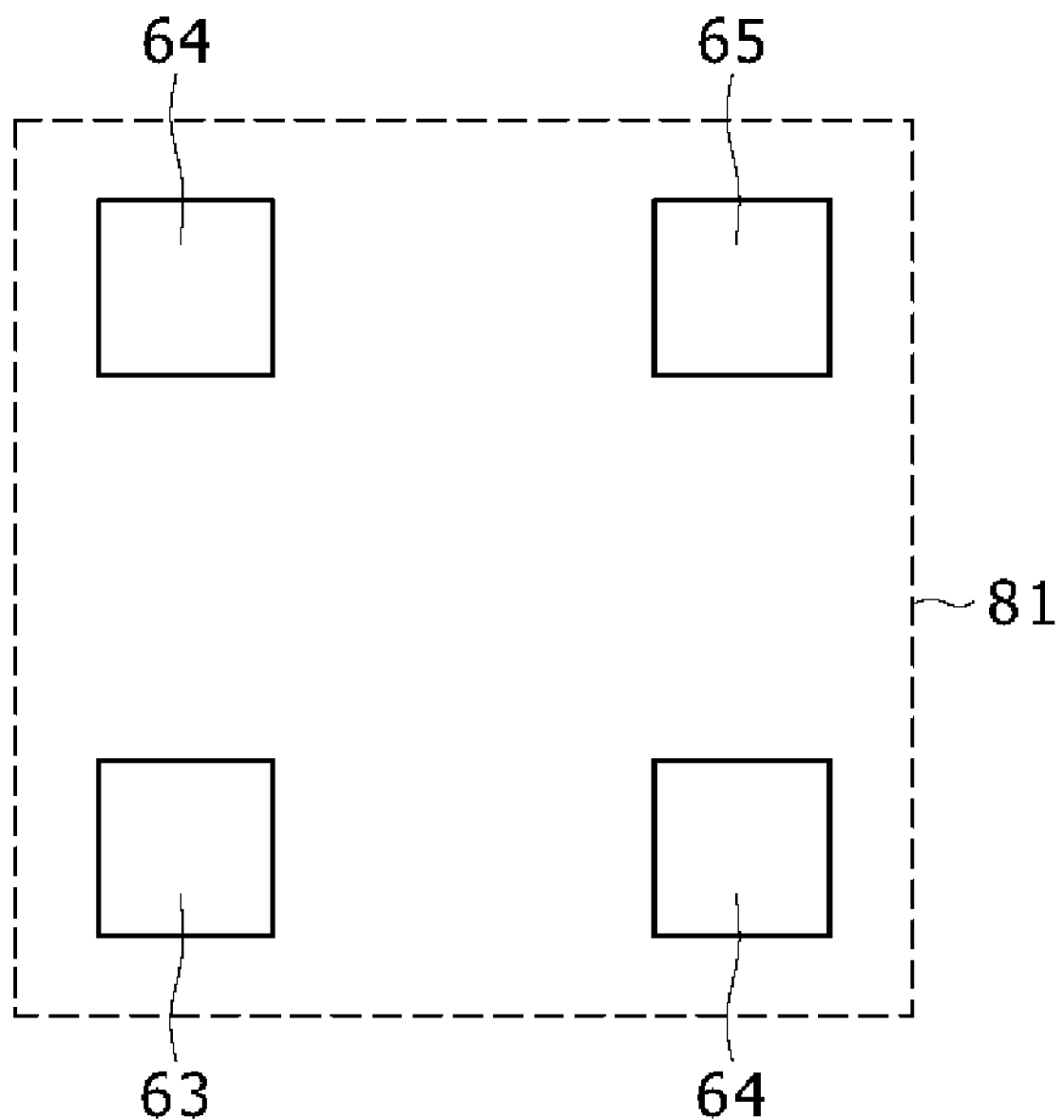
FIG. 35 is a plan view showing an example showing another cell arrangement of the light source cell unit according to the twelfth embodiment of the present invention.
Figure 36A:
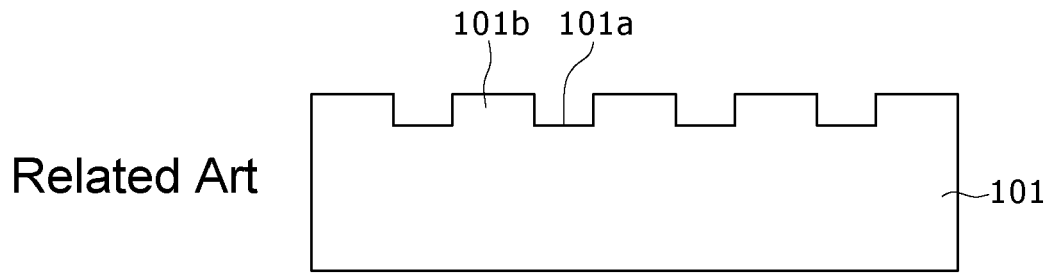
FIGS. 36A to 36C are, respectively, a sectional view illustrating a related method of growing a GaN semiconductor layer on an indented substrate.
Figure 36B:
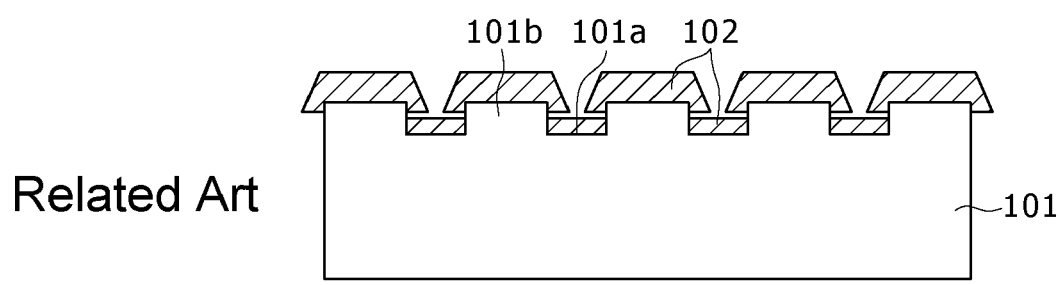
Figure 36C:
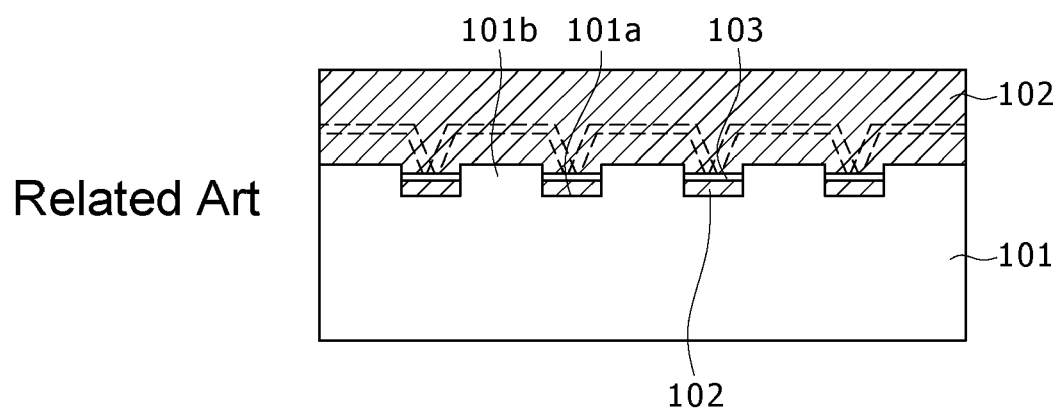
Figure 37:
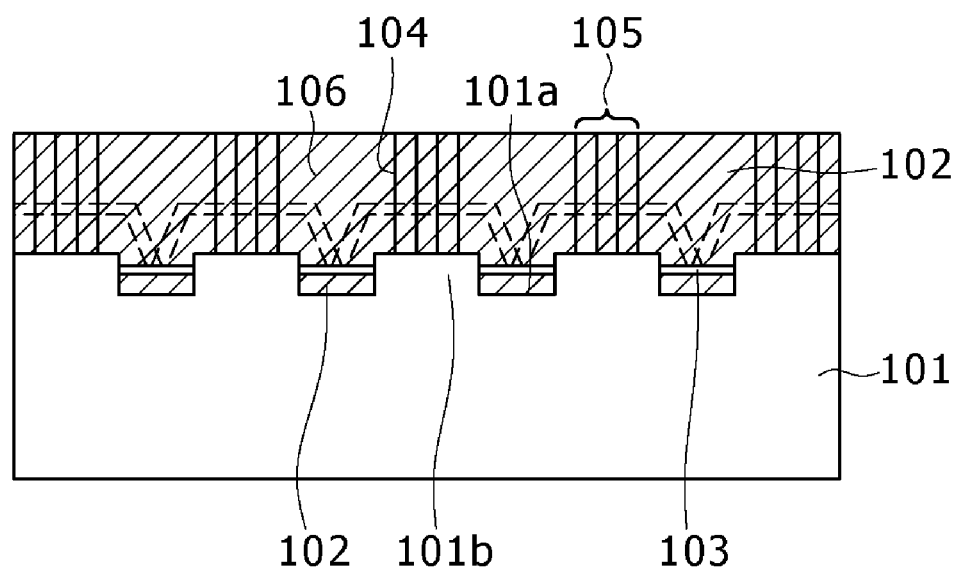
FIG. 37 is a sectional view illustrating a problem of the related method shown in FIG. 36.
Figure 38A:
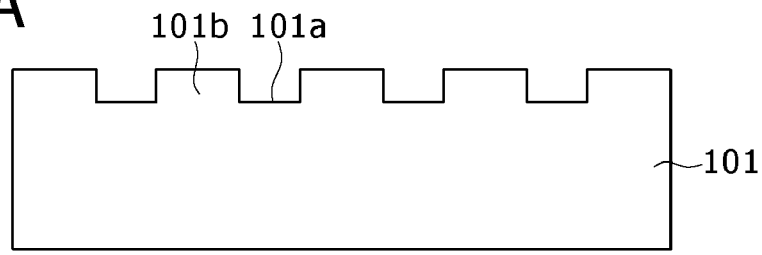
FIGS. 38A to 38D are, respectively, a sectional view illustrating a related method of growing a GaN semiconductor layer on an indented substrate.
Figure 38B:
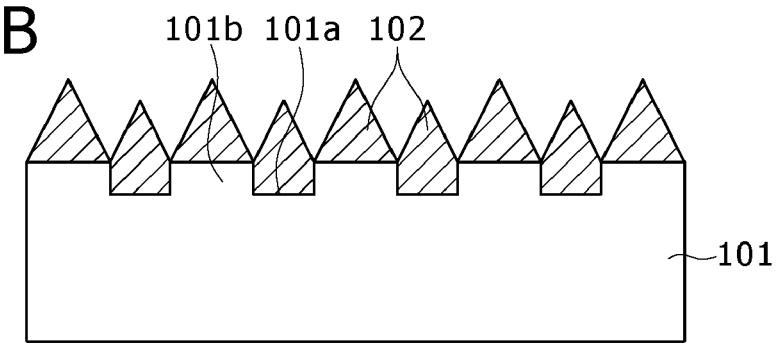
Figure 38C:
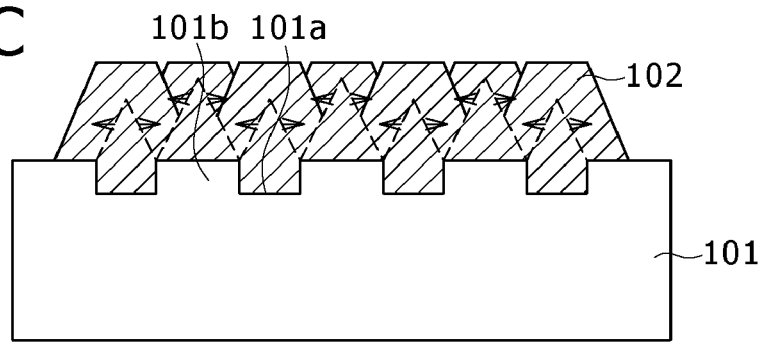
Figure 38D:
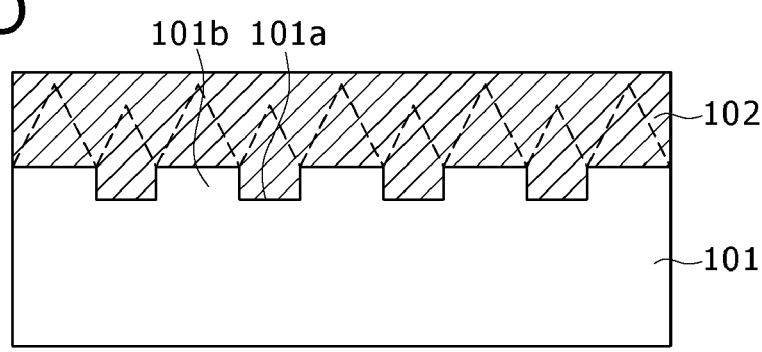
Figure 39A:
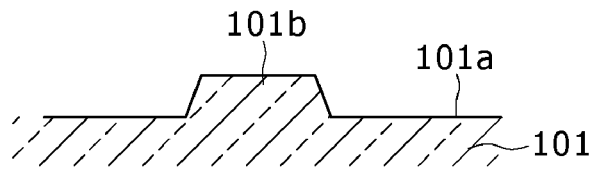
FIGS. 39A to 39F are, respectively, a sectional view illustrating another related method of growing a GaN semiconductor substrate on an indented substrate.
Figure 39B:
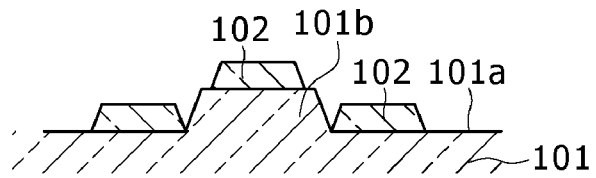
Figure 39C:
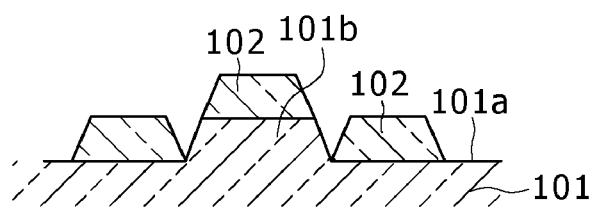
Figure 39D:
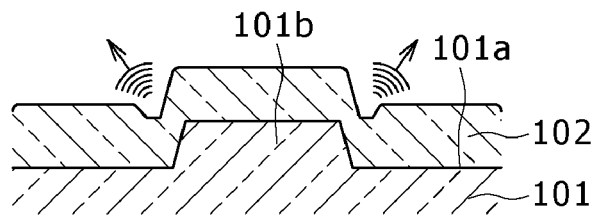
Figure 39E:
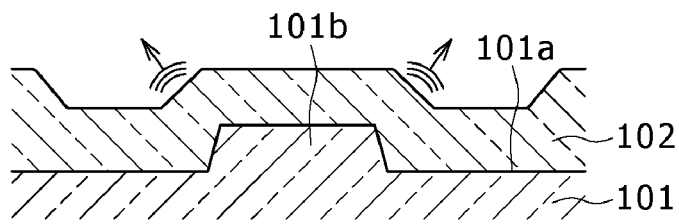
Figure 39F:
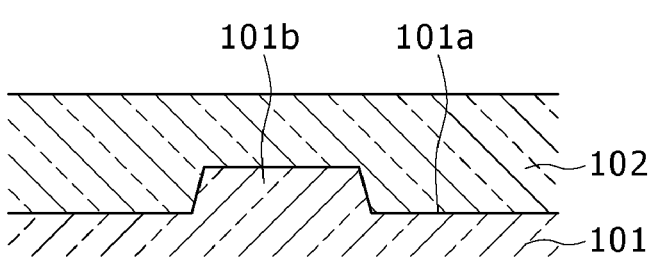

FIG. 35 shows an instance of other type of array of the cells 81. In this instance, the cell 81 includes one AlGaInP red light-emitting diode chip 63, two GaN green light-emitting diode chips 64 and one GaN blue light-emitting diode chip 65, which are arrayed, for example, at apexes of a square. The two GaN green light-emitting diode chips 64 are arrayed at apexes located at opposite ends of one of diagonal lines of the square, and the AlGaInP red light-emitting diode chip 63 and the GaN blue light-emitting diode chip 65 are arrayed at apexes located at opposite ends of the other diagonal line.

When this type of light source unit is arranged singly or plurally, a light-emitting diode backlight can be suitably used, for example, as a backlight for liquid crystal panel.

The embodiments of the present invention have been specifically illustrated hereinabove, and the present invention should not be construed as limiting to these embodiments. Many variations based on the technical concept of the present invention may be possible.

For instance, the values, materials, structures, shapes, substrates, starting materials, processes, and the extension direction of recessed portion 11a illustrated in the first to twelfth embodiments of the present invention are merely examples. If necessary, values, materials, structures, shapes, substrates, starting materials, processes and the like that are different from those illustrated before may be used.

Further, in the first to twelfth embodiments of the present invention, for example, the conduction types of the p-type GaN semiconductor layer and the n-type GaN semiconductor layer may be reversed each other. In addition, a SiC substrate, a Si substrate and other types of substrates may be used in placed of the sapphire substrate 11, for example.

The extension direction of the recessed portion 11a may not be a <1-100> direction of the GaN layer 12, but also a <11-20> direction of the GaN layer 12.

If necessary, two or more of the first to twelfth embodiments may be combined.

It should be understood by those skilled in the art that various modifications, combinations, sub-combinations and alterations may occur depending on design requirements and other factors insofar as they are within the scope of the appended claims or the equivalents thereof.

What is claimed is:

1. A method for making a light-emitting diode, comprising the steps of:
    providing a substrate having a plurality of recessed portions on one main surface, each of the recessed portions having a floor and sidewalls;
    growing a first nitride-based III-V group compound semiconductor layer (1) initially only from the floors of the recessed portions without using a mask so that the first nitride-based III-V group compound semiconductor initially exhibits a triangle in section in each recessed portion and having the floors of the recessed portions as bases, (2) thereafter continuing to grow the first nitride-based III-V group compound semiconductor until it r buries the recessed portion, (3) thereafter continuing to grow the first nitride-based III-V group compound semiconductor under such conditions that lateral growth is predominant until the first nitride-based III-V group semiconductor from adjacent recessed portions mutually contact each other, and (4) continuing to grow the first nitride-based III-V group compound semiconductor at least until it forms a first nitride-based III-V group layer with a planar surface;
    growing a second nitride-based III-V group compound semiconductor layer on the first nitride-based III-V group compound semiconductor layer; and
    successively growing a third nitride-based III-V group compound semiconductor layer of a first conduction type, an active layer and a fourth nitride-based III-V group compound semiconductor layer of a second conduction type on the second nitride-based III-V group compound semiconductor layer.

2. The method according to claim 1, wherein in the course of the growth of the first nitride-based III-V group compound semiconductor layer, a dislocation occurs at an interface with the floor of each recessed portion and extends in a vertical direction relative to the main surface and bends in a direction parallel to the main surface at, or in the vicinity of, an inclined face of the triangle formed by the first nitride-based III-V group compound semiconductor layer.

3. The method according to claim 1, wherein when the first nitride-based III-V group compound semiconductor layer and the second nitride-based III-V group compound semiconductor layer are, respectively, grown, a first pit having a first width is formed in the substrate at the floor of each recessed portion and a second pit having a second width larger than the first width is formed in the substrate at opposite sides of each recessed portion.

4. The method according to claim 1, wherein each recessed portion has an inverted trapezoid shape in section.

5. The method according to claim 4, wherein when a depth of each recessed portion is taken as d, a width of the floor of each recessed portion is taken as $W_g$, and an angle established between an inclined face of the first nitride-based III-V group compound semiconductor layer in a state of a triangle in section and the one main surface of the substrate is taken as α, d, $W_g$ and α are so determined as to establish the relation of $2d \geq W_g \tan \alpha$.

6. The method according to claim 1, wherein the plural recessed portions extend in first and second directions which mutually intersect each other.

7. The method according to claim 1, wherein,
    the substrate and the first nitride-based III-V group compound semiconductor layer grown on the substrate are made of different materials, and
    the recessed portions are formed in the first nitride-based III-V group semiconductor layer.

8. The method according to claim 1, wherein the substrate has an amorphous layer at opposite sides of each of the recessed portions.

9. The method according to claim 8, comprising the further step of subjecting a surface layer of the substrate to ion implantation and amorphousizing the surface layer to form the amorphous layer.

10. The method according to claim 8, wherein the amorphous layer is made of an insulating film formed on the substrate.

11. The method according to claim 1, wherein a first amorphous layer, a second amorphous layer and a third amorphous layer are successively formed on the substrate at opposite sides of each of the recessed portions, and the second amorphous layer enables the first amorphous layer and the third amorphous layer to be selectively etched.

12. The method according to claim 1, wherein after the lateral growth of the second nitride-based III-V group compound semiconductor layer, portions of the second nitride-based III-V group compound semiconductor layer other than those above the recessed portions are removed, the third nitride-based III-V group compound semiconductor layer is laterally grown on the second nitride-based III-V group compound semiconductor layer left over the recessed portions, and the active layer and the fourth nitride-based III-V group compound semiconductor layer are successively grown on the third nitride-based III-V group compound semiconductor layer.

13. The method according to claim 1, wherein after the lateral growth of the second nitride-based III-V group compound semiconductor layer, portions of the second nitride-based III-V group compound semiconductor layer other than those above the recessed portions are removed, a fifth nitride-based III-V group compound semiconductor layer is laterally grown on the second nitride-based III-V group compound semiconductor layer left over the recessed portions, and the third nitride-based III-V group compound semiconductor layer, the active layer and the fourth nitride-based III-V group compound semiconductor layer are successively grown on the fifth nitride-based III-V group compound semiconductor layer.

* * * * *